(12) United States Patent
Reinhold et al.

(10) Patent No.: US 10,505,543 B2
(45) Date of Patent: Dec. 10, 2019

(54) CIRCUIT ARCHITECTURE FOR A MEASURING ARRANGEMENT, A LEVEL SHIFTER CIRCUIT, A CHARGE PUMP STAGE AND A CHARGE PUMP, AND METHOD FOR OPERATING SAME

(71) Applicant: Infineon Technologies AG, Neubiberg (DE)

(72) Inventors: Michael Reinhold, Erlangen (DE); Ulrich Reichold, Lauf (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 152 days.

(21) Appl. No.: 15/598,330

(22) Filed: May 18, 2017

(65) Prior Publication Data

US 2017/0338823 A1 Nov. 23, 2017

(30) Foreign Application Priority Data

May 18, 2016 (DE) .................. 10 2016 109 114

(51) Int. Cl.
*H03K 19/0185* (2006.01)
*G01R 19/165* (2006.01)
*H02M 3/07* (2006.01)

(52) U.S. Cl.
CPC ......... *H03K 19/018521* (2013.01); *G01R 19/16585* (2013.01); *H02M 3/07* (2013.01)

(58) Field of Classification Search
CPC ..... H03K 19/018521; G01R 19/16585; H02M 3/07
USPC ....................................... 327/333
See application file for complete search history.

(56) References Cited

U.S. PATENT DOCUMENTS

| 7,595,648 B2 | 9/2009 | Ungaretti et al. | |
| 2002/0003451 A1* | 1/2002 | Theus | H02M 3/073 330/310 |
| 2005/0184713 A1 | 8/2005 | Xu et al. | |
| 2006/0028245 A1 | 2/2006 | Min et al. | |
| 2007/0236272 A1 | 10/2007 | Min et al. | |
| 2008/0122453 A1 | 5/2008 | Hunter | |
| 2008/0188059 A1 | 8/2008 | Yazdi | |
| 2008/0191800 A1 | 8/2008 | Fang et al. | |
| 2008/0224755 A1* | 9/2008 | Jo | G09G 3/20 327/333 |

(Continued)

FOREIGN PATENT DOCUMENTS

| DE | 102005038001 A1 | 7/2006 |
| EP | 1154564 A2 | 11/2001 |
| EP | 2647593 A2 | 10/2013 |

OTHER PUBLICATIONS

Selcuk Ersoy et al., A 0.25mm2 AC-Biased MEMS Microphone Interface with 58dBA SNR, 2013 IEEE International Solid-State Circuits Conference, Feb. 20, 2013 / Session 22 / Sensors & Displays / 22.2.

(Continued)

*Primary Examiner* — Tomi Skibinski
(74) *Attorney, Agent, or Firm* — Viering, Jentschura & Partner MBB

(57) ABSTRACT

In various embodiments, a level shifter circuit is provided. The level shifter circuit may include a signal source and a level shifter. The signal source, on the output side, is capacitively coupled to an input of the level shifter. The signal source and the level shifter are galvanically isolated from one another.

24 Claims, 39 Drawing Sheets

(56) References Cited

U.S. PATENT DOCUMENTS

| | | |
|---|---|---|
| 2009/0219036 A1 | 9/2009 | Seppa et al. |
| 2013/0027108 A1* | 1/2013 | Shimizu .................. 327/333 |
| 2013/0098145 A1 | 4/2013 | Oh et al. |
| 2014/0253227 A1* | 9/2014 | Yach ............... H04L 25/4902 |
| | | 327/540 |
| 2014/0267880 A1 | 9/2014 | Aranovsky |
| 2015/0181352 A1 | 6/2015 | Astgimath et al. |
| 2016/0277008 A1* | 9/2016 | Green ................. H02M 3/158 |

OTHER PUBLICATIONS

Ameng Cheng, Design of a Readout Scheme for a MEMS Microphone, Master Thesis, 2009, TU Delft, NXP.

Jelena Haas-Christensen, New Technology-Driven Approaches in the Design of Preamplifiers for Condenser Microphones, PhD Thesis, Apr. 2009, 1st edition, Technical University of Denmark.

Jiangfeng Wu et al, A low-noise low-offset capacitive sensing amplifier for a 50-μg/√Hz monolithic CMOS MEMS accelerometer, IEEE Journal of solid state circuits, vol. 39, No. 5, May 2004.

Hao-Yen Tang et al, Integrated Ultrasonic System for Measuring Body-fat Composition, 2015 IEEE International Solid-State Circuits Conference, Feb. 24, 2015, Session 11, Sensors and Imagers for Life Sciences, 11.8.

Devrim Aksin et al., Switch Bootstrapping for Precise Sampling beyond Supply Voltage, IEEE Journal of Solid-State circuits, vol. 41, No. 8, Aug. 2006.

US Office Action based on U.S. Appl. No. 15/597,218 dated Jun. 24, 2019; 23 pages (for reference purpose only).

Chinese Office Action based on Application No. 201710351953.6, dated May 10, 2019, 7 pages (for reference purpose only).

* cited by examiner

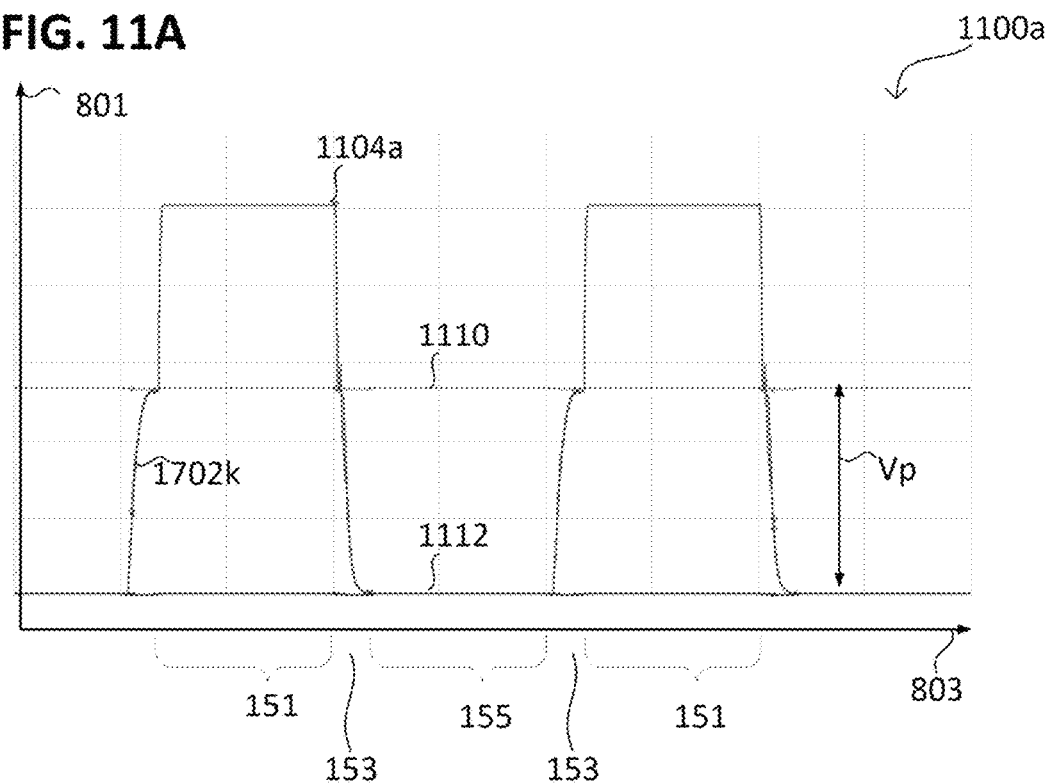
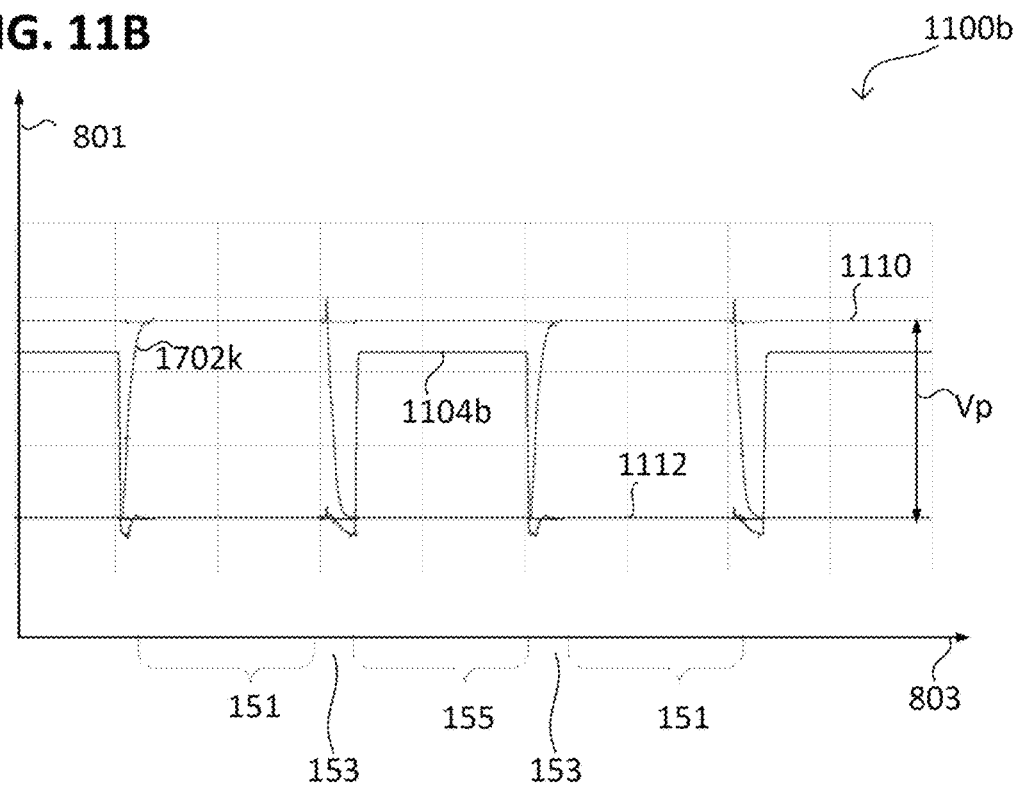

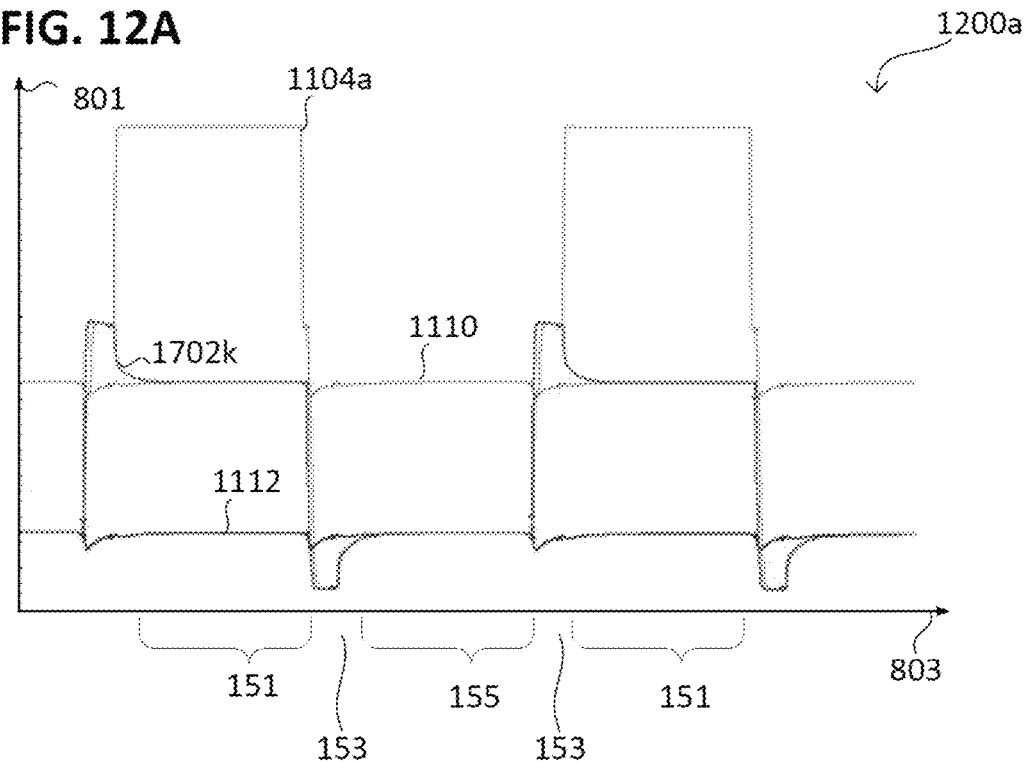
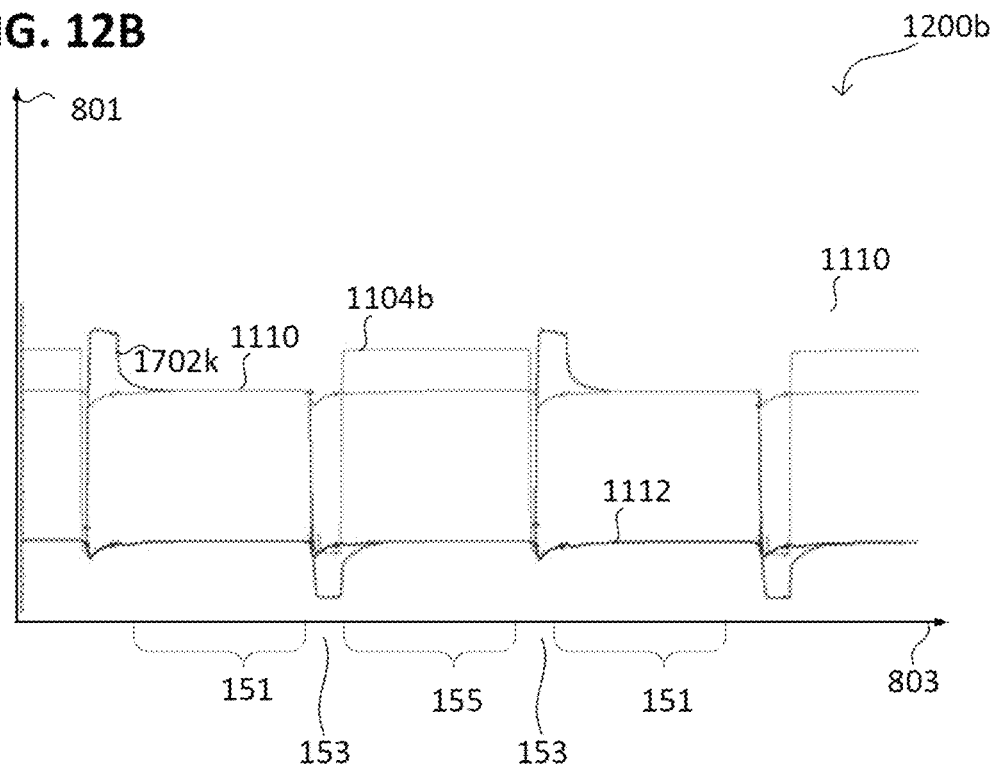

FIG. 24
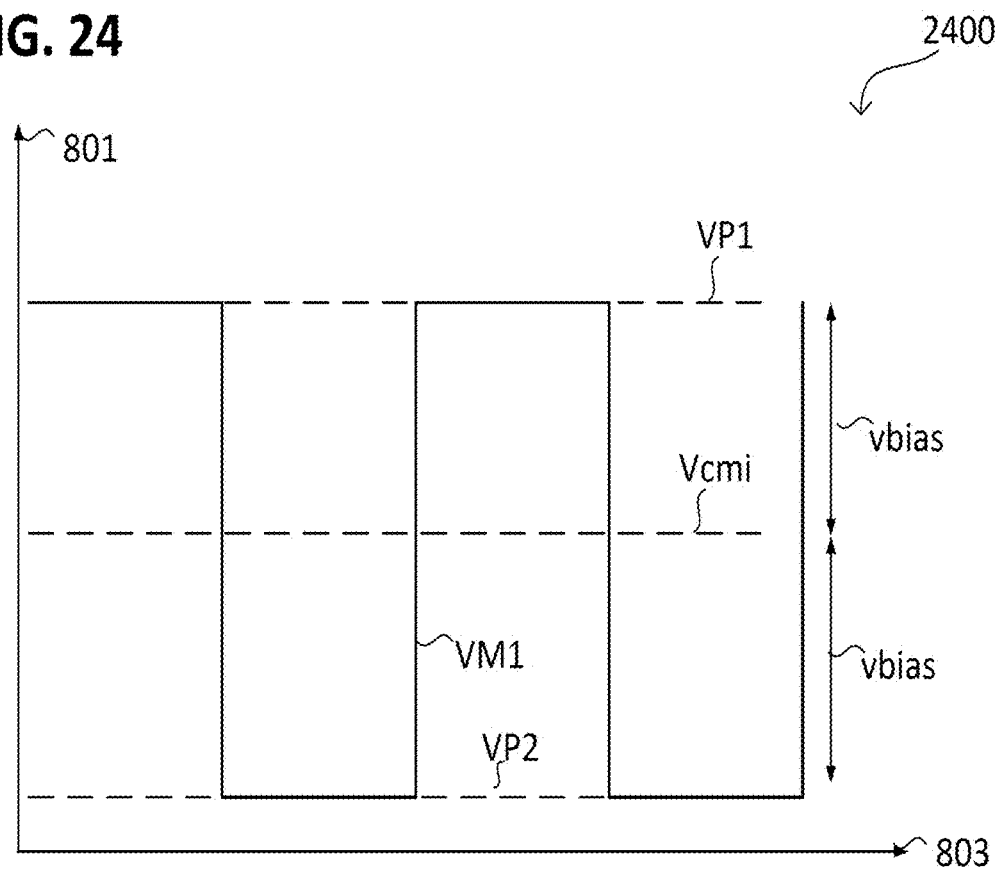
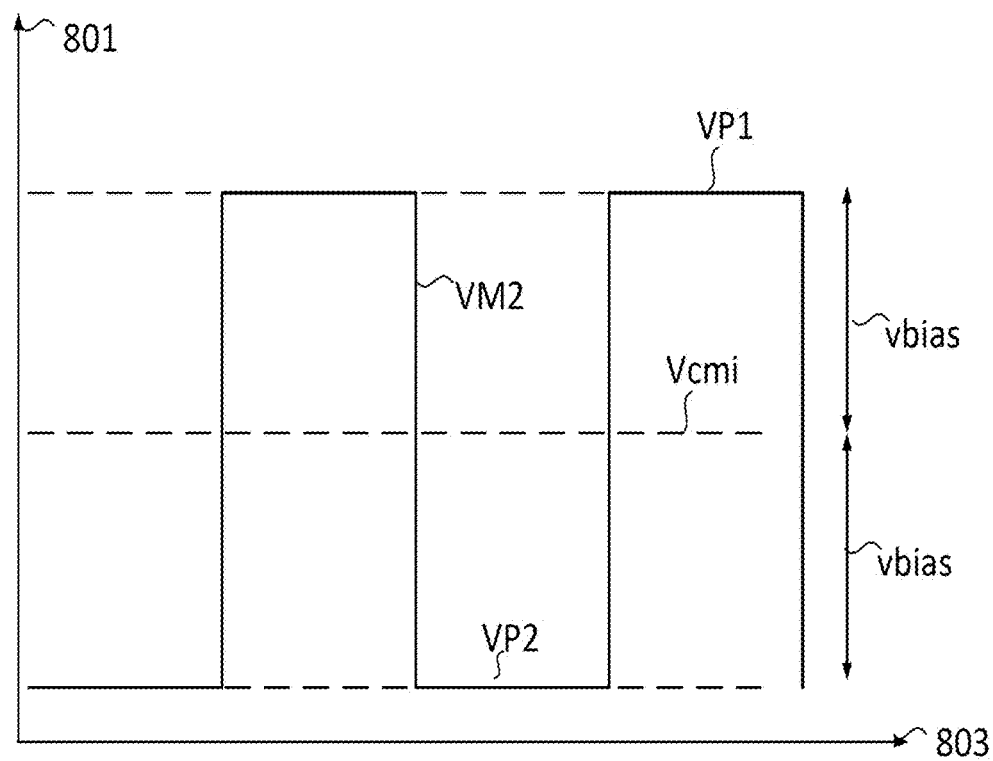

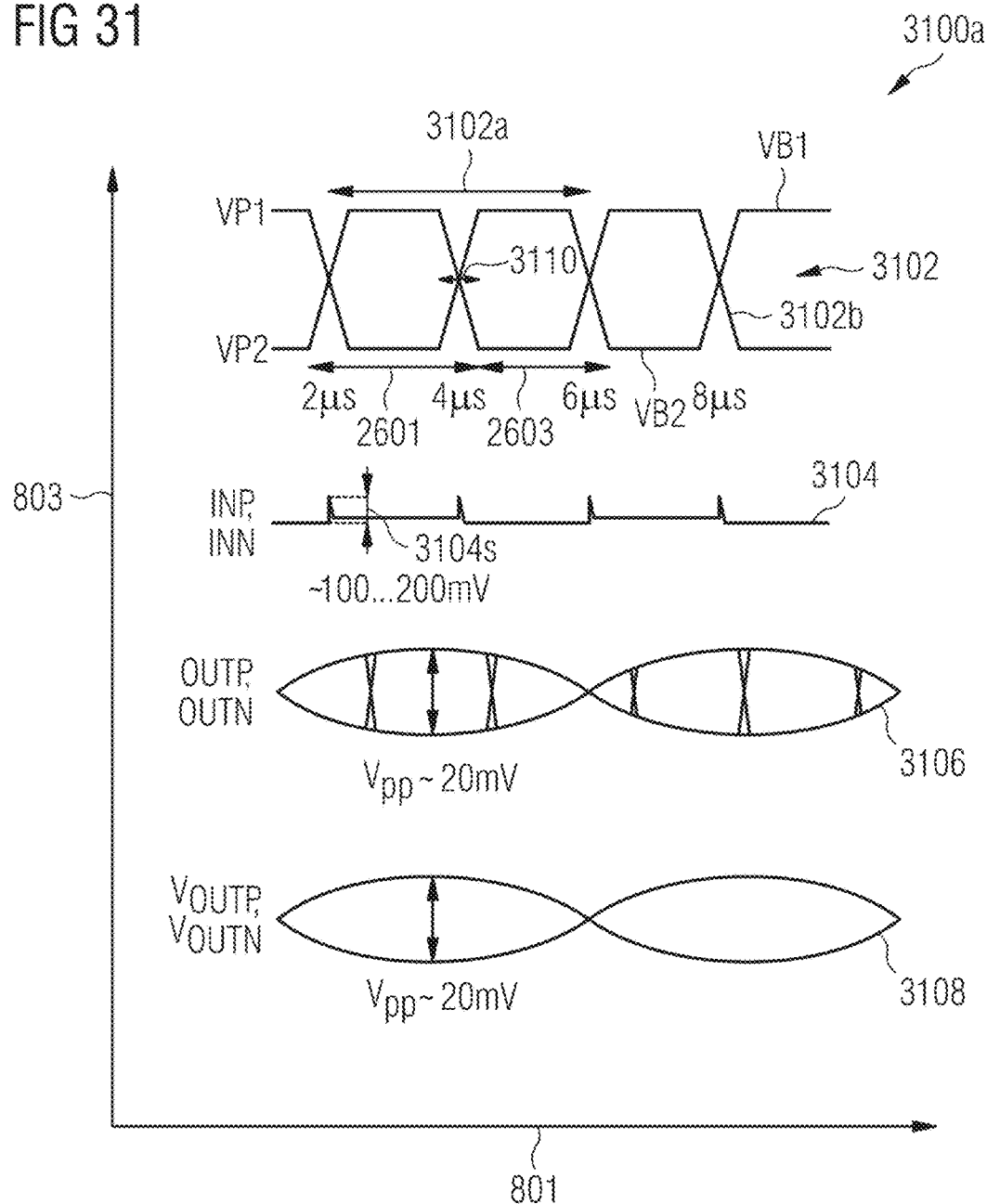

CIRCUIT ARCHITECTURE FOR A MEASURING ARRANGEMENT, A LEVEL SHIFTER CIRCUIT, A CHARGE PUMP STAGE AND A CHARGE PUMP, AND METHOD FOR OPERATING SAME

CROSS-REFERENCE TO RELATED APPLICATION

This application claims priority to German Patent Application Serial No. 10 2016 109 114.6, which was filed May 18, 2016, and is incorporated herein by reference in its entirety.

TECHNICAL FIELD

Various embodiments relate generally to a circuit architecture for a measuring arrangement, a level shifter circuit, a charge pump stage and a charge pump, and a method for operating same.

BACKGROUND

In general, integrated circuits (also referred to as chip or microchip) can be used to process digital or analog signals. An integrated circuit may include a plurality of circuit modules, each circuit module of which provides one or a plurality of functions of the integrated circuit. The more circuit modules the integrated circuit or chip includes, the more complex the latter and its circuit modules can be. By way of example, a complex chip can require a voltage supply, a voltage rectification, a level shifting, a DC voltage conversion, a clock generation, a power amplification, a read-out amplification or the like, which can be provided by means of a respective circuit module.

In general, a signal processing chip is striven for which has a signal-to-noise ratio which illustratively is as high as possible. Said ratio can depend on all the circuit modules of a chip since their noise is superimposed along the signal chain of the chip to form a complex interplay which ultimately limits the technically achievable signal-to-noise ratio, e.g. to approximately 60 decibels or less. By way of example, the noise of a voltage supply can be picked up by a power amplifier and amplified further, such that a signal output by the power amplifier has even greater noise than the voltage supply. In particular, that circuit module which generates the greatest noise can dominate the signal-to-noise ratio of the chip.

Conventionally, circuit modules are striven for which generate the least possible noise along the signal chain. In order to achieve a signal-to-noise ratio which is as high as possible, the signal chain is usually supplied with as low-noise voltage as possible. In a continuously signal processing sensor circuit of a chip, by way of example, MOSFET amplifier circuits or simple source follower amplifier circuits are used.

That parameter of the sensor circuit which is most critical for the signal-to-noise ratio is the so-called pink noise (also referred to as 1/f noise, also referred to in English as "flicker noise"), which increases as the frequency decreases. Conventionally, pink noise is optimized by enlarging the gate area of the amplifying transistor, although a greater demand for required chip area and a production method of increased difficulty have to be accepted for this.

As an alternative to an AC voltage, it is possible to use a DC voltage for supplying the sensor circuit. However, in order to generate the electrical DC voltage on the chip itself (also referred to as on-chip generation), conventionally a low efficiency must be accepted, which increases the waste heat of the chip and thus the necessity for actively cooling the chip. Furthermore, inaccuracies in the timing control, e.g. in the control of the switches for chopping the electrical DC voltage, and an increased power consumption as a result of the required timing control must be accepted. Therefore, in order to minimize the power consumption and the waste heat of the chip, a DC voltage which is as low as possible is usually used for supplying the amplifier circuit, e.g. a DC voltage of 2.5 volts or less.

Alternatively, the electrical DC voltage and/or its generation on the chip itself are/is dispensed with. Instead, either an AC voltage or a DC voltage generated externally (outside the chip) is used for supplying the amplifier circuit or the signal chain.

SUMMARY

In various embodiments, a level shifter circuit is provided. The level shifter circuit may include a signal source and a level shifter. The signal source, on the output side, is capacitively coupled to an input of the level shifter. The signal source and the level shifter are galvanically isolated from one another.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 11A, 11B, 12A and 12B respectively show an electrical potential profile in accordance with various embodiments in a schematic diagram;

FIG. 24 shows a signal profile in accordance with various embodiments in a schematic diagram;

FIG. 31 shows a signal profile in accordance with various embodiments in a schematic diagram;

DESCRIPTION

Figure 1A:
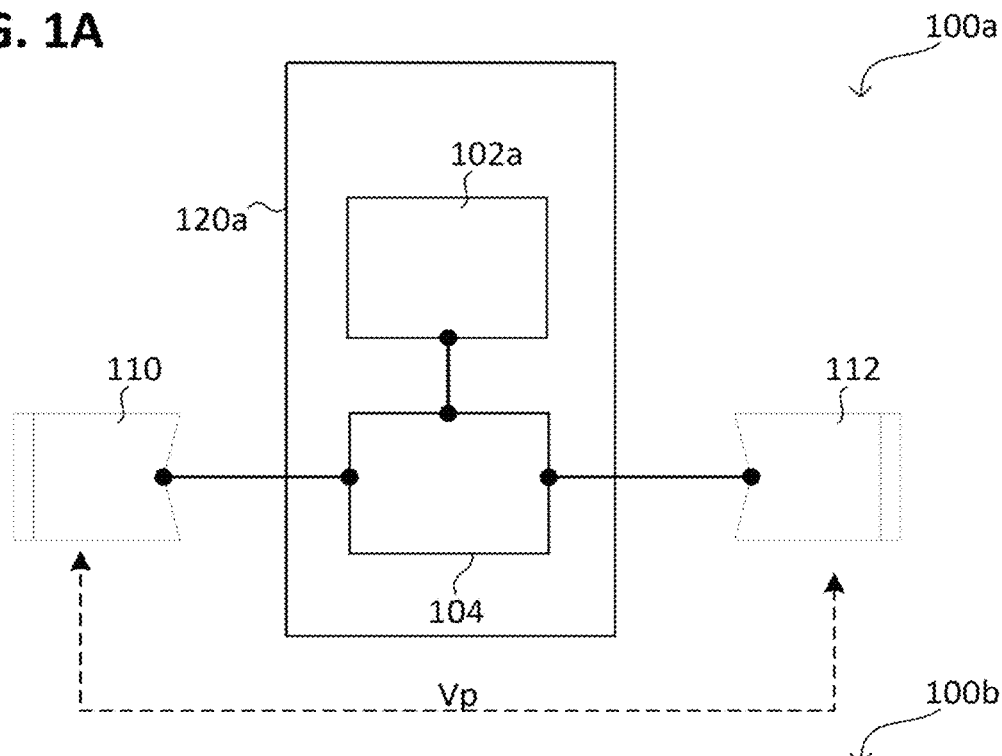
FIGS. 1A, 2A, 3A and 4 respectively show a charge pump stage in accordance with various embodiments in a schematic circuit diagram.

In the following detailed description, reference is made to the accompanying drawings, which form part of this description and show for illustration purposes specific embodiments in which the invention can be implemented. In this regard, component parts of embodiments can be positioned in a number of different orientations, which serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both an (e.g. electrical) direct and indirect connection (e.g. resistive and/or electrically conductive, e.g. an electrically conductive connection), a direct or indirect connection and a direct or indirect coupling.

In accordance with various embodiments, the term "coupled" or "coupling" can be understood in the sense of an (e.g. direct or indirect) electrical connection and/or electrical interaction, including a physical connection and/or interaction. The interaction can be mediated for example by means of an electric current which flows along the current path provided by means of the coupling. An electrical connection may include an electrical conductive connection, i.e. with a resistive behavior, e.g. provided by means of a metal or a degenerate semiconductor material, e.g. in the absence of a pn junction in the electric current path. An indirect electrical connection may include additional components in the electric current path which do not change the operation of the circuit or leave it substantially unchanged.

In general, relations such as "smaller" and "larger" can be understood taking account of the sign, that is to say that a negative value is smaller than a positive value and a more negative (lower) value is smaller than a more positive (higher) value. If indicated (e.g. by "according to the absolute value" or "in terms of absolute value"), relations such as "smaller" and "larger" can be related to the absolute value of a value.

A plurality of elements can be coupled to one another for example along an interaction chain, e.g. a signal chain. A coupling can be configured for transmitting an electrical signal between the two elements coupled to one another. The term "decoupled" can be understood such that the coupling is canceled. By way of example, the decoupling of two elements from one another can have the effect of canceling an electrically conductive connection between them (e.g. converting it into an electrically insulating connection), e.g. by a switch being opened (i.e. being brought to an open state).

In the figures, identical or similar elements are provided with identical reference signs, insofar as this is expedient.

In accordance with various embodiments, a read-out circuit for a micromechanical capacitive sensor is provided, e.g. for a silicon microphone, e.g. for a capacitor microphone using microsystems technology (also referred to as micromechanical capacitor microphone or micromechanical capacitive microphone). The read-out circuit can be based on a bridge circuit, e.g. a full-bridge circuit or a half-bridge circuit. Furthermore, the read-out circuit may include an amplifier, e.g. a differential amplifier (also referred to as subtractor or "fully differential amplifier"), which includes cross-connected switches at both output terminals. Alternatively or additionally, the read-out circuit may include an electrical DC voltage supply for the electrical supply of the bridge circuit, e.g. of a capacitive bridge circuit.

The read-out circuit may include a chopper (or use a chopper method) for reducing low-frequency noise components, such that a greater SNR is achieved, e.g. a greater SNR in the audio frequency band (in the range of approximately 20 Hz to approximately 40 kHz) and/or voice band (in the range of approximately 200 Hz to approximately 4 kHz).

In accordance with various embodiments, illustratively the principle of an electrical DC voltage supply and an improved circuit architecture for a charge pump and a level shifter (also referred to as "level shifter") can be combined, which facilitates the operation of the read-out circuit up to an electrical voltage of 8 volts or more. Alternatively or additionally, the read-out circuit may include a thermal-noise-optimized CMOS amplifier (i.e. an amplifier using complementary metal oxide semiconductor technology) and/or an integrated trimming circuit for all the capacitors of the bridge circuit.

The read-out circuit enables a lower power consumption, a greater edge steepness (or the temporal fit thereof) of the switches of the chopper (also referred to as chopper switches) and/or an SNR of 75 dB or more for the output-side amplifier signal.

In accordance with various embodiments, illustratively:
an improved dynamic level shifter circuit is provided for controlling and/or regulating the chopper switches for the shortest possible time delay, an improved temporal fit and as far as possible lower power consumption;
an improved negative charge pump is provided for as efficient area occupation as possible (i.e. required chip area) and efficient power consumption;

at least one charge storage (also referred to as holding capacitance) is provided for the electrical operating voltage of the bridge circuit, for the lowest possible power consumption and as little noise as possible, without requiring external capacitors (capacitors arranged outside the chip), in order to provide an electrical supply voltage in accordance with a positive electrical working voltage (Vbiasp, i.e. positive Vbias) and/or a negative electrical working voltage (Vbiasn, i.e. negative Vbias);

a specific AC voltage feedback (DC feedback) for reducing the output-side hum (i.e. residual ripple) of the amplifier;

a complex trimming array (also referred to as trimming circuit) for correcting deviations of the capacitors of the measuring bridge from one another, at the amplifier input and/or at the input (input node) of the measuring bridge.

The electrical supply voltage (also referred to as VDD) can generally denote an electrical voltage which is coupled into a circuit or a chip from outside, for example by corresponding contacts of the chip or by means of contactless transmission. An electrical working voltage can be understood as a value which indicates at what voltage a component or a circuit module is intended to be operated in order to ensure the function thereof. An electrical operating voltage can denote that electrical voltage with which a component or a circuit module is actually operated.

An electrical voltage (e.g. the operating voltage, the supply voltage and/or the working voltage) can be understood as a discrete value and/or as a voltage range around the discrete value, e.g. a voltage range of ±10% of the discrete value.

In general, an integrated circuit, e.g. an analog circuit, may include a plurality of circuit modules (also referred to as circuit domains) which differ in their electrical working voltage (i.e. the required electrical operating voltage). The required electrical operating voltages can be provided using the electrical supply voltage within the integrated circuit itself, i.e. can be generated therefrom, e.g. by means of voltage shifting and/or voltage pumping. In general, a charge pump can be integrated in a chip, e.g. for generating an electrical voltage greater than the electrical supply voltage, e.g. for doubling or multiplying the electrical supply voltage.

By way of example, a first circuit module (also referred to as main module or main domain) can require a first electrical operating voltage (illustratively an electrical core voltage), e.g. the electrical supply voltage. A second circuit module can require a second electrical operating voltage (also referred to as VDDH or positive electrical high voltage) greater than the first electrical operating voltage (e.g. the VDDH>VDD). Alternatively or additionally, a third circuit module can require a third electrical operating voltage (also referred to as VSSL or negative electrical high voltage) smaller than the negative of the first electrical operating voltage (e.g. VSSH←VDD).

An illustratively efficient circuit architecture for a charge pump can be provided by means of a so-called latched charge pump (also referred to as a Pelliconi charge pump). Alternatively, a self-charging Dickson charge pump (also referred to as a Bootstrap Dickson charge pump or Dickson charge pump for short) can be used.

Each charge pump stage of a Pelliconi charge pump may include or be formed from a latch. The charge pump stage or the latch may include two CMOS inverters (i.e. inverters using complementary metal oxide semiconductor technology), each of which includes two switches that differ in their channel conduction type (i.e. including at least one NMOS switch and at least one CMOS switch). The switches can thus be controlled by means of a common clock signal, without having to accept switching delays between them. Both positive and negative electrical voltages can be generated by means of a Pelliconi charge pump. However, a large electrical voltage swing can necessitate more outlay in the implementation of the Pelliconi charge pump in a substrate, since an additional insulated well (e.g. n-type well) is required per charge pump stage.

A Bootstrap circuit (e.g. a Bootstrap Dickson charge pump) denotes an electrical circuit in which an electrical potential change in one part of the circuit takes effect with an illustratively short time delay in another part of the circuit (the latter illustratively has an internal feedback). The switches of a Bootstrap circuit may include the same channel conduction type. A Bootstrap circuit can thus necessitate less outlay if a large electrical voltage swing is intended to be generated.

A latch (also referred to as latch register) can denote a state-controlled flip-flop (i.e. a bistable multivibrator). Besides an input and an output, a latch may include at least one additional input (also referred to as control input or gate), by which the latch can toggle between two states: a first state (also referred to as transparent state), in which the output of the latch follows the input of the latch, i.e. is coupled thereto; and a second state (also referred to as hold state), in which the electrical potential of the output (upon entering the second state) is maintained (i.e. is retained). In contrast to an edge-triggered flip-flop, a latch is transparent during the entire active clock phase, that is to say that an input change can immediately influence the output signal.

The latch may include two cross-connected (e.g. digital) CMOS inverters and (in the case of a charge pump) optionally two pump capacitors per charge pump stage.

In accordance with various embodiments, the switches of a charge pump can be formed in a substrate, e.g. a p-doped substrate. The n-channel switches (e.g. NMOS switches) can be formed directly in the substrate, while an n-type well is required for forming p-channel switches (e.g. PMOS switches). During operation, the substrate can be connected to an electrical reference potential, e.g. to electrical ground (to zero volts). In the case of a charge pump which generates a positive electrical voltage, an electrical voltage difference of the p-channel switches with respect to the substrate is increased per stage by the electrical voltage swing of the charge pump, such that one more well is required for each stage. A triple well process can be used, for example, in which an additional p-type well is provided in the n-type well.

The main module (e.g. a digital logic of the integrated circuit, e.g. a processor) can use the electrical core voltage. For controlling and/or regulating a different circuit module (e.g. including an analog switch and/or a transmission gate) that requires a different electrical operating voltage, the clock signal and/or corresponding control signal used therefor are shifted (i.e. transformed/converted/translated) to the different electrical operating voltage. For conversion (level shifting/translating) a cross-coupled latch can be used (cf. FIG. 13B, for example).

If VDDH is in a range of approximately twice to approximately three times VDD, it is thus possible to achieve a simple, rapidly switching, reliable level shifting which has an acceptable power consumption. If high-voltage MOS components (high-voltage metal oxide semiconductor components) are used as cascades for operating low-voltage components, the latch can also be used for even greater VDDH (e.g. greater than three times VDD); cf. FIG. 14A, for example. For this purpose, however, it is necessary to accept a compromise between switching delay and power consumption. As the width of the components of the cross-coupled latch decreases, the switching delay of said latch increases. As the width of the components of the cross-coupled latch increases, the switching delay can be reduced, but this increases the power consumption of said latch. Furthermore, high-voltage level shifters have an increasing power consumption with decreasing switching delay, which should be as small as possible in particular for the use of matched complementary clock generators (also referred to as push-pull generators).

Optionally, it is possible to use additional cascade components in the cross-coupled latches for level shifting (cf. FIG. 15, for example), which are controlled by means of an electrical low-voltage signal, which reduces the power consumption for the same switching delay. However, the power consumption of such circuit architectures for level shifting increases greatly as VDD increases. Furthermore, the switching delay and delay matching of the inverting or noninverting output is comparatively large.

In accordance with various embodiments, a Pelliconi charge pump including e.g. exactly one charge pump stage is used in order to generate the control signal for the high-voltage MOS components in an inverter structure. The electrical gate-to-source voltage of the NMOS component (n-channel MOS component) and/or PMOS component (p-channel MOS component) of the inverter structure (output inverter) can thus be reduced to an excursion of less than or equal to double VDD, e.g. of less than or equal to VDD (cf. FIG. 16B, for example). As a result, it is possible to reduce the electrical cross-current during the switching of the components, e.g. even if the PMOS component switches simultaneously with the NMOS component. Illustratively, it is thus possible to reduce the power consumption, to accelerate the switching, to achieve a smaller deviation of the complementary level shifter outputs (Yp and Y_n), and to achieve a sufficient PSSR, a stabler operating point and/or an improved starting behavior in comparison with previously described level shifters.

In accordance with various embodiments, a charge pump, or the charge pump stage thereof, can be implemented in a read-out circuit (e.g. in an application-specific integrated circuit). The read-out circuit can be implemented together with a sensor (e.g. a sound sensor, such as a MEMS microphone) in a chip (integrated circuit) or a chip module (circuit module). The power of the read-out circuit can influence the total power consumption and the size of the chip of the application-specific integrated circuit. By means of the circuit architecture provided, an application-specific integrated circuit in accordance with predefined specifications can be made possible.

In accordance with various embodiments, the circuit architecture provided can reduce the maximum required electrical voltage swing (peak-to-valley value of the electrical voltage or of the electrical potential) of the charge transfer signal coupled into each charge pump stage. This can make it possible to use the electrical core voltage (i.e. the working voltage of the digital logic of the integrated circuit) for operating the charge pump stage. Additional components for generating the charge transfer signal can thus be avoided.

In accordance with various embodiments, the use of a Bootstrap circuit for the charge pump can prevent an electrical voltage loss of Vth per charge pump stage of the charge pump. Thus, in return, fewer charge pump stages per charge pump may be required in order to achieve a predefined electrical voltage difference (e.g. four or fewer than four per electrical voltage difference of 18 volts).

In accordance with various embodiments, a cycle (e.g. a charge transfer cycle) can be understood as a sequence of phases which proceeds periodically. The cycle can have a period which corresponds to the smallest temporal interval after which the sequence is repeated. The phases can denote time segments of the cycle between which e.g. a state of a system changes.

In accordance with various embodiments, a semiconductor region can be processed in order to form one or a plurality of chips in the semiconductor region. A chip may include an active chip area. The active chip area can be arranged in a part of the semiconductor region and may include at least one component (one component or a plurality of components), such as a transistor, a resistor, a capacitor, a diode or the like. The at least one component or an interconnection of a plurality of components can be configured to carry out logical operations, e.g. computation operations or storage operations. Alternatively or additionally, the at least one circuit element or an interconnection of a plurality of components can be configured to carry out switching operations, signal processing and/or amplification operations. Different components, such as e.g. a transistor, a capacitor and/or a diode, can be configured for high-voltage applications (also referred to as high-voltage diode or high-voltage transistor).

In accordance with various embodiments, a chip (also referred to as semiconductor chip or integrated circuit) can be singulated from the semiconductor region by removing material from a kerf of the semiconductor region (also referred to as dicing or slicing of the semiconductor region). By way of example, removing material from the kerf of the semiconductor region can be carried out by scribing and breaking, cleaving, blade dicing, plasma dicing, laser dicing or mechanical sawing (for example by using a separating saw). After the chip has been singulated, it can be electrically contacted and encapsulated, e.g. by means of a molding material and/or into a chip carrier (also referred to as chip package), which is then suitable for use in electronic devices. By way of example, the chip can be connected on a chip carrier by means of wires, and the chip carrier can be soldered on a printed circuit board and/or on a leadframe.

In accordance with various embodiments, a substrate (e.g. a wafer, e.g. a reconfigured wafer) and/or a semiconductor region may include or be formed from a semiconductor material of one type or of different types, including group IV semiconductors (e.g. silicon or germanium), compound semiconductors, e.g. group III-V compound semiconductors (for example gallium arsenide), group III semiconductors, group V semiconductors or polymers. In a plurality of embodiments, the substrate and/or the semiconductor region can be formed from silicon (doped or undoped). In a plurality of alternative embodiments, the substrate and/or the semiconductor region can be a silicon-on-insulator (SOI) wafer. As an alternative, any other suitable semiconductor material can be used for the substrate and/or the semiconductor region, for example semiconductor compounds (semiconducting chemical compounds) such as gallium phosphide (GaP), indium phosphide (InP), silicon carbide (SiC) or gallium nitride (GaN), but also any suitable ternary semiconductor compound or quaternary semiconductor compound, such as, for example, indium gallium arsenide (InGaAs).

FIG. 1A illustrates a charge pump stage 100a in accordance with various embodiments in a schematic circuit diagram.

The charge pump stage 100a may include a charge storage 102a (also referred to as first charge storage 102a); a switch structure 104, an input 110 and an output 112. The charge storage 102a and the switch structure 104 can be part of a partial stage 120a of the charge pump stage 100a or form the latter (in that case also referred to as partial stage switch structure 104). The switch structure 104 can be configured to drive the charge storage 102a in accordance with a charge transfer cycle 100b of the charge storage 102a or of the partial stage 120a (cf. FIG. 1B). In accordance with various embodiments, the switch structure 104 may include a plurality of switches, as described in greater detail below.

The switches or each switch of the switch structure 104 can be provided by means of transistors (e.g. high-voltage transistors, i.e. transistors having high dielectric strength), the gate terminal of which can provide for example a control input of the switch structure 104. The transistors or each transistor of the switch structure 104 may include the same channel conduction type (e.g. n-channel transistor or p-channel transistor). The switches or each switch of the switch structure 104 can be high-voltage switches.

In accordance with various embodiments, high voltage can be understood to mean an electrical voltage greater than the electrical supply voltage (e.g. the electrical core voltage). A high-voltage component (e.g. a high-voltage transistor or a high-voltage switch) can denote a component having an electrical dielectric strength greater than the electrical supply voltage, i.e. an electrical breakdown voltage (e.g. gate breakdown voltage, dielectric breakdown voltage or a pn breakdown voltage) greater than the electrical supply voltage. A low-voltage component (e.g. a low-voltage transistor) can denote a component having an electrical dielectric strength less than or equal to the electrical supply voltage, i.e. an electrical breakdown voltage less than or equal to the electrical supply voltage. The electrical dielectric strength or electrical breakdown voltage can denote an electrical voltage upon the exceedance of which an electric current (e.g. an electric reverse current) through the component increases greatly.

A high-voltage transistor can have for example a greater thickness of the gate oxide (gate thickness) than a low-voltage transistor, e.g. more than double the gate thickness, e.g. approximately triple the gate thickness. Alternatively or additionally, a high-voltage transistor can have a greater length of the channel (channel length) than a low-voltage transistor, e.g. approximately double the channel length or more. A high-voltage transistor can have a greater electrical threshold voltage (also referred to as electrical switching voltage) than a low-voltage transistor, e.g. approximately 1.5 volts or more. Therefore, for the reliable switching of high-voltage transistors, it may be necessary to use a control signal with a larger peak-to-valley value, e.g. with a peak-to-valley value of more than approximately 1.5 volts, e.g. more than approximately 2 volts, e.g. more than approximately 3 volts, e.g. more than approximately 4 volts.

In accordance with various embodiments, it is possible (e.g. for implementing the switches of the switch structure 104) to use different transistor types. By way of example, a transistor may include or be formed form at least one of the following transistor types: a bipolar transistor (BJT), a heterojunction BJT, a Schottky BJT, an insulated gate BJT (IGBT), a field effect transistor (FET), a junction FET, a metal oxide semiconductor FET (MOSFET), a dual-gate MOSFET, a power field effect transistor (e.g. fast-reverse or fast-recovery epitaxial diode FET), a tunnel FET, etc.

The input 110 may include or be formed from an input node, e.g. if the charge pump stage 100a is interconnected by its input 110 with an additional circuit, e.g. with an additional charge pump stage. The output 112 may include or be formed from an output node, e.g. if the charge pump stage 100a is interconnected by its output 112 with a different additional circuit, e.g. with an additional charge pump stage.

During the operation of the charge pump stage 100a, a first electrical voltage (also referred to as electrical input voltage, or the associated electrical potential) coupled into the input 110 or the input node can be less than a second electrical voltage (also referred to as electrical output voltage, or the associated electrical potential) coupled out at the output 112 or the output node. The electrical voltage difference between output 112 and input 110 can correspond to the electrical voltage Vp provided per charge pump stage 100a (also referred to as electrical voltage swing of the charge pump stage 100a).

In general, a charge pump may include or be formed from one charge pump stage 100a or a plurality of charge pump stages 100a interconnected in series. Each or the charge pump stage 100a of the charge pump may include or be formed from exactly one partial stage 120a or two partial stages 120a interconnected in parallel. The two partial stages 120a interconnected in parallel can be interconnected in a push-pull fashion with respect to one another (also referred to as two push-pull partial stages).

For driving the charge pump stage 100a or the partial stage 120a thereof, a charge transfer signal can be coupled into the charge storage 102a, as described in greater detail below.

Figure 1B:
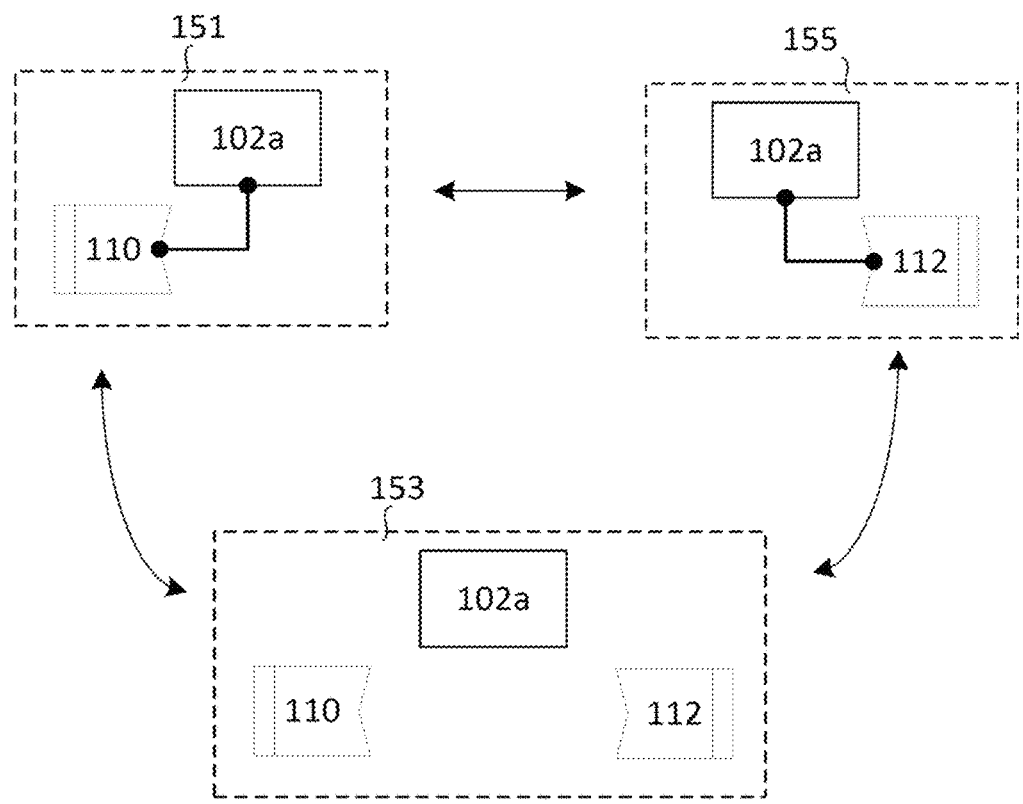
FIGS. 1B, 2B, 3B and 5 respectively show a charge transfer cycle in accordance with various embodiments in a schematic flow diagram.

FIG. 1B illustrates a charge transfer cycle 100b of a charge pump stage 100a or the partial stage 120a thereof in accordance with various embodiments in a schematic flow diagram.

The charge transfer cycle 100b may include: a first phase 151 (also referred to as first partial stage phase 151), in which the charge storage 102a is coupled to an input 110 of the charge pump stage and/or is decoupled from the output 112 of the charge pump stage.

The charge transfer cycle 100b may furthermore include: a second phase 153 (also referred to as second partial stage phase 153) in which the charge storage 102a is decoupled from the input 110 of the charge pump stage and the output 112 of the charge pump stage.

The charge transfer cycle 100b can alternatively include: a second phase 153 (also referred to as second partial stage phase 153), in which the switch structure 104 is in a switching process. By way of example, a first switch 104a of the switch structure 104 and a second switch 104b of the switch structure 104 can be simultaneously in a switching process (cf. FIG. 6).

Illustratively, a switching process of a switch 104a, 104b can define a time interval needed by the switch 104a, 104b for switching (also referred to as switching interval). In accordance with various embodiments, simultaneously in a switching process can be understood such that the switching processes (or the switching intervals) of the two switches 104a, 104b overlap in time, e.g. by more than approximately 10%, e.g. by more than approximately 25%, e.g. by more than approximately 50%, e.g. by more than approximately 75%, e.g. by more than approximately 90%, e.g. by more than approximately 99%.

During the switching process, the switch 104a, 104b changes between an open state (i.e. said switch is electrically insulating) and a closed state (i.e. said switch is electrically conductive), which is also referred to as switching. The switching process (or the time interval thereof) can begin at the point in time t1 at which a control signal coupled into the switch has a predefined criterion (e.g. greater or less than an electrical threshold voltage). With the criterion being attained, the switch can change (e.g. increase or decrease) its electrical resistance. The switching process (or the time interval thereof) can be ended at the point t2 at which the electrical resistance of the switch attains a limit value (i.e. has converged toward a limit value). The convergence criterion can amount to approximately 90% of the limit value.

The change from the open state to the closed state can also be referred to as a switch-on process. Starting from the point in time t1 until the point in time t2, the electric current intensity through the switch can increase. Starting from the point in time t2, the electric current flow may be saturated (that is to say that the electric current intensity may have converged toward the limit value).

The change from the closed state to the open state can also be referred to as a switch-off process. Starting from the point in time t1 until the point in time t2, the electric current intensity through the switch can decrease, i.e. can converge toward zero. Starting from the point in time t2, the electric current flow may stop (i.e. the electric current intensity may have converged toward zero).

The charge transfer cycle 100b may furthermore include: a third phase 155 (also referred to as third partial stage phase 155), in which the charge storage 102a is coupled to the output 112 of the charge pump stage and/or is decoupled from the input 110 of the charge pump stage.

The second partial stage phase 153 can temporally succeed the first partial stage phase 151, e.g. follow the latter. Alternatively or additionally, the second partial stage phase 153 can temporally succeed the third partial stage phase 155, e.g. follow the latter. In other words, the charge transfer cycle can optionally include two second partial stage phases 153.

A first partial stage of the two push-pull partial stages can be in the first partial stage phase 151 if a second partial stage of the two push-pull partial stages is in the third partial stage phase 155, and vice versa. Alternatively or additionally, the two push-pull partial stages can be simultaneously in the second partial stage phase 153.

What can be achieved by means of the circuit architecture of the charge pump stage 100a is that an electrical voltage dropped across each switch of the switch structure 104 (e.g. in each phase of the charge transfer cycle 100b) is less than or equal to the electrical supply voltage of the charge pump stage 100a.

The second partial stage phase 153 can be shorter than the first partial stage phase 151 and/or than the third partial stage phase 155, e.g. shorter than approximately 50% (e.g. 25%, 10%, 5%, 1% or 0.5%) of the first partial stage phase 151 and/or of the third partial stage phase 155. The shorter the second partial stage phase 153, the more efficiently the charge pump 100a can work. By way of example, the second partial stage phase 153 can be shorter than approximately 100 ns (nanoseconds), e.g. shorter than approximately 10 ns, e.g. shorter than approximately 1 ns.

Optionally, the first partial stage phase 151 and the third partial stage phase 155 can be of the same length, e.g. if two push-pull partial stages (which operate in push-pull fashion) are used or a plurality of charge pump stages interconnected in series are used (which operate in pairs in a push-pull fashion).

Figure 2A:
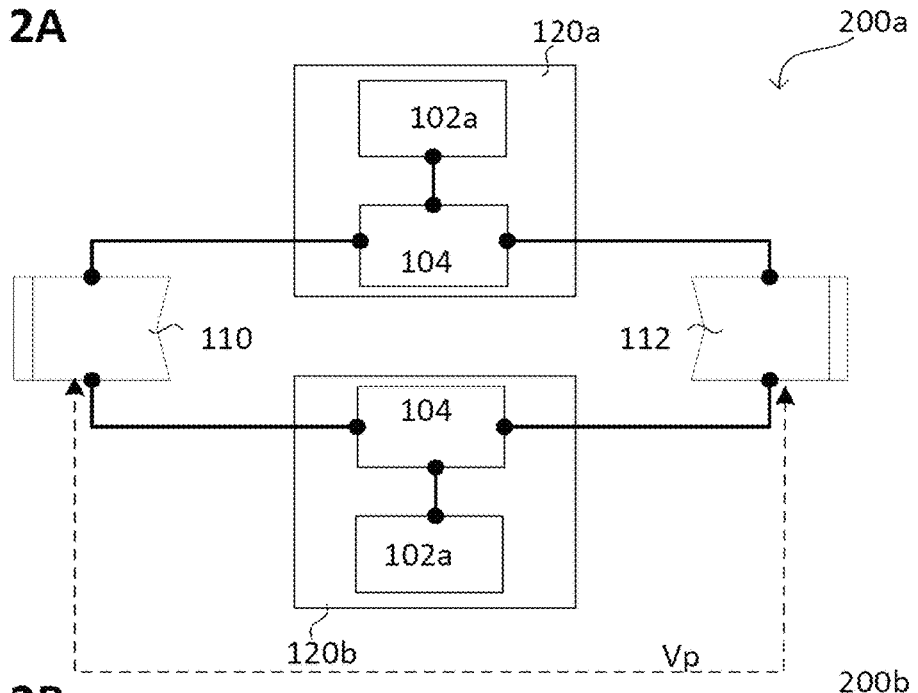

FIG. 2A illustrates a charge pump 200a in accordance with various embodiments in a schematic circuit diagram.

The charge pump stage 200b may include two partial stages 120a, 120b (first partial stage 120a and second partial stage 120b), which are interconnected in parallel with one another between the input 110 and the output 112, e.g. two push-pull partial stages 120a, 120b.

Each of the partial stages 120a, 120b may include a charge storage 102a and a switch structure 104. The switch structure 104 can be configured to drive the respective charge storage 102a in accordance with a charge transfer cycle 100b of the respective charge storage 102a.

The charge transfer cycle 200b of the charge pump 200a (cf. FIG. 2B) can be configured in such a way that the two partial stages 120a, 120b (or the switch structures 104 thereof) are driven in a push-pull fashion with respect to one another. Illustratively, the input 110 of the charge pump stage 200b can be coupled alternately to the charge storage 104 of the first partial stage 120a and to the charge storage 104 of the second partial stage 120b. Alternatively or additionally, the output 112 of the charge pump stage 200b can be coupled alternately to the charge storage 104 of the first partial stage 120a and to the charge storage 104 of the second partial stage 120b.

For driving the first partial stage 120a, a first charge transfer signal can be coupled into the charge storage 102a of the first partial stage 120a, said first charge transfer signal being embodied in a push-pull fashion with respect to a second charge transfer signal coupled into the charge storage 102a of the second partial stage 120b.

Figure 2B:
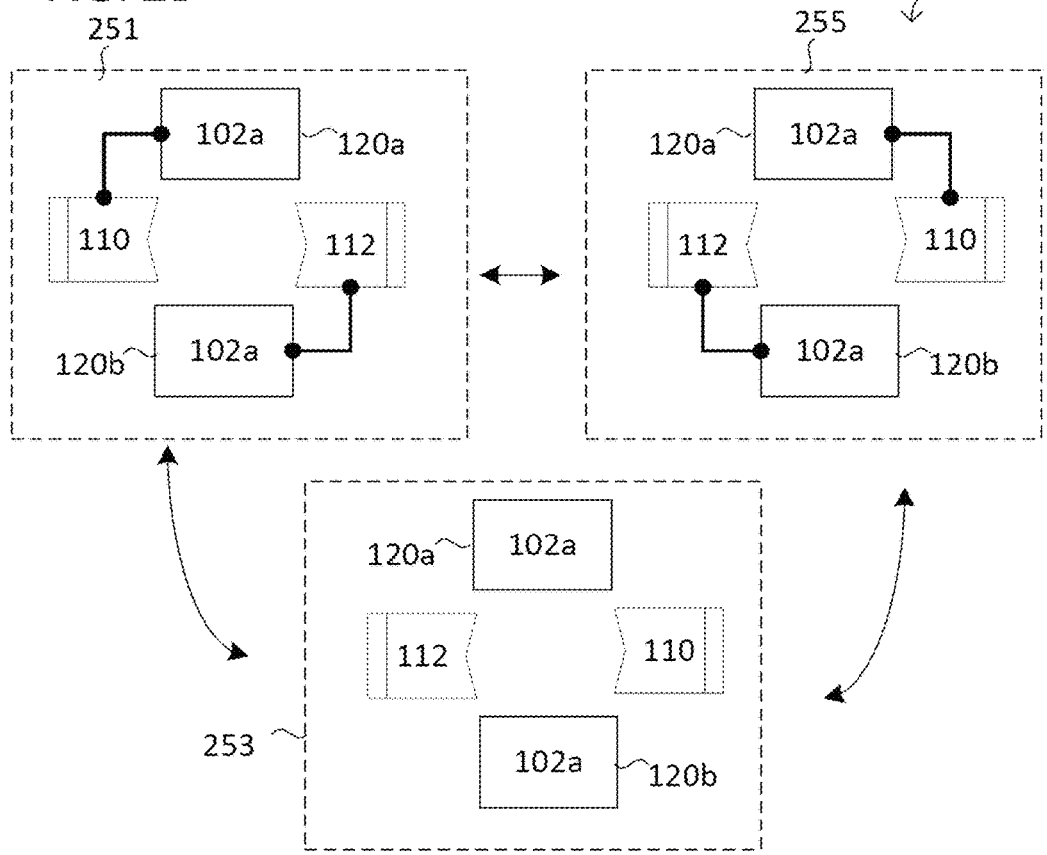

FIG. 2B illustrates a charge transfer cycle 200b in accordance with various embodiments in a schematic flow diagram.

The charge transfer cycle 200b may include: a first phase 251, in which the first partial stage 120a is in its first partial stage phase 151 and the second partial stage 120b is in its third partial stage phase 155. By way of example, the charge storage 102a of the first partial stage 120a can be coupled to the input 110 of the charge pump stage 200a and the charge storage 102a of the second partial stage 120b can be coupled to the output 112 of the charge pump stage 200a. Alternatively or additionally, the charge storage 102a of the first partial stage 120a can be decoupled from the output 112 of the charge pump stage 200a and the chargeage 102a of the second partial stage 120b can be coupled from the input 110 of the charge pump stage 200a.

The charge transfer cycle 200b may furthermore include: a second phase 253, in which the first partial stage 120a is in its second partial stage phase 153 and the second partial stage 120b is in its second partial stage phase 153. By way of example, the charge storage 102a of the first partial stage 120a and of the second partial stage 120b can be decoupled from the output 112 of the charge pump stage 200a and from the input 110 of the charge pump stage 200a. Alternatively or additionally, the switch structures 104 of both partial stages 120a, 120b (of the first partial stage 120a and of the second partial stage 120b) can be in a switching process. By way of example, a first switch 104a of both partial stages 120a, 120b and/or a second switch 104b of both partial stages 120a, 120b can be simultaneously in a switching process (cf. FIG. 6).

The charge transfer cycle 200b may furthermore include: a third phase 255, in which the first partial stage 120a is in its third partial stage phase 155 and the second partial stage 120b is in its first partial stage phase 151. By way of example, the charge storage 102a of the second partial stage 120b can be coupled to the input 110 of the charge pump stage 200a and the charge storage 102a of the first partial stage 120a can be coupled to the output 112 of the charge pump stage 200a. Alternatively or additionally, the charge storage 102a of the second partial stage 120b can be decoupled from the output 112 of the charge pump stage 200a and the charge storage 102a of the first partial stage 120a can be decoupled from the input 110 of the charge pump stage 200a.

The second phase 253 can temporally succeed the first phase 251, e.g. follow the latter. Alternatively or additionally, the second phase 253 can temporally succeed the third phase 255, e.g. follow the latter.

Figure 3A:
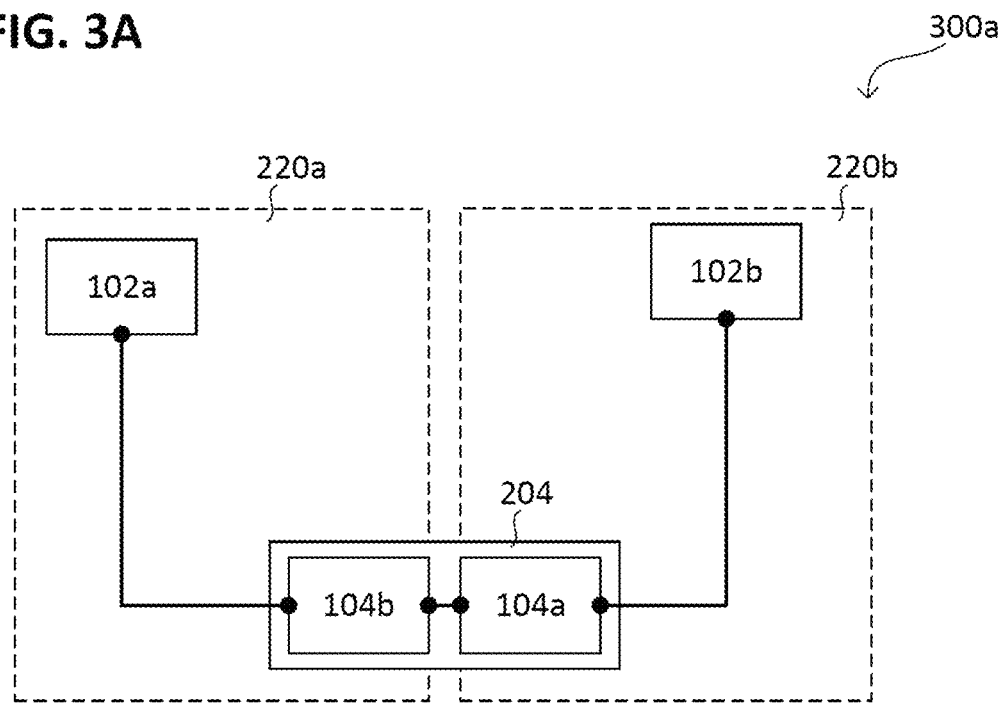

FIG. 3A illustrates a charge pump 300a in accordance with various embodiments in a schematic circuit diagram.

The charge pump 300a may include a plurality of charge pump stages 220a, 220b (e.g. a first charge pump stage 220a and a second charge pump stage 220b), which are interconnected in series with one another. The first charge pump stage 220a may include a first charge storage 102a. The second charge pump stage 220b may include a second charge storage 102b.

The charge pump 300a may include a switch structure 204, which may include a plurality of switches 104a, 104b. The switch structure 204 can be configured to drive the first charge storage 102a and the second charge storage 102b in a push-pull manner with respect to one another, e.g. in accordance with a charge transfer cycle 300b of the plurality of charge pump stages 220a, 220b (cf. FIG. 3B).

Optionally, the first switch 104a and the second switch 104b can be driven synchronously with one another, e.g. by means of a common control signal.

Figure 3B:
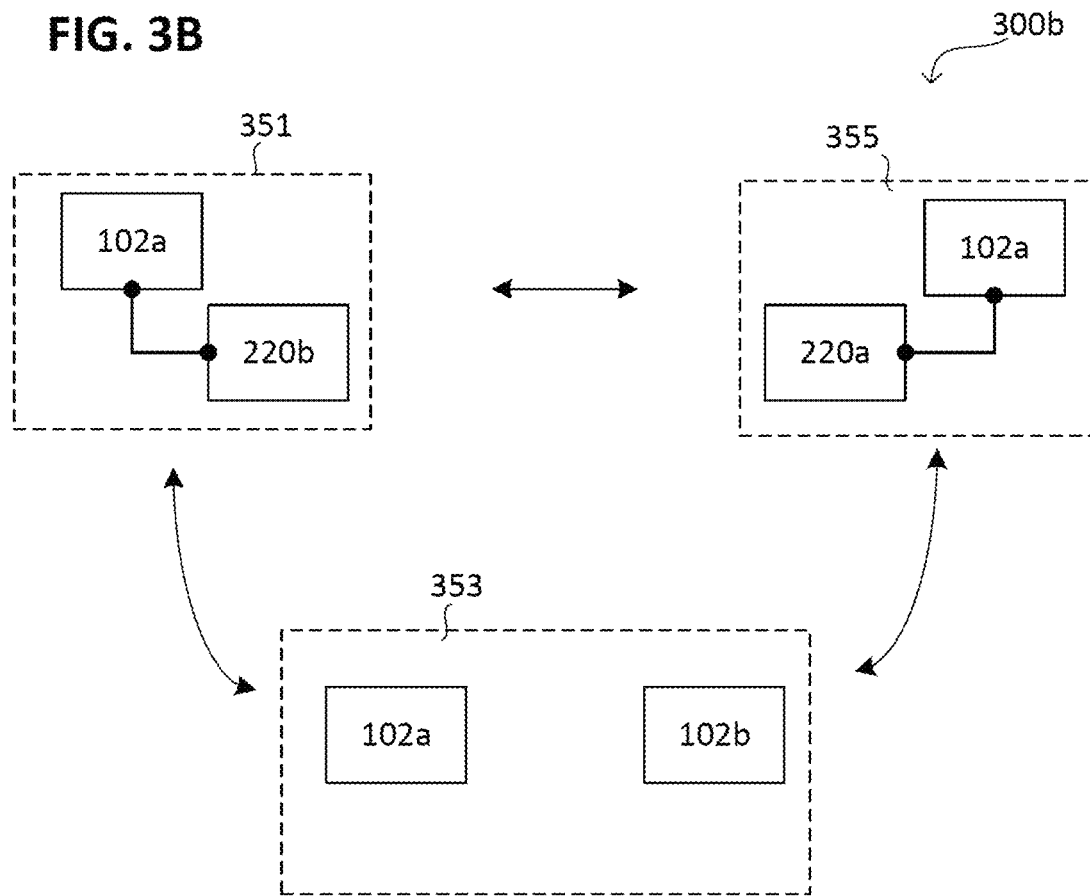

FIG. 3B illustrates a charge transfer cycle 300b in accordance with various embodiments in a schematic flow diagram.

The charge transfer cycle 300b may include: a first phase 351, in which the first charge storage 102a is coupled to the second charge pump stage, e.g. to the input 110 thereof.

The charge transfer cycle 300b may furthermore include: a second phase 353, in which the first charge storage 102a is decoupled from the second charge pump stage 220b and the second charge storage 102b is decoupled from the first charge pump stage 220a.

The charge transfer cycle 300b can alternatively include: a second phase 353, in which the switch structure 204 is in a switching process. By way of example, a first switch 104a of the second charge pump stage 220b and a second switch 104b of the first charge pump stage 220a can be simultaneously in a switching process (cf. FIG. 6).

The charge transfer cycle 300b may furthermore include: a third phase 355, in which the second charge storage 102b is coupled to the first charge pump stage 220a, e.g. the output 112 thereof.

The first phase 351 and the third phase 355 can be simultaneous, such that electrical charge is transferred from the first charge pump stage 220a to the second charge pump stage 220b.

The voltage difference that arises between the two charge storages 102a, 102b can correspond to double the voltage swing Vp of each of the charge pump stages 120a, 120b, e.g. in the second phase 353. The first switch 104a and the second switch 104b can be closed in the second phase 353. A voltage drop across each of the switches 104a, 104b can thus be halved (i.e. correspond to or be less than the voltage swing Vp). Low-voltage switches can thus be used for the two switches 104a, 104b.

Figure 4:
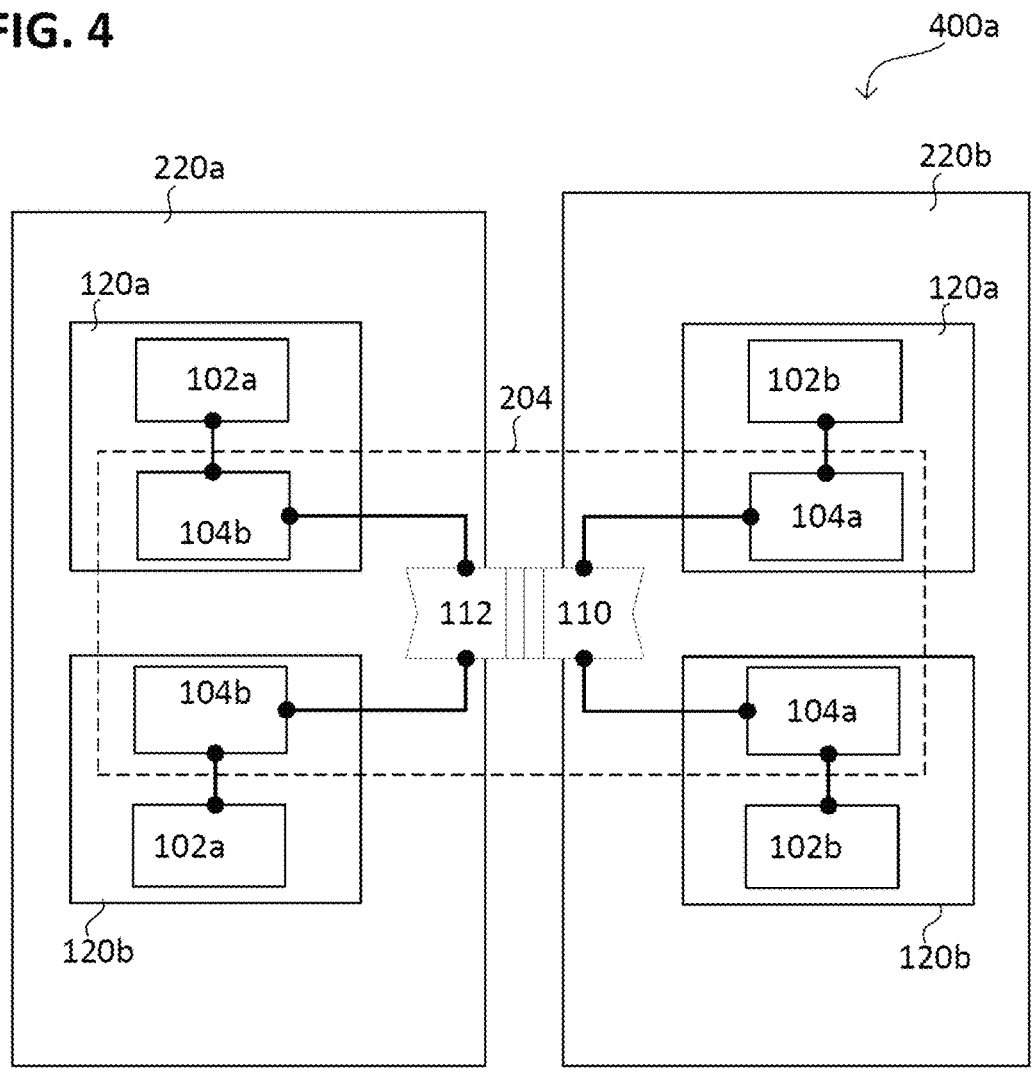

FIG. 4 illustrates a charge pump 400 in accordance with various embodiments in a schematic circuit diagram.

The charge pump 400 can includes a plurality of charge pump stages 220a, 220b (e.g. a first charge pump stage 220a and a second charge pump stage 220b) which are interconnected in series with one another. The first charge pump stage 220a may include two partial stages 120a, 120b. The second charge pump stage 220b may include two partial stages 120a, 120b.

The charge pump 400 may include a switch structure 204 including at least one switch 104a, 104b per partial stage 120a, 120b (in that case also referred to as a partial stage switch structure 204). The switch structure 204 can be configured to drive the charge storages 102a, 102b of the four partial stages 120a, 120b in accordance with a charge transfer cycle of the charge pump 400 (cf. FIG. 5).

The partial stage switch structure 204 can be coupled 110, 112 together, e.g. by means of a pump stage connection 110, 112 (including an input-output node 110, 112) of the charge pump 400.

Figure 5:
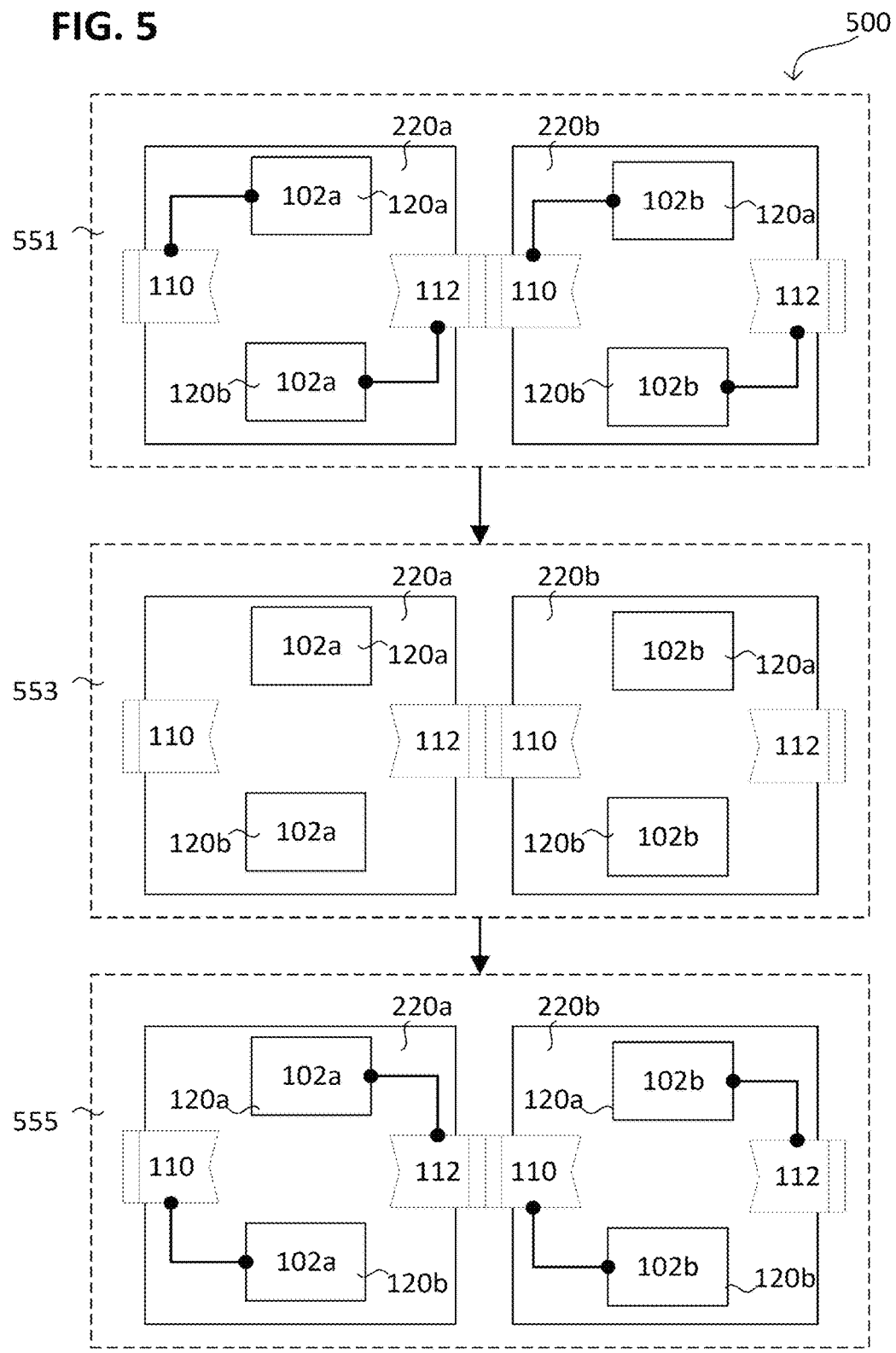

FIG. 5 illustrates a charge transfer cycle 500 in accordance with various embodiments in a schematic flow diagram.

The charge transfer cycle 500 may include: a first phase 551, in which the two first partial stages 120a are in their first partial stage phase 151 and the two second partial stages 120b are in their third partial stage phase 155. By way of example, the second partial stage 120b (or the charge storage 102a thereof) of the first charge pump stage 220a can be coupled to the second charge pump stage 220b, e.g. by means of the pump stage connection 110, 112. Alternatively or additionally, the first partial stage 120a (or the charge storage 102b thereof) of the second charge pump stage 220b can be coupled to the first charge pump stage 220a, e.g. by means of the pump stage connection 110, 112.

The charge transfer cycle 500 may furthermore include: a second phase 553, in which the two first partial stages 120a are in their second partial stage phase 153 and the two second partial stages 120b are in their second partial stage phase 153.

By way of example, each charge storage 102a, 102b can be decoupled from the pump stage connection 110, 112 (also referred to as input-output connection 110, 112). In other words, each charge storage 102a, 102b can be decoupled from the respective other charge pump stage 220a, 220b. Alternatively or additionally, a or each first switch 104a and/or a or each second switch 104b of the two first charge pump stages 220a, 220b can be simultaneously in a switching process (cf. FIG. 6).

The charge transfer cycle 500 may furthermore include: a third phase 555, in which the two first partial stages 120a are in their third partial stage phase 155 and the two second partial stages 120b are in their first partial stage phase 151. By way of example, the first partial stage 120a (or the charge storage 102a thereof) of the first charge pump stage 220a can be coupled to the second charge pump stage 220b. Alternatively or additionally, the second partial stage 120a (or the charge storage 102b thereof) of the second charge pump stage 220b can be coupled to the first charge pump stage 220a, e.g. by means of the pump stage connection 110, 112.

The second phase 553 can temporally succeed the first phase 551, e.g. follow the latter. Alternatively or additionally, the second phase 553 can temporally succeed the third phase 553, e.g. follow the latter.

Figure 6:
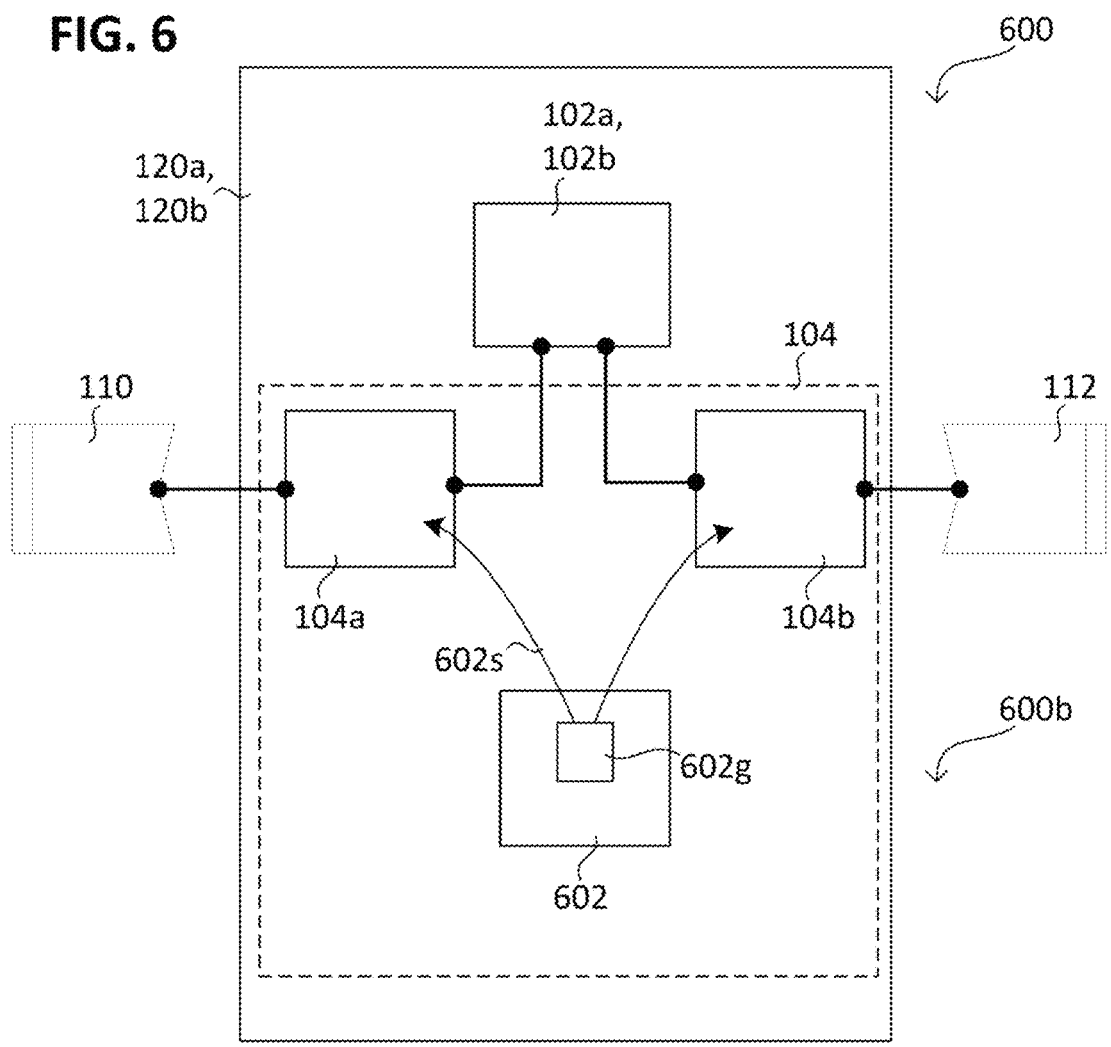
FIGS. 6, 7 and 9 respectively show a charge pump stage in accordance with various embodiments in a schematic circuit diagram.

FIG. 6 illustrates a charge pump stage 600 in accordance with various embodiments in a schematic circuit diagram, e.g. one of the charge pump stages described above or the first partial stage 120a and/or second partial stage 120b thereof.

The switch structure 104 may include a first switch 104a and a second switch 104b. Furthermore, the switch structure 104 may include a control circuit 602 (also referred to as first control circuit 602).

The control circuit 602 can be configured to control 602s the first switch 104a and the second switch 104b in accordance with a charge transfer cycle. In other words, the control circuit 602 can be configured, by means of the first switch 104a and the second switch 104b, to couple the charge storage 102a, 102b to the input 110 and the output 112, respectively, of the charge pump stage 600a in accordance with the charge transfer cycle or to decouple it from them.

The charge transfer cycle can be configured as described herein (e.g. above).

The second partial stage phase 653 of the charge transfer cycle can be shorter, the smaller a temporal spacing with which the first switch 104a and the second switch 104b are switched (i.e. change between an open state and a closed state) (i.e. the better their temporal fit). If the first switch 104a and the second switch 104b include the same channel conduction type, for controlling the first switch 104a it is possible to provide a first control signal that is embodied in a push-pull fashion with respect to a second control signal used to control the second switch 104b. A simultaneous switching of the first switch 104a and of the second switch 104b can thus be made possible (that is to say that these switches are simultaneously in a switching process). In this context, in a push-pull fashion can be understood such that the first control signal attains the switching threshold (illustratively an electrical threshold voltage) of the first switch 104a and the second control signal attains the switching threshold of the second switch 104b with a time delay that is less than approximately 1% of the duration of the charge transfer cycle (e.g. less than approximately 0.1% of the duration of the charge transfer cycle) and/or less than approximately 25% of the switching interval (e.g. less than 10% of the switching interval) of the two switches 104a, 104b. Illustratively, the decoupling of the charge storage from the output 112 and from the input 110 can be omitted in that case.

For providing the control signals (first control signal and second control signal) configured in a push-pull fashion, the charge pump stage 600 (e.g. the switch structure 104 thereof) can optionally include a push-pull generator 602g. The push-pull generator 602g may include or be formed from, for example, at least one inverter (e.g. two cascaded inverters), at least one transistor-transistor gate (e.g. in totem pole connection or in the form of a quasi-complementary output stage) and/or at least one transformer. Still other possible implementations of the push-pull generator 602g which can be used will be described below.

By way of example, the push-pull generator 602g can be configured to invert the first control signal (which is coupled in e.g. by the control circuit 602) or to delay it by half a period and to provide the inverted or delayed first control signal as second control signal, as described in greater detail by way of example below.

Alternatively or additionally, a basic control signal (e.g. a reference clock) can be coupled into the push-pull generator 602g, said signal having double the peak-to-valley value of the first control signal and/or of the second control signal, wherein the push-pull generator 602g is configured to derive the first control signal and the second control signal from the basic control signal, e.g. by means of a voltage divider (e.g. including or formed from a bridge circuit).

In accordance with various embodiments, the charge pump stage 600 in a similar configuration may include two partial stages 120a, 120b interconnected in parallel (analogously to FIG. 2A). In another similar configuration in accordance with various embodiments, the second switches 104b of the two partial stages 120a, 120b can be cross-connected (i.e. form an intermediate switch); cf. FIG. 25 and FIG. 39, for example.

Figure 7:
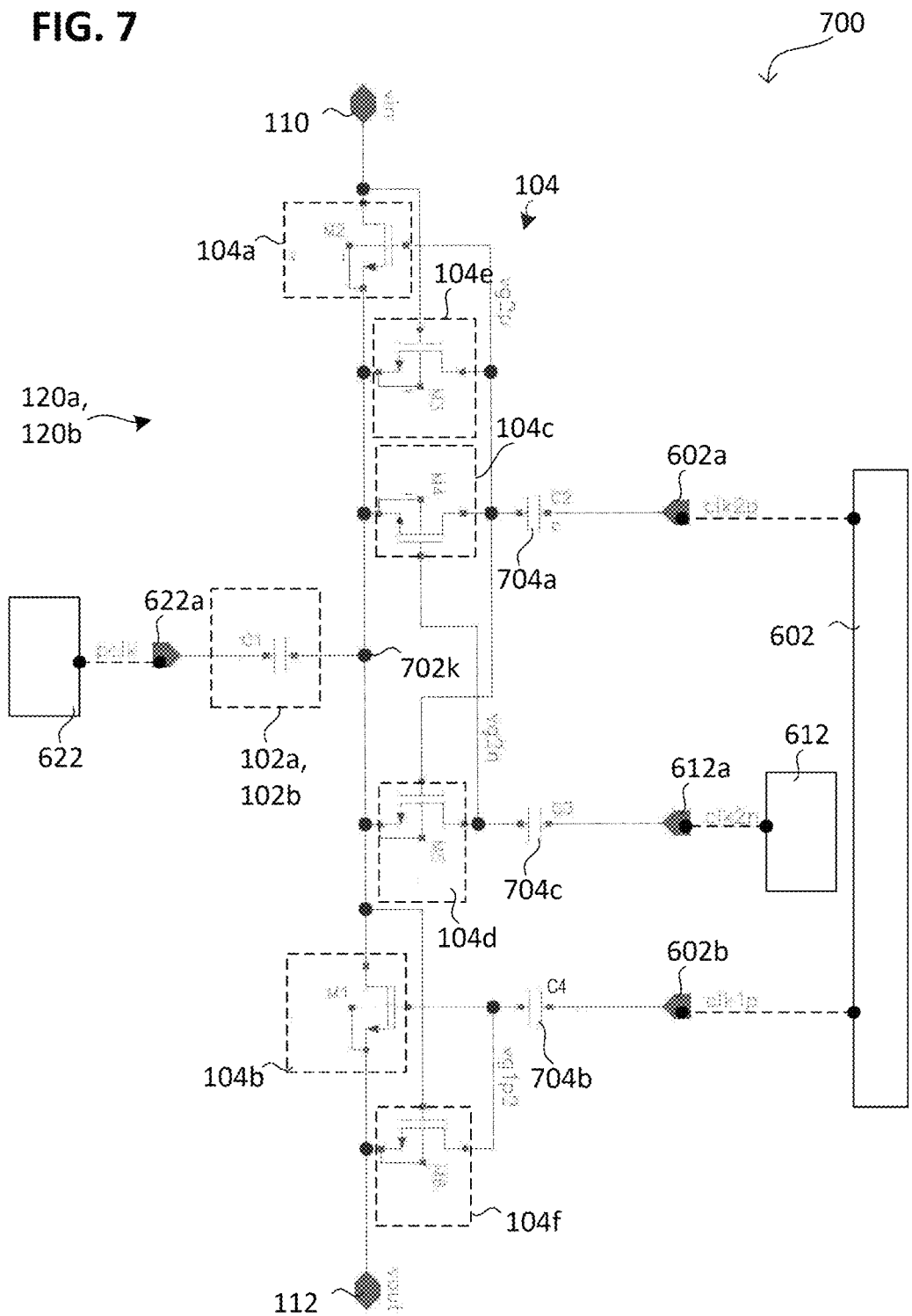

FIG. 7 illustrates a charge pump stage 700 in accordance with various embodiments in a schematic circuit diagram, e.g. one of the charge pump stages described above or the first partial stage 120a thereof and/or the second partial stage 120b thereof.

The charge storage 102a, 102b (e.g. the first charge storage 102a or the second charge storage 102b), may include or be formed from at least one capacitive component, e.g. a capacitor C1. The charge storage 102a, 102b may include an electrical capacitor.

The charge storage 102a, 102b (e.g. the first charge storage 102a or the second charge storage 102b) can be coupled to the switch structure 104 by means of a node 702k (also referred to as charge storage node 702k).

The first switch 104a and the second switch 104b can be switched (i.e. driven) by means of the first control circuit 602 in accordance with the charge transfer cycle, e.g. in a push-pull fashion with respect to one another. The first switch 104a and the second switch 104b can for example each include or be formed from at least one transistor M1, M2, the gate of which is coupled to the first control circuit 602 (e.g. capacitively 704a, 704b), e.g. by means of the control inputs 602a, 602b (first control input 602a and second control input 602b).

In general, a capacitive coupling 704a, 704b, 704c and/or charge storage 102a, 102b can be provided by means of a capacitive component. The capacitive component may include a capacitive reactance, i.e. a capacitor (e.g. a gate-source capacitance) and/or a frequency-dependent impedance. The capacitive component may include for example at least one capacitor C2, C3, C4 and/or at least one transistor (e.g. the gate-source capacitance thereof). In other words, as an alternative or in addition to a capacitor, e.g. in the case of a low required capacitance, the gate-source capacitance of a transistor can be used in order to provide the capacitive coupling.

If the control circuit 602 is capacitively coupled (i.e. by means of a first capacitive coupling 704a) to the first switch 104a, the switch structure 104 can optionally include a first leveling circuit 104d, 104c, 104e. The first capacitive coupling 704a can be provided by means of a capacitor C2, for example. The first leveling circuit 104d, 104c, 104e can be configured to couple a first capacitive coupling 704a to the charge storage 120a, 102b in the second partial stage phase 153 and/or in the third partial stage phase 155. What can thus be achieved, for example, is that an electrical potential of the first capacitive coupling 704a is put cyclically at a reference value (i.e. a drifting thereof is prevented), which is defined e.g. by the charge storage 102a, 102b.

The first leveling circuit 104d, 104c, 104e may include for example a third switch 104c, which is connected between the first control input 602a and the charge storage 102a, 102b. The first leveling circuit 104d, 104c, 104e may furthermore include a second control circuit 612 for controlling the third switch 104c. The third switch 104c may include for example at least one transistor M4, the gate of which is coupled to the second control circuit 612 (e.g.

capacitively 704c), e.g. by means of the third control terminal 612a. By way of example, the third switch 104c can be closed in the third partial stage phase 155 and otherwise be open or opened.

The first leveling circuit 104d, 104c, 104e can optionally include a fourth switch 104d, which is connected between the third control terminal 612a and the charge storage 102a, 102b. The fourth switch 104d can be controlled by means of the first control circuit 602, e.g. by means of the first control input 602a (that is to say that the fourth switch 104d can be clocked synchronously with the first switch 104a, i.e. be configured in a push-pull fashion with respect thereto). The fourth switch 104d may include for example at least one transistor M5, the gate of which is coupled to the first control input 602a.

The first leveling circuit 104d, 104c, 104e can optionally include a fifth switch 104e, which is connected between the first control input 602a and the charge storage 102a, 102b. The fifth switch 104e may include for example at least one transistor M3, the gate of which is coupled to the input 110. What can thus be achieved is that the fifth switch 104e electrically conductively connects the first control input 602a to the charge storage 102a, 102b in the second phase and/or third phase, e.g. as long as an electrical voltage at the input 110 satisfies a predefined criterion, e.g. is greater than a predefined threshold value (that is to say that it is controlled indirectly by means of the charge transfer signal).

If the control circuit 602 is capacitively coupled (i.e. by means of a second capacitive coupling 704b) to the second switch 104b, the switch structure 104 can optionally include a second leveling circuit 104f. The second capacitive coupling 704b can be provided for example by means of a capacitor C4. The second leveling circuit 104f can be configured to couple a second capacitive coupling 704b to the output 112 in the second partial stage phase 153 and/or in the first partial stage phase 151. What can thus be achieved, for example, is that an electrical potential of the second capacitive coupling 704b is put at a reference value, which is defined e.g. by the output 112.

The second leveling circuit 104f may include or be formed from a sixth switch 104f, for example, which is connected between the second control input 602b and the output 112. The sixth switch 104f may include for example at least one transistor M6, the gate of which is coupled to the charge storage 102a, 102b. What can thus be achieved is that the sixth switch 104f electrically conductively connects the second control input 602b to the charge storage 102a, 102b in the second phase and/or first phase, e.g. as long as an electrical voltage provided by the charge storage 102a, 102b satisfies a predefined criterion, e.g. is greater than a predefined threshold value (that is to say that it is controlled indirectly by means of the charge transfer signal).

The charge pump stage 700 can be interconnected in a Bootstrap circuit or Bootstrap configuration.

During the operation of the charge pump stage 700, a first control signal clk2p (e.g. a first control clock) can be coupled, e.g. capacitively 704a, into the first switch 104a, e.g. by means of the first control input 602a. A second control signal clk1p (e.g. a second control clock) can be coupled, e.g. capacitively 704a, into the second switch 104b, e.g. by means of the second control input 602b. The first control circuit 602 can be configured for providing the first control signal clk2p and/or the second control signal clk1p. The first control signal clk2p and the second control signal clk1p can be shifted temporally with respect to one another, e.g. by half the charge transfer cycle (i.e. the cycle half thereof) and/or by the duration of the first partial stage phase 151 and of the second partial stage phase 153 together. Alternatively or additionally, the first control signal clk2p and the second control signal clk1p can be complementary to one another (i.e. configured in a push-pull fashion with respect to one another).

A third control signal clk2n (e.g. a third control clock) can be coupled, e.g. capacitively 704c, into the first leveling circuit 104d, 104c, 104e (e.g. the fourth switch 104d thereof), e.g. by means of the third control input 612a. The second control circuit 612 can be configured for providing the third control signal clk2n.

A fourth control signal pclk (also referred to as charge transfer signal, e.g. a fourth control clock) can be coupled into the charge storage 102a, 102b, e.g. by means of a fourth control input 622a. The charge pump stage 700 may include a third control circuit 622, which can be configured for providing the fourth control signal pclk. Illustratively, the fourth control input 622a or the fourth control circuit 622 can be capacitively coupled to the switch structure 104 by means of the charge storage 102a, 102b.

The fourth control input 622a (also referred to as clock input 622a) may include or be formed from a clock input node, e.g. if the charge pump stage 700 is interconnected by its fourth control input 622a with an additional circuit, e.g. with the third control circuit 622.

The fourth control input 622a can be capacitively coupled to the charge storage node 702k or the switch structure 104 (for transferring electrical charge by means of the charge storage node in accordance with a charge transfer signal coupled in by means of the control input 622a).

By means of the first switch 104a, the charge storage node 702k or the charge storage 102a, 102b can be electrically conductively connected to the input node or the input 110 for the purpose of taking up electrical charge, e.g. in the first partial stage phase 151 (also referred to as charging phase 151) of the charge transfer cycle. By means of the first switch 104b, the input 110 (or an electrical voltage present at the input 110, also referred to as "Vin") can be decoupled from the charge storage 102a, 102b or from the fourth control signal, e.g. in at least the third partial stage phase 753 and in the second partial stage phase 753.

By means of the second switch 104b, the charge storage node 702k, or the charge storage 102a, 102b can be electrically conductively connected to the output node or the output 112 for the purpose of outputting electrical charge, e.g. in the third partial stage phase 755 (also referred to as discharging phase 755) of the charge transfer cycle. By means of the second switch 104b, the output 112 (or an electrical voltage present at the output 112, also referred to as "Vout") can be decoupled from the charge storage 102a, 102b or from the fourth control signal, e.g. in at least the first partial stage phase 751 and in the second partial stage phase 753.

The electrical voltage difference Vp (Vp=Vout−Vin) provided per charge pump stage 700 can approximately correspond to the peak-to-valley value of the charge transfer signal (pclk) (e.g. in load-free operation). The peak-to-valley value of the charge transfer signal can correspond for example to the electrical supply voltage.

Figure 8:
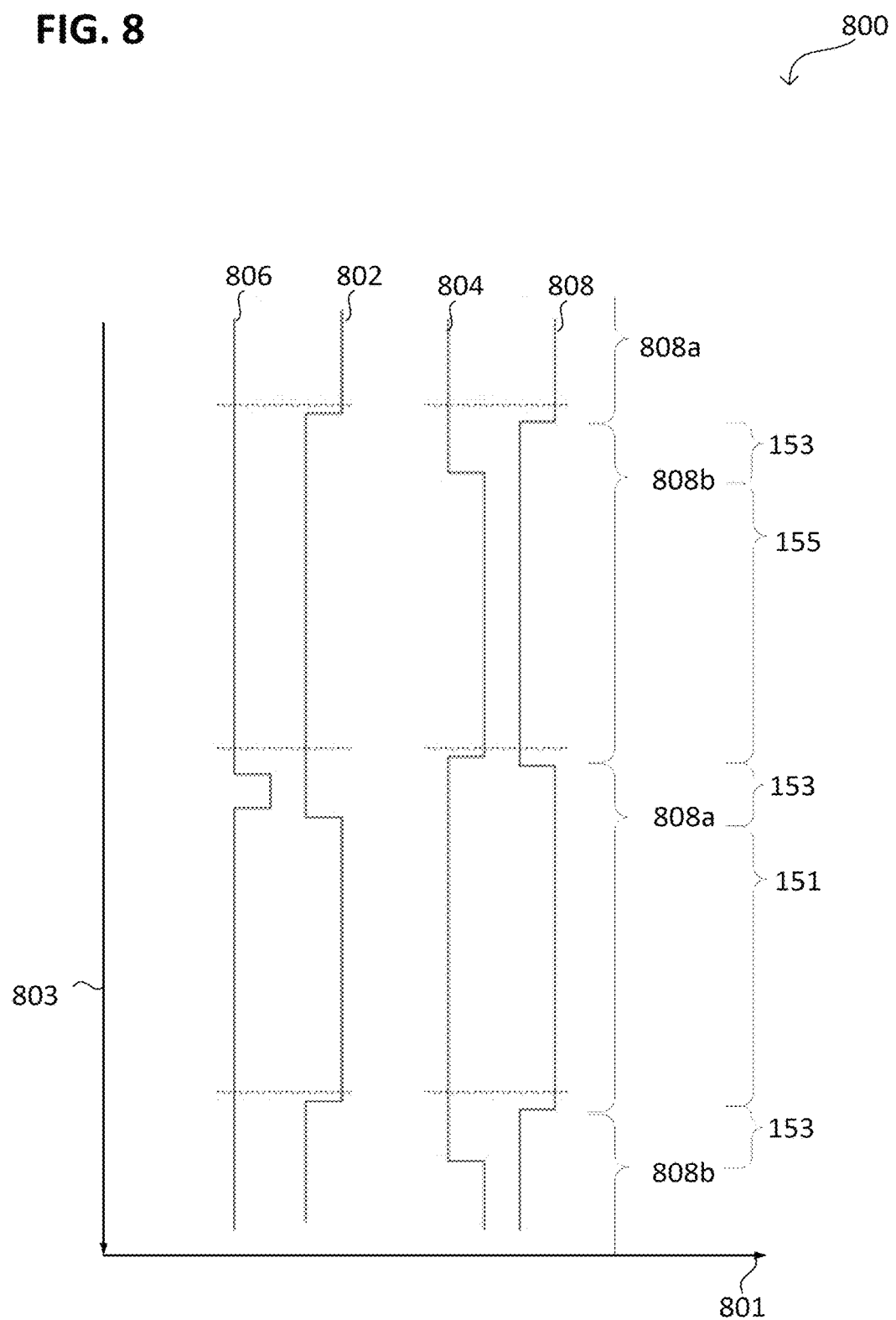
FIGS. 8 and 10 respectively show a signal profile in accordance with various embodiments in a schematic diagram.

FIG. 8 illustrates a signal profile 800 in accordance with various embodiments in a schematic diagram illustrating a signal characteristic 801 (e.g. an electrical voltage of the signal, in arbitrary units) against time 803 (in arbitrary units).

The first control circuit 602 can be configured for providing a first control signal 802 (also referred to as clk2p) and the second control signal 804 (also referred to as clk1p).

The second control circuit 612 can be configured for providing the third control signal 806.

The fourth control circuit 622 can be configured for providing the charge transfer signal 808.

In accordance with the charge transfer signal 808, an electrical potential at the charge storage 102a, 102b or the charge storage node 702k (or an electrical voltage resulting therefrom) can be changed. The electrical voltage of the charge storage 102a, 102b or at the charge storage node 702k (also referred to as "Vint" or internal electrical voltage) can be transferred between Vin and Vout in accordance with the charge storage cycle. The electrical voltage difference Vd provided per charge pump stage can approximately correspond to the peak-to-valley value of the charge transfer signal 808 (e.g. in load-free operation).

In accordance with various embodiments, an electrical voltage can be understood as an electrical potential difference (difference between two electrical potentials), e.g. between an output and an input. By way of example, an electrical voltage across a component (i.e. the electrical voltage which is dropped across the component) can be understood as the difference between the electrical potentials on opposite sides (e.g. at the terminals) of the component. An electrical voltage at a node (e.g. a terminal, input, output, or the like) can be understood as the difference between the electrical potential at the node and an electrical reference potential (e.g. electrical ground). Indications about a plurality of electrical voltages in a circuit can refer to the same electrical reference potential.

If the electrical voltage at a node is positive, the electrical potential thereof is greater than the electrical reference potential. If the electrical voltage at a node is negative, the electrical potential thereof is less than the electrical reference potential. The greater the electrical voltage at a node, the greater the electrical potential thereof can be. An electrical voltage difference (e.g. between two nodes) can be understood as the difference between two electrical voltages, which, if the two electrical voltages are referred to the same electrical reference potential, corresponds to the difference between the corresponding electrical potentials (e.g. between the two nodes) (i.e. indicated independently of the electrical reference potential).

The charge transfer signal 808 may include a first cycle section 808a (e.g. a first cycle half 808a) and a second cycle section 808b (e.g. a second cycle half 808b).

A negative charge pump (or the negative charge pump stage thereof) can be driven as follows: during the first cycle section 808a, the charge transfer signal 808 can be configured in such a way that an electrical potential provided at the charge storage 102a, 102b (or charge transfer node 702k) (or an electrical voltage resulting therefrom) is equal to approximately the electrical potential of the input 110 (or an electrical voltage of the input 110 resulting therefrom) or is greater than that. During the second cycle section 808b, the charge transfer signal 808 can be configured in such a way that an electrical potential provided at the charge storage 102a, 102b (or charge transfer node) (or an electrical voltage resulting therefrom) is equal to approximately the electrical potential of the output 112 (or an electrical voltage of the output 112 resulting therefrom) or is less than that. The negative charge pump can provide on the output side for example a voltage which is less than the voltage coupled into said charge pump on the input side. The input 110 of the input-side charge pump stage of a charge pump can be at the smallest available electrical potential, e.g. at the reference potential (e.g. at 0 volts). The switches or each switch of the negative charge pump can be provided by means of NMOS transistors, for example.

The first cycle section 808a may include or consist of the first phase 151 and optionally a second phase 153. The second cycle section 808a may include or consist of the third phase 155 and optionally an additional second phase 153.

The first control signal 802 (of a negative charge pump) can be configured in such a way that the charge storage 102a, 102b is electrically conductively connected to the input 110 by means of the switch structure 104 (in the charging phase 151) if the charge storage 102a, 102b has a greater electrical potential than the input 110. If the charge storage 102a, 102b is electrically conductively connected to the input 110 by means of the switch structure 104, electrical charge from the input 110 can be output by the charge storage 102a, 102b (also referred to as charge outputting).

The second control signal 804 can be configured in such a way that the charge storage 102a, 102b is electrically conductively connected to the output 112 by means of the switch structure 104 (in the discharging phase 855), if the charge storage 102a, 102b has a lower electrical potential than the output 112. If the charge storage 102a, 102b is electrically conductively connected to the output 112 by means of the switch structure 104, electrical charge at the output 112 can be taken up by the charge storage 102a, 102b (also referred to as charge uptake). The charge uptake and the charge outputting can take place cyclically (also referred to as charge pumping), i.e. in accordance with the charge transfer cycle.

A positive charge pump (or the positive charge pump stage thereof) can be driven complementarily to the negative charge pump. In other words, the signals (i.e. the charge transfer signal 808 and the control signals) can be inverted with respect to the signal profile illustrated. The positive charge pump can provide on the output side for example a voltage that is greater than the voltage coupled into said charge pump on the input side. The input 110 of the input-side charge pump stage of a charge pump can be at the highest available electrical potential, e.g. at the supply voltage. The switches or each switch of the positive charge pump can be provided by means of PMOS transistors, for example.

In accordance with various embodiments, a low-noise voltage swing can be provided. By way of example, an electrical voltage coupled in at the input 110 and/or an electrical voltage coupled out at the output 112 can have a ripple of less than 300 mV (millivolts), e.g. in a range of approximately 100 mV to approximately 300 mV, in relation to approximately 200 mV.

If the charge pump stage is operated in a load-free fashion (i.e. without a load present at the consumer or a current consumer), the internal electrical voltage Vint of the charge pump stage has a peak-to-valley value (e.g. an amplitude) less than or equal to the peak-to-valley value of the charge transfer signal 808. The peak-to-valley value of the charge transfer signal 808 (also referred to as charge transfer swing or electrical voltage swing) can be approximately VDD. The electrical voltage difference between the input 110 and the output 112 of the charge pump stage can then be equal to the charge transfer swing (in other words Vp=Vout−Vin=VDD).

In accordance with various embodiments, the charging phase 151 and the discharging phase 155 can have a temporal spacing from one another (by means of a second phase 153), corresponding to the duration of the second phase 153. A decoupling from an electrical potential of the output 112 can thus take place, such that an electrical voltage drop across the first switch 104a is reduced. Illustratively, the first switch 104a and the second switch 104b act as voltage dividers which divide the electrical potential difference (electrical voltage) between the output 112 and the input 110, such that an electrical voltage across the first switch 104a and/or across the second switch 104b is less than or equal to the electrical voltage Vp from the input 110 to the output 112. It is thus possible to use switches having less dielectric strength (e.g. low-voltage switches), e.g. the same switches that are used for operating the logic (e.g. the chip logic). Optionally, the cross-sectional area (i.e. the occupied chip area) of the switches can be reduced or alternatively or additionally VDD can be increased. Furthermore, the power consumption of the charge pump stage can be reduced, illustratively since the switches can be controlled by means of a control signal at VDD level, and/or a Bootstrap circuit for the switches can be dispensed with. Alternatively or additionally, the gate capacitance of the switches 104a, 104b (e.g. of the transistors M1, M2) can be reduced for the same switching resistance, which further reduces the power consumption of the charge pump stage.

Figure 9:
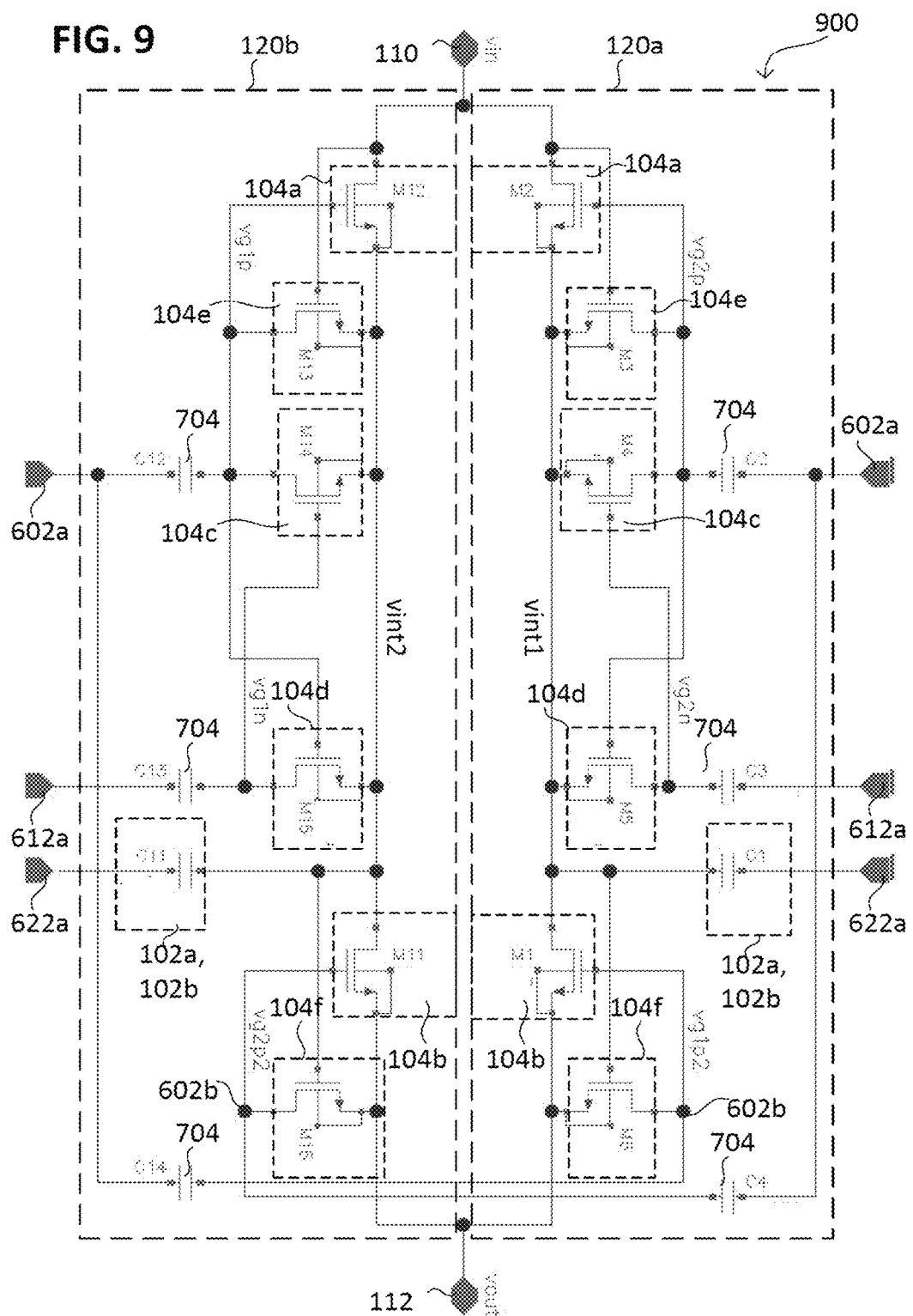

FIG. 9 illustrates a charge pump stage 900 in accordance with various embodiments in a schematic circuit diagram. The charge pump stage 900 includes a first partial stage 120a and a second partial stage 120b, which are coupled in parallel with one another between the output 112 and the input 110 (e.g. push-pull partial stages 120a, 120b).

The two partial stages 120a, 120b can each include a charge storage 102a, 102b (e.g. the first charge storage 102a or the second charge storage 102b), e.g. provided by means of capacitors C1, C11.

The first control input 602a and the second control input 602b can be interconnected in a transposed fashion. In other words, the first control input 602a of the first partial stage 120a can be coupled to the second control input 602b of the second partial stage 120b. Alternatively or additionally, the first control input 602a of the second partial stage 120b can be coupled to the second control input 602b of the first partial stage 120a.

The first switch 104a (e.g. including transistor M2) of the first partial stage 120a and the second switch 104b (e.g. including transistor M11) of the second partial stage 120b can each be coupled to the first control input 602a of the first partial stage 120a (that is to say that these can be configured for synchronously switching). The first switch 104a (e.g. including transistor M12) of the second partial stage 120b and the second switch 104b (e.g. including transistor M1) of the first partial stage 120a can each be coupled to the second control input 602b of the first partial stage 120a (that is to say that these can be configured for synchronously switching).

By way of example, the first switches 104a of the two partial stages 120b can switch in a manner offset by a cycle half with respect to one another, e.g. in a push-pull fashion. As an alternative or in addition thereto, the second switches 104a of the two partial stages 120b can switch in a manner offset by a cycle half with respect to one another, e.g. in a push-pull fashion.

The configuration of the charge pump stage 900 can also be referred to as a push-pull configuration. Illustratively, the two charge transfer signals coupled into the charge storages 102a, 102b of the charge pump stage 900 can be embodied in a push-pull fashion with respect to one another.

The capacitive couplings can be provided by means of capacitors C2, C3, C4, C12, C13, C14. The switches can be provided by means of transistors M3, M4, M5, M6, M13, M14, M15, M16.

Figure 10:
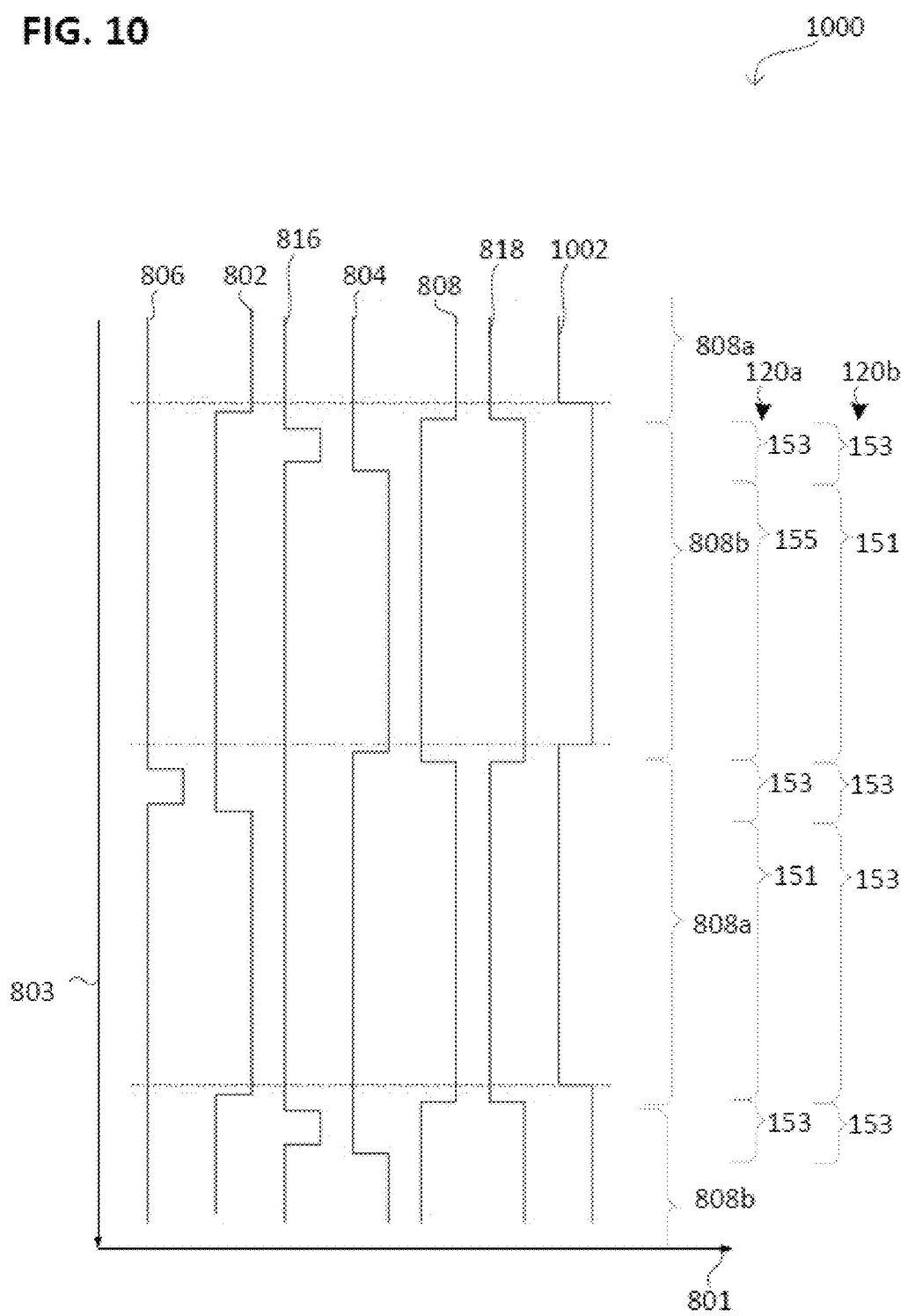

FIG. 10 illustrates a signal profile 1000 in accordance with various embodiments in a schematic diagram illustrating a signal characteristic 801 (e.g. an electrical voltage of the signal, in arbitrary units) against time 803 (in arbitrary units).

A first control signal 802 (e.g. a first control clock 802) can be coupled into the first control input 602a of the first partial stage 120a and/or into the second control input 602b of the second partial stage 120b. A second control signal 804 (e.g. a second control clock 804) can be coupled into the first control input 602a of the second partial stage 120b and/or into the second control input 602b of the first partial stage 120a. By way of example, the first control circuit 602 can be configured for providing the first control signal 802 and the second control signal 804. The first control signal 802 and the second control signal 804 can correspond in terms of their signal characteristic and/or be provided in a manner temporally offset with respect to one another, e.g. temporally offset by a cycle section 808a, 808b of the charge transfer cycle, e.g. temporally offset by half the duration of the charge transfer cycle (i.e. by the cycle half thereof). By way of example, the first control signal 802 and the second control signal 804 can be phase-shifted with respect to one another, e.g. by the first phase 151 and by the second phase 153.

A third control signal 806 (e.g. a third control clock 806) can be coupled into the third control input 612a of the first partial stage 120a. The second control circuit 612 can be configured for providing the third control signal. The third control signal 806 can be coupled into the leveling circuit 104c, 104d, 104e of the first partial stage 120a and be configured in such a way that the leveling circuit 104c, 104d, 104e thereof couples the first capacitive coupling 704a thereof to the charge storage 102a, 102b thereof in the second phase 153 of the first cycle section 808a.

An additional third control signal 816 (e.g. a third control clock 816) can be coupled into the third control input 612a of the second partial stage 120b. The second control circuit 612 can be configured for providing the additional third control signal 816. The additional third control signal 816 can be coupled into the leveling circuit 104c, 104d, 104e of the second partial stage 120b and be configured in such a way that the leveling circuit 104c, 104d, 104e thereof couples the first capacitive coupling 704a thereof to the charge storage 102a, 102b thereof in the second phase 153 of the second cycle section 808b.

The third control signal 806 and the additional third control signal 816 can correspond in terms of their signal profile and/or be phase-shifted with respect to one another, e.g. by half the duration of the charge transfer cycle (also referred to as cycle half).

A fourth control signal 808 (e.g. a fourth control clock 808) can be coupled into a fourth control input 622a of the first partial stage 120a (also referred to as first charge transfer signal 808). The third control circuit 622 can be configured for providing the fourth control signal 808.

An additional fourth control signal 818 (e.g. an additional fourth control clock 818) can be coupled into a fourth control input 622a of the second partial stage 120b (also referred to as second charge transfer signal 818). The third control circuit 622 can be configured to provide the additional fourth control signal 808.

The fourth control signal 808 and the additional fourth control signal 818 can correspond in terms of their signal characteristic (e.g. peak-to-valley value, period duration, mean value over time, signal waveform) and/or be phase-shifted with respect to one another, e.g. by the cycle half.

The electrical voltage difference Vd provided per charge pump stage can approximately correspond to the peak-to-valley value of the fourth control signal 808 and/or of the additional fourth control signal 818 (e.g. in load-free operation).

The charge transfer cycle can be provided, e.g. synchronized, by means of a reference clock 1002 (also referred to as "clock"). The reference clock 1002 can be provided by means of a clock generator. The reference clock 1002 can be coupled into the control circuits 602, 612, 622 of the charge pump stage. What can thus be achieved is that the control circuits 602, 612, 622 of the charge pump stage run synchronously with one another.

In general, a clock signal (e.g. the reference clock) can have one of various signal profiles, e.g. a trapezoidal signal waveform, a rectangular signal waveform, a triangular signal waveform or a superimposition thereof.

A negative charge pump (or the negative charge pump stage thereof) can be driven as follows: the charge transfer signal 808 can differ between the first cycle section 808*a* and the second cycle section 808*b*. During the first cycle section 808*a*, the first charge transfer signal 808 can be configured in such a way that an electrical potential provided at the charge storage 102*a*, 102*b* (or charge transfer node) of the first partial stage 120*a* (or an electrical voltage resulting therefrom) is equal to approximately the electrical potential of the input 110 (or an electrical voltage of the input 110 resulting therefrom) or is greater than that. During the second cycle section 808*b*, the first charge transfer signal 808 can be configured in such a way that an electrical potential provided at the charge storage 102*a*, 102*b* (or charge transfer node) of the first partial stage 120*a* (or an electrical voltage resulting therefrom) is equal to approximately the electrical potential of the output 112 (or an electrical voltage of the output 112 resulting therefrom) or is less than that.

The second charge transfer signal 818 can differ between the first cycle section 808*a* and the second cycle section 808*b*. During the first cycle section 808*a*, the second charge transfer signal 818 can be configured in such a way that an electrical potential provided at the charge storage 102*a*, 102*b* (or charge transfer node) of the second partial stage 120*b* (or an electrical voltage resulting therefrom) is equal to an electrical potential of the output 112 (or an electrical voltage of the output 112 resulting therefrom) and/or of the charge storage 102*a*, 102*b* (or charge transfer node) of the first partial stage 120*a* or is less than that. During the second cycle section 808*b*, the second charge transfer signal 818 can be configured in such a way that an electrical potential provided at the charge storage 102*a*, 102*b* (or charge transfer node) of the second partial stage 120*b* (or an electrical voltage resulting therefrom) is equal to an electrical potential of the input 110 (or an electrical voltage of the input 110 resulting therefrom) and/or of the charge storage 102*a*, 102*b* (or charge transfer node) of the first partial stage 120*a* or is greater than that.

The control signals (i.e. the first control signal 802, the second control signal 804 and the charge transfer signals 808, 818) can be configured in such a way that the charge uptake of the first partial stage 120*a* and the charge outputting of the second partial stage 120*b* take place simultaneously (in a push-pull fashion). Alternatively or additionally, the control signals can be configured in such a way that the charge uptake of the second partial stage 120*b* and the charge outputting of the first partial stage 120*a* take place simultaneously. The charge uptake and the charge outputting can take place cyclically.

Optionally, the second phase 153 of the first cycle section 808*a* and/or the second phase of the second cycle section 808*b* can be omitted, e.g. if the second control signal 804 and the first control signal 802 are configured in a push-pull fashion with respect to one another (e.g. if the first control signal 802 and the second control signal 804 are inverted with respect to one another).

A positive charge pump (or the positive charge pump stage thereof) can be driven complementarily to the negative charge pump. In other words, the signals (i.e. the charge transfer signals 808, 818 and the control signals) can be inverted with respect to the signal profile illustrated.

FIG. 11A illustrates an electrical potential profile 1100*a* in accordance with various embodiments in a schematic diagram illustrating an electrical potential 801 (in arbitrary units) against time 803 (in arbitrary units). By way of example, the electrical potential profile 1100*a* can occur in a load-free state of a charge pump stage.

The electrical potential 1112 of the output 112 (output-side electrical potential 1112, Vout) can differ from the electrical potential 1110 of the input 110 (input-side potential 1110, Vin), e.g. be greater (in the case of a positive charge pump) or less (in the case of a negative charge pump) than the input-side electrical potential 1110. The electrical potential 1702*k* of the charge storage 102*a*, 102*b* (or of the charge transfer node 702*k*), also referred to as charge transfer potential 1702*k*, can change back and forth between the input-side electrical potential 1110 and the output-side electrical potential 1112. The peak-to-valley value (e.g. amplitude) of the charge transfer potential 1702*k* can approximately correspond to VDD.

The electrical potential 1104*a* of the first switch 104*a* (controlled by means of the first switch signal 1104*a*), e.g. at the control input 602*a* thereof, can differ from the charge transfer potential 1702*k* in the charging phase 151 (such that the first switch 104*a* is closed) and otherwise be equal thereto (such that the first switch 104*a* is open). Alternatively or additionally, the first switch signal 1104*a* can differ from the input-side potential 1110 and/or from the output-side potential 1112 in the charging phase 151 (such that the first switch 104*a* is open).

By way of example, the output-side potential 1112 can be at approximately −8 volts and the input-side potential 1110 can be at approximately −5.3 volts (e.g. with respect to electrical ground). The peak-to-valley value (e.g. the amplitude) of the charge transfer potential 1702*k* (and/or VDD) can be approximately 2.7 volts. In the load-free state (i.e. non-loaded), the charge pump stage can provide an electrical voltage swing Vp of approximately VDD.

The duration of the charging phase 151 can be for example in a range of approximately 0.01 µs to approximately 0.1 µs, e.g. approximately 0.036 µs. Alternatively or additionally, the duration of the charging phase 151 can correspond to the duration of the discharging phase 155. The duration of the second partial stage phase 1153 can be less than approximately 100 ns (nanoseconds), e.g. shorter than approximately 10 ns, e.g. shorter than approximately 1 ns.

FIG. 11B illustrates an electrical potential profile 1100*b* in accordance with various embodiments in a schematic diagram, analogously to FIG. 11A.

The electrical potential 1104*b* of the second switch 104*b* (controlled by means of the second control signal clk1*p*), e.g. coupled in at the control input 602*b* thereof, can differ from the output-side potential 1112 in the discharging phase 155 (such that the second switch 104*b* is closed) and otherwise be equal thereto (such that the second switch 104*b* is open). Alternatively or additionally, the second control signal 1104*b* can differ from the charge transfer potential 1702*k* in the charging phase 151 and in the discharge phase 155.

FIG. 12A illustrates an electrical potential profile 1200*a* in accordance with various embodiments in a schematic diagram, analogously to FIG. 11A, for example in a loaded state of the charge pump stage (i.e. if an electrical consumer taps off the coupled-out Vout).

FIG. 12B illustrates an electrical potential profile 1200*a* in accordance with various embodiments in a schematic diagram, analogously to FIG. 11B, for example in a loaded state of the charge pump stage.

Figure 13A:
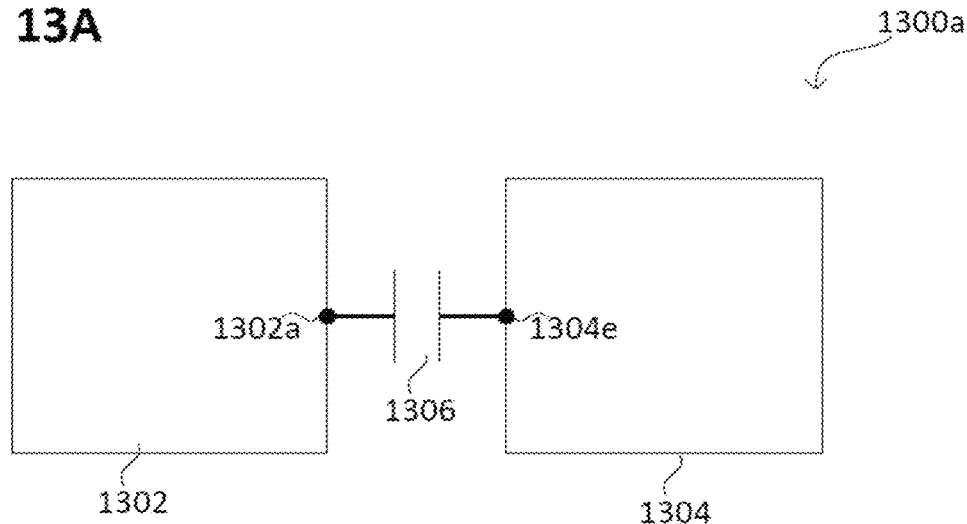
FIG. 13A shows a level shifter circuit in accordance with various embodiments in a schematic circuit diagram.

FIG. 13A illustrates a level shifter circuit 1300*a* in accordance with various embodiments in a schematic circuit diagram.

The level shifter circuit 1300*a* may include a signal source 1302 (e.g. including or formed from a first level shifter 1302 and/or a push-pull generator 1302) and a second level shifter 1304.

In accordance with various embodiments, the signal source 1302 may include or be formed from the first level shifter 1302 (i.e. be configured for providing one or a plurality of level shifter signals, e.g. level-converted clock signals). The signal source 1302 for example need not necessarily be configured for providing two complementary signals.

In one or more embodiments, the signal source 1302 may include or be formed from a push-pull generator (i.e. be configured for providing two complementary signals). The signal source 1302 for example need not necessarily be configured for providing a level shifter signal (e.g. a level-converted clock signal).

In one or more alternative embodiments, the signal source 1302 may include the push-pull generator and the first level shifter (i.e. be configured for providing two complementary level shifter signals, e.g. complementary level-converted clock signals).

The signal source 1302 (e.g. the first level shifter 1302), on the output side 1302*a*, can be capacitively 1306 coupled to an input 1304*e* of the second level shifter 1304. By means of the capacitive coupling 1306, the first level shifter 1302 and the second level shifter 1304 can be galvanically isolated from one another.

By way of example, the capacitive coupling 1306 may include a charge storage (e.g. a transistor), which capacitively couples the first level shifter 1302 on the output side to an input 1304*e* of the second level shifter 1304.

In accordance with various embodiments, the level shifter circuit 1300*a* may require output power of the charge pumps which supply the level shifter circuit 1300*a* that is approximately 20% less (e.g. approximately 10% less) than a conventional level shifter cascading. Thus, illustratively, approximately 10% to 20% less chip area may be required for the charge pumps and/or holding capacitors, which overall saves up to approximately 40% of the total chip area (e.g. approximately 2.38 mm$^2$). The total power consumption of the chip can thus be reduced, e.g. to less than 6.6 milliwatts (e.g. a current consumption of less than 2.4 mA at 2.75 V). The charge pumps by themselves can cause approximately half of the power consumption of the chip.

Reference is made hereinafter to the first level shifter 1302 and the first level shifter signal generated by it. The push-pull generator 1302 can be configured analogously thereto. By way of example, the first level shifter signal may include two complementary level shifter signals, that is to say that a first level shifter signal and a first level shifter signal complementary thereto can be generated. Alternatively, instead of the first level shifter signal, a non-level-converted push-pull signal (e.g. having a level remaining the same as the associated input signal and/or at the level of the supply voltage) can be generated.

Figure 13B:
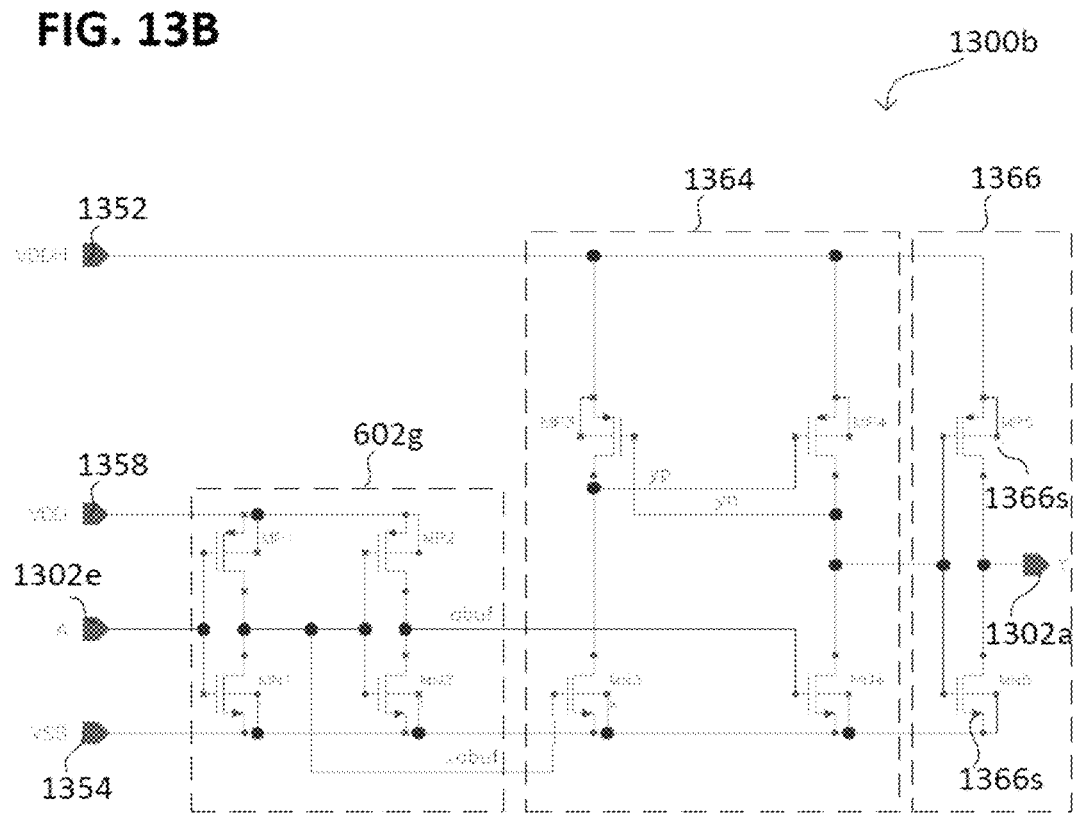
FIGS. 13B, 14A, 14B, 15, 16A, 16B and 17A respectively show a level shifter in accordance with various embodiments in a schematic circuit diagram.

FIG. 13B illustrates a level shifter 1300*b*, e.g. the first level shifter 1302, in accordance with various embodiments in a schematic circuit diagram.

The level shifter 1300*b* (e.g. the first level shifter 1302) may include a first terminal 1352 (also referred to as high-voltage terminal 1352 or VDDH terminal) and a second terminal 1354 (also referred to as reference terminal 1354), between which an electrical reference voltage (e.g. a positive electrical reference voltage, e.g. a positive electrical high voltage, for example 3.3 volts or more) can be present. By way of example, electrical ground can be present at the second terminal 1354.

The level shifter 1300*b* (e.g. the first level shifter 1302) may furthermore include on the input side a third terminal 1302*e* (also referred to as signal input terminal or input 1302*e*) and a fourth terminal 1358 (also referred to as supply voltage terminal 1358). A positive electrical supply voltage (for example less than approximately 2.5 volts, e.g. approximately 1.5 volts) can be present between the supply voltage terminal 1358 and the reference terminal 1354, said supply voltage being less than the electrical reference voltage, e.g. less than 50% of the electrical reference voltage. The reference voltage can be provided by means of a charge pump in accordance with one or a plurality of embodiments.

Furthermore, the level shifter 1300*b* (e.g. the first level shifter 1302) may include a push-pull generator 602*g*, which is coupled to the operating voltage terminal 1358 and the signal input terminal 1302*e*. By way of example, the push-pull generator 602*g*, as illustrated in FIG. 13B, may include or be formed from two cascaded inverters (first inverter MP1, MN1 and second inverter MP2, MN2), e.g. CMOS inverters. The push-pull generator 602*g* can provide two push-pulled (i.e. complementary) signals "abuf" and "xabuf" on the basis of a signal coupled in at the signal input terminal 1302*e* (e.g. basic control signal). By way of example, the push-pull generator 602*g* can be configured to invert the basic control signal by means of the first inverter MP1, MN1 (for example including two transistors MP1, MN1 in CMOS configuration) and to provide the inverted control signal xabuf. In addition, the push-pull generator 602*g* can be configured to invert the inverted control signal xabuf by means of the second inverter MP2, MN2 (for example including two transistors MP2, MN2 in CMOS configuration) and to provide the additional inverted control signal abuf.

Furthermore, the level shifter 1300*b* (e.g. the first level shifter 1302) may include a cross-coupled latch 1364 (e.g. including transistor pair MP3, MN3 in CMOS configuration and transistor pair MP4, MN4 in CMOS configuration) and an inverter structure 1366 (also referred to as output inverter). The inverter structure 1366 may include two switches 1366*s*, which differ in their conduction type (e.g. two transistors MP5 and MN5 in CMOS configuration).

By way of example, the level shifter 1300*b* may include a plurality of transistors of the n-channel conduction type (MN1 to MN5) and a plurality of transistors of the p-channel conduction type (MP1 to MP5). By way of example, the transistors MP3, MP4, MN3, MN4 of the cross-coupled latch 1364 and the transistors MP5, MN5 of the inverter structure 1366 can be high-voltage transistors. Alternatively or additionally, the transistors MN1, MN2, MP1, MP2 of the push-pull generator 602*g* can be low-voltage transistors.

Figure 14A:
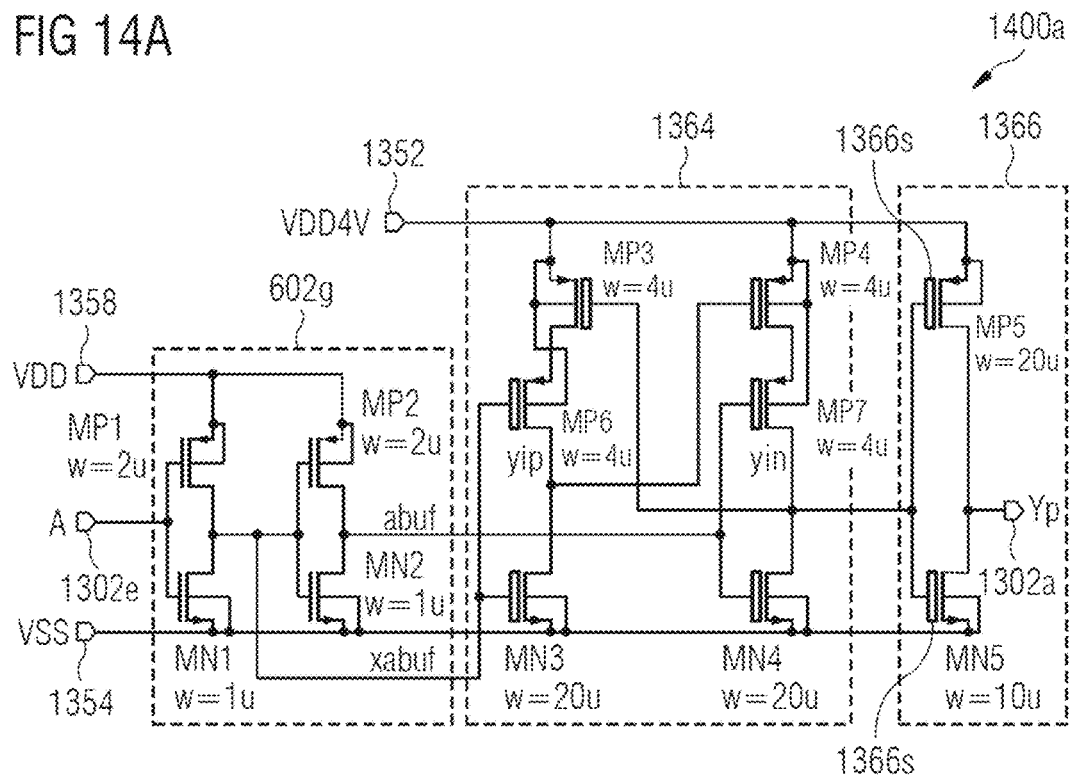

FIG. 14A illustrates a level shifter 1400a, e.g. the first level shifter, in accordance with various embodiments in a schematic circuit diagram.

The cross-coupled latch 1364 of the level shifter 1400a may include for example three series-interconnected transistors (with additional transistors MP6 and MP7) between the first terminal 1352 and the second terminal 1354, which improves the switchover speed of the latch (e.g. reduces switching delays) and/or reduces the current consumption in the switchover process of the latch.

Optionally, a greater electrical supply voltage (for example in a range of approximately 2 volts to approximately 2.7 volts) and/or a greater electrical reference voltage (for example in a range of approximately 4 volts to approximately 6 volts, e.g. approximately 4 volts) can be made possible.

By way of example, the transistors MP3, MP4, MP6, MP7, MN3, MN4 of the cross-coupled latch 1364 and the transistors MP5, MN5 of the inverter structure 1366 can be high-voltage transistors. Alternatively or additionally, the transistors MN1, MN2, MP1, MP2 of the push-pull generator 602g can be low-voltage transistors.

Figure 14B:
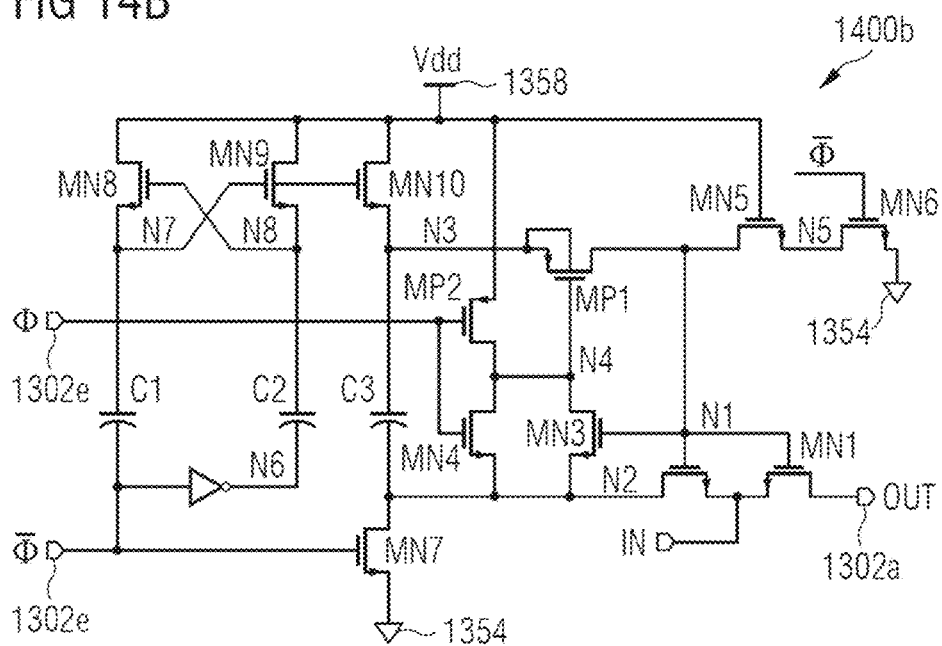

FIG. 14B illustrates a level shifter 1400b, e.g. the first level shifter, in accordance with various embodiments in a schematic circuit diagram.

The level shifter 1400b may include n-channel (e.g. NMOS) transistors MN1 to MN10 and p-channel (e.g. PMOS) transistors MP1 and MP2.

Figure 15:
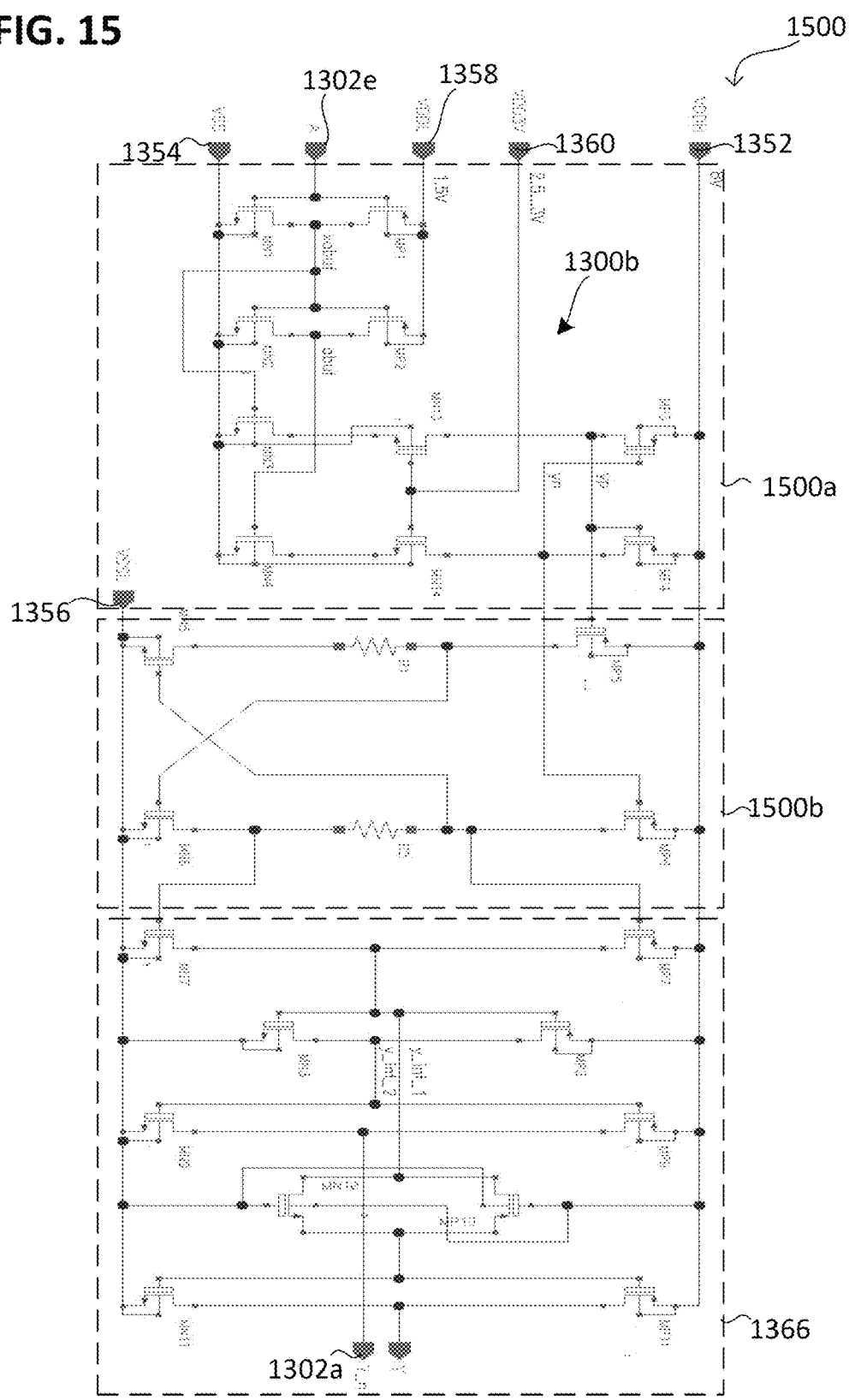

FIG. 15 illustrates a level shifter 1500, e.g. the first level shifter, in accordance with various embodiments in a schematic circuit diagram.

The level shifter 1500 may include a first level shifter stage 1500a and a second level shifter stage 1500b (including resistors R1, R2), which are coupled to one another. Furthermore, the level shifter 1500 may include an inverter structure 1366 (including an output inverter MP11, MN11), which includes a plurality of inverters interconnected in series, for the purpose of reducing a phase difference of the two complementary signals Y and Y_n.

Furthermore, the level shifter 1500 may include an additional terminal 1360 (also referred to as supporting voltage terminal 1360). An electrical supporting voltage (for example in a range of approximately 2.5 volts to approximately 3 volts) can be present between the additional terminal 1360 and the second terminal 1354, said voltage being less than the electrical reference voltage, e.g. less than 50% of the electrical reference voltage, and/or greater than the electrical supply voltage. The electrical reference voltage can be for example more than 6 volts, e.g. approximately 8 V.

The electrical supporting voltage can be provided by means of a charge pump in accordance with various embodiments.

Furthermore, the level shifter 1500 may include an additional reference terminal 1356 (also referred to as VSSL terminal or second high-voltage terminal 1356 or negative high-voltage terminal 1356), to which an additional electrical reference voltage can be applied (e.g. a negative electrical reference voltage, e.g. a negative electrical high voltage, for example −3.3 volts or more).

The output 1304a of the output inverter 1366 may include two complementary terminals Y, Y_n, of which a first terminal Y is configured for coupling out the input signal A in accordance with the electrical reference voltage (e.g. a positive electrical reference voltage) and a second terminal Y_n is configured for coupling out the input signal A in accordance with the additional electrical reference voltage (e.g. a negative electrical reference voltage).

The level shifter 1500 may include n-channel (e.g. NMOS) transistors MN1 to MN14 and p-channel (e.g. PMOS) transistors MP1 and MP11.

Figure 16A:
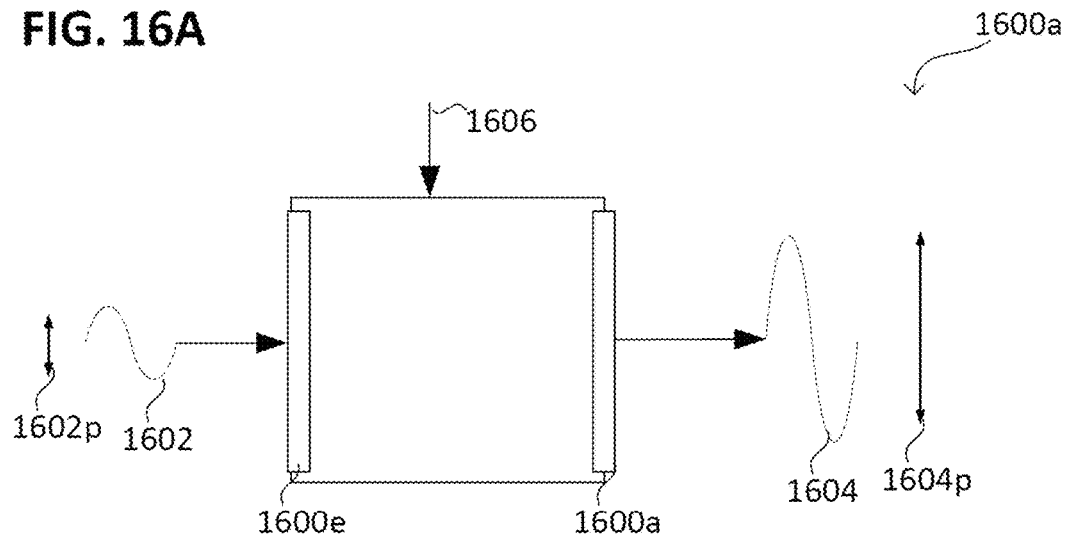

FIG. 16A illustrates a level shifter 1600a, e.g. the first level shifter 1302 and/or the second level shifter 1304, in accordance with various embodiments in a schematic circuit diagram.

The level shifter 1600 may include an input 1600e (e.g. input 1304e or input 1302e) and an output 1600a (e.g. output 1304a or output 1302a). The level shifter 1600 can be configured to convert a first signal 1602 coupled in at the input 1600e into a second signal 1604 and to couple it out at the output 1602a. Illustratively, the level shifter 1600a can be configured to map the signal profile of the first signal 1602 from a first electrical voltage range into a second electrical voltage range, which is different from said first electrical voltage range. The second signal 1604 (also referred to as level shifter signal 1604) can have a greater level 1604p (signal level, also referred to as output level) than the first signal 1602p, e.g. a level in accordance with an electrical potential present at a high-voltage terminal 1606 (e.g. first high-voltage terminal 1352 or second high-voltage terminal 1354) of the level shifter 1600a.

A level can be understood as a measure representing a relative position of a signal with respect to an electrical reference potential, e.g. its peak-to-valley value, peak value, mean value over time, or amplitude. By way of example, the second signal 1604 can have a mean value over time in accordance with the electrical potential present at a high-voltage terminal 1606, a peak-to-valley value in accordance with the electrical potential present at a high-voltage terminal 1606 and/or a peak value in accordance with the electrical potential present at a high-voltage terminal 1606.

In accordance with various embodiments, the first signal 1602 and the second signal 1604 can correspond in a signal characteristic, e.g. in at least one frequency, a spectrum, a signal profile, a signal waveform, or the like.

Figure 16B:
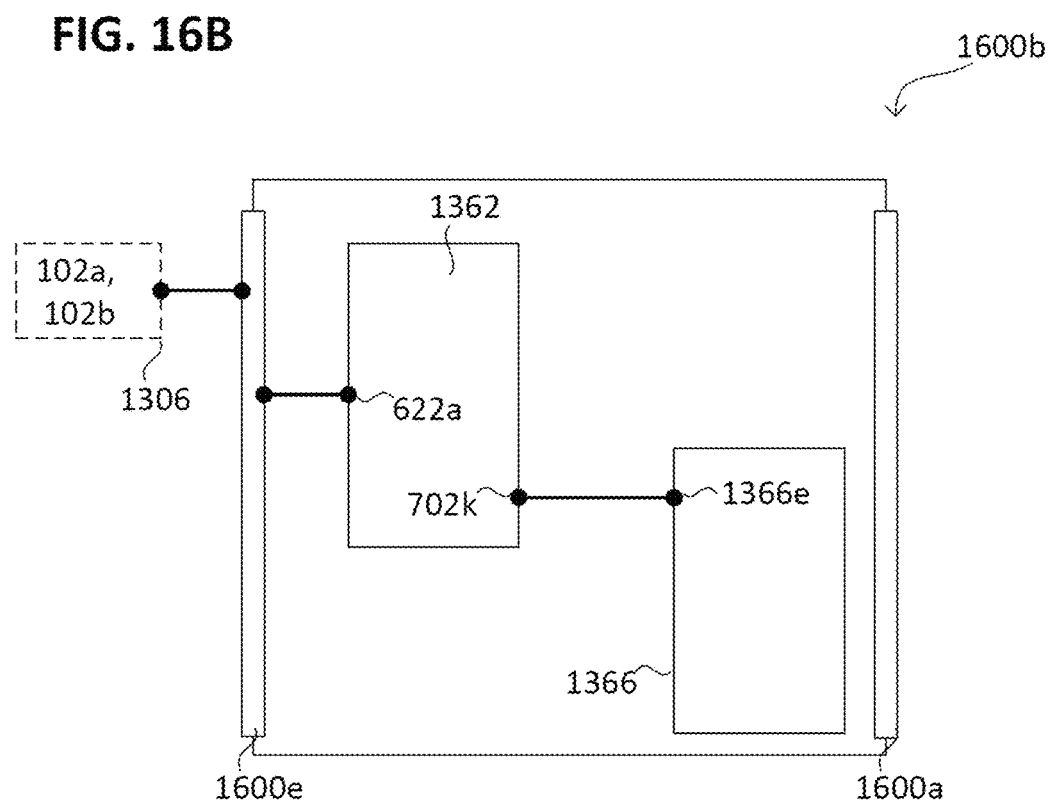

FIG. 16B illustrates a level shifter 1600b, e.g. a first level shifter 1302 and/or a second level shifter 1304, in accordance with various embodiments in a schematic circuit diagram.

The level shifter 1600b may include a charge pump 1362, e.g. a Pelliconi charge pump. In the case of the second level shifter 1304, the capacitive coupling 1306 can provide the charge storage 102a, 102b of the charge pump 1362.

Furthermore, the level shifter 1600b may include an inverter structure 1366. The inverter structure 1366 can be connected between the input 1600e of the level shifter 1600b and the output 1600a of the level shifter 1600b.

The charge pump 1362 can be configured to provide an electrical voltage difference for switching the inverter structure 1366 (electrical inverter switching voltage). In other words, a charge storage node 702k of the charge pump 1362 (or the charge pump stage thereof) can be coupled to a control input 1366e of the inverter structure 1366, e.g. to a gate of the transistors of the inverter structure 1366. By way of example, the charge pump 1362, or the charge pump stage thereof, can be coupled by its clock input 622a or charge storage node to the input 1600e of the level shifter 1600b. The switching of the inverter structure 1366 can thus take place in accordance with a clock of the charge pump 1362 (i.e. in accordance with the charge transfer cycle). The voltage switch Vp provided by the charge pump 1362 can correspond to the peak-to-valley value of the control signal coupled into the inverter structure 1366.

The charge pump 1362, or the charge pump stage thereof, may include a latch, i.e. two inverters (e.g. CMOS inverters), cross-coupled to one another, e.g. a latch in a Pelliconi configuration.

Figure 17A:
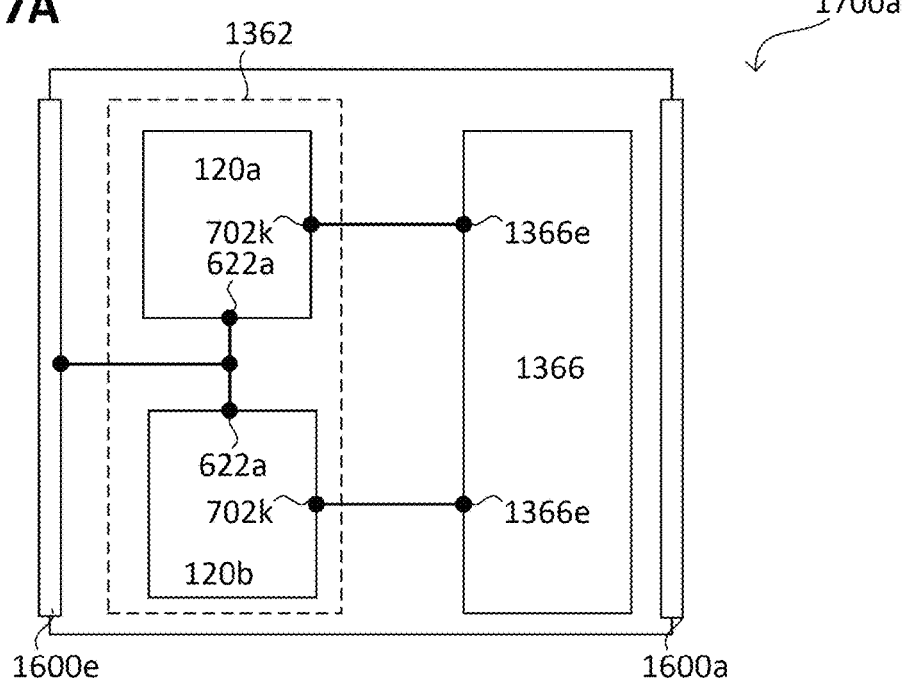

FIG. 17A illustrates a level shifter 1700a, e.g. the first level shifter 1302 and/or the second level shifter 1304, in accordance with various embodiments in a schematic circuit diagram.

The charge pump 1362 may include two partial stages 120a, 120b (first partial stage 120a and second partial stage 120b), which are interconnected in parallel with one another. The two partial stages 120a, 120b can be connected between the inverter structure 1366 and the input 1600e. The switching of the inverter structure 1366 can thus be carried out in accordance with a clock of the first partial stage 120a and the second partial stage 120b. By way of example, the first partial stage 120a and the second partial stage 120b can be configured in a push-pull fashion with respect to one another (also referred to as complementary partial stages 120a, 120b).

Figure 17B:
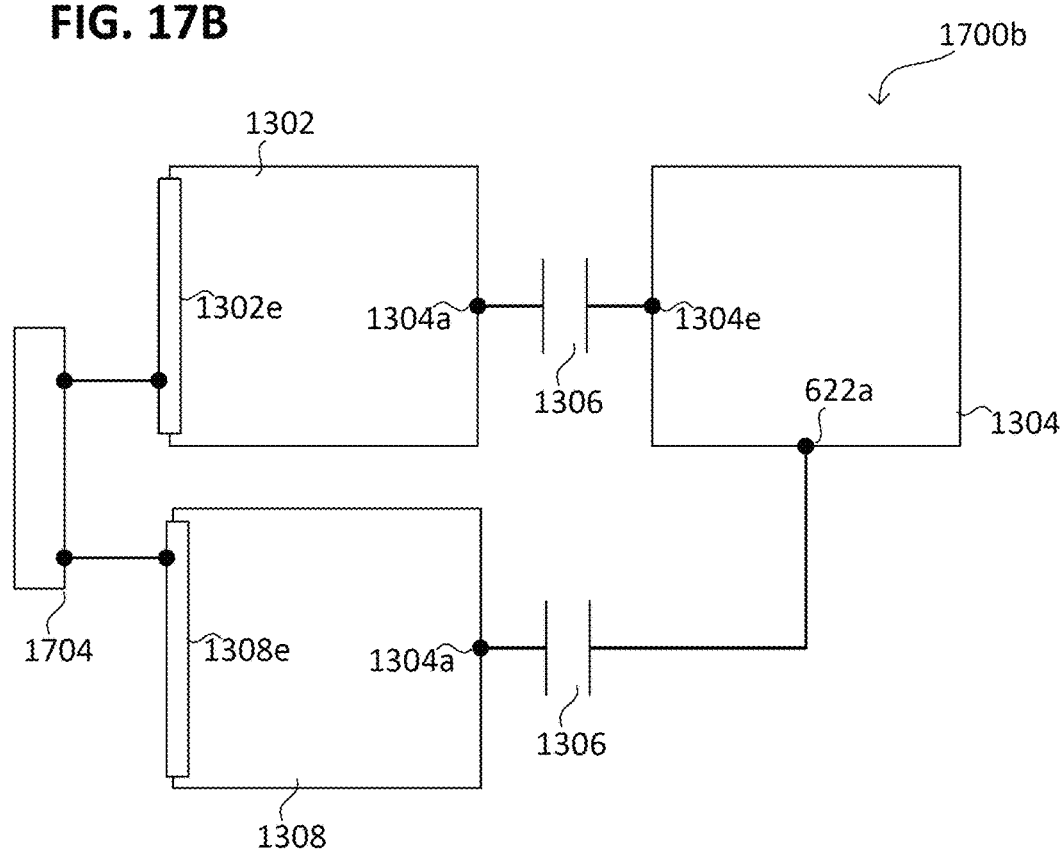
FIGS. 17B, 18, 19A, 19B and 20 respectively show a level shifter circuit in accordance with various embodiments in a schematic circuit diagram.

FIG. 17B illustrates a level shifter circuit 1700b in accordance with various embodiments in a schematic circuit diagram.

The level shifter circuit 1700b may include an additional signal source 1308 (e.g. a third level shifter 1302 and/or an additional push-pull generator 1302) and the second level shifter 1304.

In accordance with various embodiments, the additional signal source 1308 may include or be formed from the third level shifter 1308 (i.e. be configured for providing one or a plurality of level shifter signals, e.g. level-shifted data signals). The additional signal source 1308 for example need not necessarily be configured for providing two complementary signals.

In one or more embodiments, the additional signal source 1308 may include or be formed from a push-pull generator (i.e. be configured for providing two complementary signals). The additional signal source 1308 for example need not necessarily be configured for providing a level shifter signal (e.g. level-shifted data signals).

In one or more alternative embodiments, the additional signal source 1308 may include the push-pull generator and the third level shifter (i.e. be configured for providing two complementary level shifter signals, e.g. complementary level-shifted data signals).

The additional signal source 1308 (e.g. the third level shifter 1308), on the output side, can be capacitively coupled to a clock input 622a of the second level shifter 1304, e.g. to the clock input 622a of the second charge pump of the second level shifter 1304. The signal source 1302 (e.g. the first level shifter 1302) can couple a periodic signal (e.g. a level shifter signal), for example, into the second level shifter 1304.

The additional signal source 1308 (e.g. the third level shifter 1308) can be coupled on the input side 1308e (i.e. by its input 1308e) to the input 1302e (e.g. data input 1302e) of the first level shifters 1302, e.g. by means of a common terminal 1704 or connecting terminal 1704. The additional signal source 1308 (e.g. the third level shifter 1308) can be configured for providing a third signal (e.g. a third level shifter signal), which is capacitively coupled into the second level shifter 1304. The additional signal source 1308 (e.g. the third level shifter 1308) can couple for example one aperiodic signal (e.g. one data signal) and/or two complementary aperiodic signals (e.g. data signals) into the second level shifter 1304.

The second level shifter signal can have a greater level (signal level) than the third level shifter signal (and/or the two additional push-pull signals). By way of example, the second level shifter signal can have a greater amplitude than the third level shifter signal (and/or the two additional push-pull signals), a greater mean value over time than the third level shifter signal (and/or the two additional push-pull signals), a greater peak-to-valley value than the third level shifter signal and/or a greater peak value than the third level shifter signal (and/or the two additional push-pull signals).

In accordance with various embodiments, the third level shifter signal (and/or the two additional push-pull signals) and the second signal can correspond in a signal characteristic, e.g. in at least one frequency, a spectrum, or the like.

Reference is made hereinafter to the third level shifter 1308 and the third level shifter signal generated by it. The additional push-pull generator 1308 can be configured analogously too. By way of example, the third level shifter signal may include two complementary level shifter signals, that is to say that a third level shifter signal and a third level shifter signal complementary thereto can be generated. Alternatively, a non-level-shifted additional push-pull signal can be generated instead of the third level shifter signal.

Figure 18:
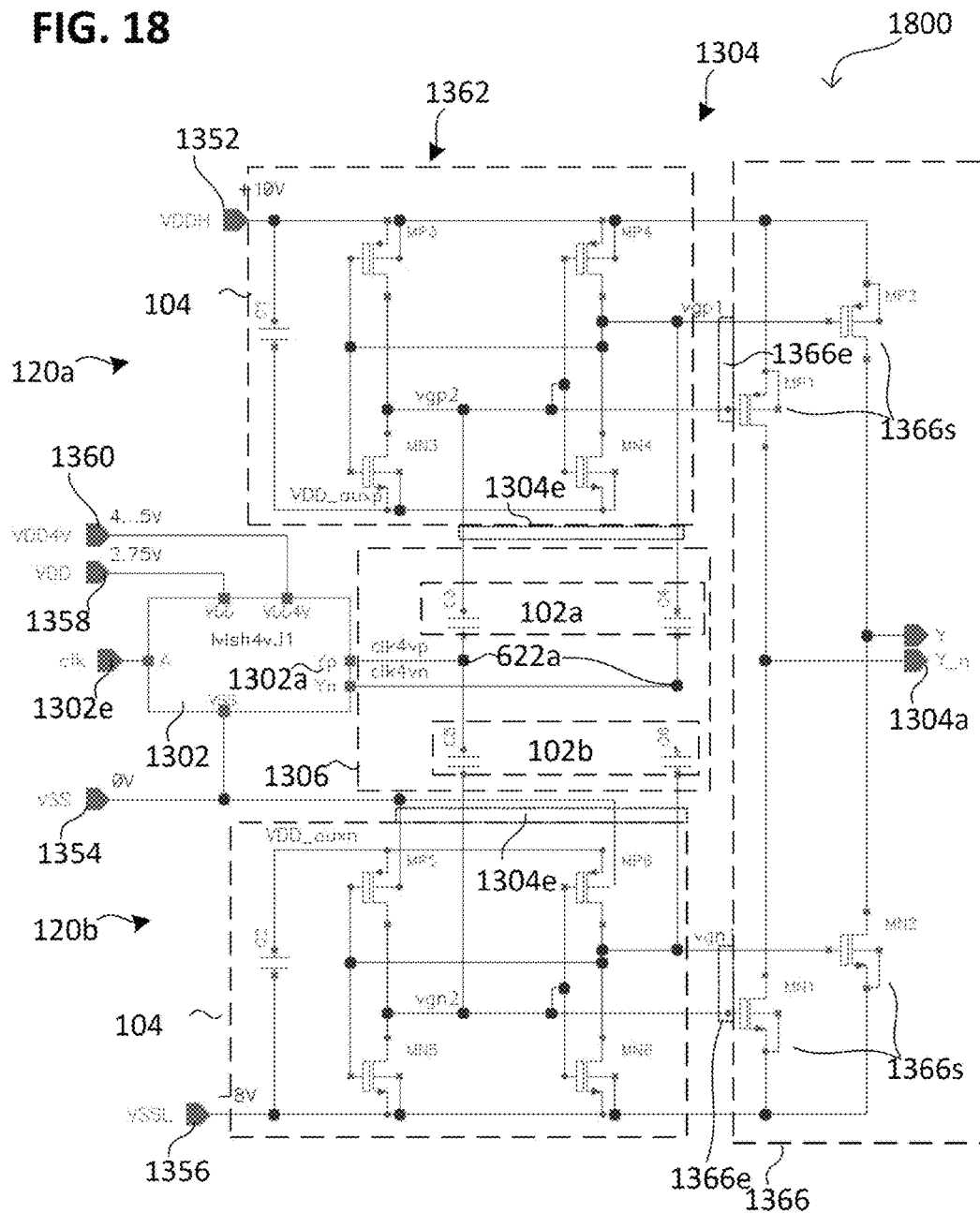

FIG. 18 illustrates a level shifter circuit 1800 in accordance with various embodiments in a schematic circuit diagram.

The level shifter circuit 1800 may include a level shifter 1302 (also referred to as first level shifter 1302) and an inverter structure 1366. The inverter structure 1366 may include or be formed from two complementary inverters (e.g. CMOS inverters), e.g. a first inverter MP1, MN1 and a second inverter MP2, MN2.

The output 1302a of the first level shifter 1302 may include two complementary terminals Yp, Yn, of which a first terminal Yp can be configured for providing a first level shifter signal clk4vp (e.g. a positive level shifter signal) and an additional first terminal Yn can be configured for providing an additional first level shifter signal clk4vn (e.g. a negative level shifter signal). By way of example, the first level shifter 1302 may include or be formed from a push-pull generator 602g.

Furthermore, the level shifter circuit 1800 may include a charge pump 1362, the charge storage 102a, 102b of which is connected between its switch structure 104 (e.g. including or formed from a first latch MN5, MP5, Mp6, MN6 and/or a second latch MN3, MP3, MP4, MN4) and the first level shifter 1302. The charge pump 1362 may include two (e.g. complementary) partial stages 120a, 120b interconnected in parallel, of which a first partial stage 120a can be coupled on the input side 622a to the first terminal Yp of the output 1302a and/or a second partial stage 120b can be coupled on the input side 622a to the additional first terminal Yn of the output 1302a.

The charge storage 102a of the first partial stage 120a and/or the charge storage 102b of the second partial stage 120b can be part of the capacitive coupling 1306. Illustratively, the switch structure 104 of the first partial stage 120a and/or of the second partial stage 120b together with the inverter structure 1366 can be part of the second level shifter 1304. The second level shifter 1304 can be capacitively 1306 coupled, on the input side 1304e, to the output 1302a of the first level shifter 1302.

The output 1304a of the second level shifter 1304 (or of the inverter structure 1366) may include two complementary terminals Y, Y_n, of which a second terminal Y can be configured for providing a second level shifter signal (e.g. a positive level shifter signal) and an additional second terminal Y_n can be configured for providing an additional second level shifter signal (e.g. a negative level shifter signal).

An electrical DC voltage VDD for the supply (i.e. a supply voltage) of the first level shifter 1302 can be applied to the supply voltage terminal 1358. The electrical supply voltage VDD can be for example the electrical core voltage, e.g. 2.75 volts or less.

The level shifter circuit 1800 can be configured for converting an input signal clk, present at the input 1302e of the first level shifter 1302, into a second level shifter signal, which has a first electrical voltage of the first high-voltage terminal 1352. The first electrical voltage at the first high-voltage terminal 1352 can be greater (according to the absolute value) than the electrical supply voltage, e.g. approximately 10 volts or more. Alternatively or additionally, the level shifter circuit 1800 can be configured for converting the input signal clk, present at the input 1302e of the first level shifter 1302, into an additional second level shifter signal, which has a second electrical voltage of the second high-voltage terminal 1356. The second electrical voltage at the second high-voltage terminal 1356 can be greater (according to the absolute value) than the electrical supply voltage; by way of example, the absolute value of the second electrical voltage can be approximately 8 volts or more. By way of example, the second electrical voltage at the second high-voltage terminal 1356 (taking into account the sign) can be negative and/or less than the electrical supply voltage; by way of example, the second electrical voltage can be approximately −8 volts or less (i.e. more negative).

The first inverter MP1, MN1 of the inverter structure 1366, which first inverter provides the additional second high-voltage terminal Y_n, may include two switches 1366s (e.g. transistors MP1, MP2), which differ in their conduction type. A second inverter MP2, MN2 of the inverter structure 1366, which second inverter provides the second high-voltage terminal Y, may include two switches 1366s (e.g. transistors MP1, MN1), which differ in their conduction type. The first inverter MP1, MN1 can couple out the second level shifter signal and the second inverter MP2, MN2 can couple out the additional second level shifter signal.

The switches MP1, MP2 of the inverter structure 1366 which have a first conduction type (e.g. PMOS switches MP1, MP2) can be controlled by means of the switch structure 104 of the first partial stage 120a (also referred to as first latch).

The first partial stage 120a or the first latch may include or be formed from a Pelliconi charge pump or Pelliconi charge pump stage. In other words, the switch structure 104 of the first partial stage 120a may include two cross-coupled inverters, of which a first inverter MP3, MN3 controls a first transistor MP1 of the first charge type, and of which a second inverter MP4, MN4 controls an additional first transistor MP2 of the first charge type. The first partial stage 120a can be pumped by the first signals clk4*vp* and clk4*vn* (the first level shifter signal clk4*vp* and the additional first level shifter signal clk4*vn*), e.g. by means of the first charge storage 102a of the capacitive coupling 1306 (also referred to as coupling capacitors C3, C4).

The first partial stage 120a can be configured for providing a first electrical supporting voltage VDD_auxp (e.g. a positive electrical supporting voltage VDD_auxp), which can optionally be capacitively coupled to the second high-voltage terminal 1352 on the output side, e.g. by means of a capacitor C1 (alternatively by means of a transistor, or the gate-source capacitance thereof) for stabilizing (i.e. buffering) the first electrical supporting voltage VDD_auxp, also referred to as buffer coupling C1.

The first partial stage 120a may include two charge transfer nodes vgp1, vgp2 (also referred to as clock nodes), which can control the transistors MP1, MP2 of the inverter structure 1366 which have the first conduction type (e.g. PMOS transistors MP1, MP2), e.g. the gates thereof. The two charge transfer nodes vgp1, vgp2 can have a smaller electrical voltage swing (i.e. a peak-to-valley value) than the output 1302a of the first level shifter 1302, e.g. smaller than the first signals clk4*vp* and clk4*vn*, e.g. less than or equal to approximately 80% of the output 1302a. If the first signals clk4*vp* and clk4*vn* have an electrical voltage swing of approximately 5 volts (e.g. between 0 volts and 5 volts), the electrical voltage swing Vp of the two charge transfer nodes vgp1, vgp2 can be approximately 4 volts (e.g. between VDDH and VDD_auxp). In other words, the electrical supporting voltage VDD_auxp can be approximately VDDH-Vp, e.g. approximately VDDH-4 volts.

On account of the strong coupling by means of the capacitors C3, C4, the electrical voltage of the charge transfer nodes vgp1, vgp2 drops and changes simultaneously with respect to the output 1302a of the first level shifter 1302, e.g. simultaneously with respect to the first signals clk4*vp* and clk4*vn*. In other words, a loss of speed in the switching process can be virtually zero.

The (e.g. complementary to the first partial stage 120a) second partial stage 120b (also referred to as second latch) can be configured for controlling the transistors MN1, MN2 of the inverter structure 1366 which have a second conduction type (e.g. NMOS transistors MN1, MN2). The switch structure 104 of the second partial stage 120b may include two inverters, of which a first inverter MP5, MN5 controls a second switch MN1 of the second charge type, and of which a second inverter MP6, MN6 controls an additional second switch MN2 of the second charge type. The second partial stage 120b can be pumped by the first signals clk4*vp* and clk4*vn* (the first level shifter signal clk4*vp* and the additional first level shifter signal clk4*vn*), e.g. by means of the second charge storage 102b of the capacitive coupling 1306 (also referred to as coupling capacitors C5, C6).

The second partial stage 120b can be configured for providing a second electrical supporting voltage VDD_auxn (e.g. a negative electrical supporting voltage VDD_auxn), which can optionally be capacitively coupled, on the output side, to the first high-voltage terminal 1356, e.g. by means of a capacitor C2 (alternatively by means of a transistor, or the gate-source capacitance thereof) for stabilizing (i.e. buffering, also referred to as buffer coupling) the second electrical supporting voltage VDD_auxn, also referred to as buffer coupling C2.

The second partial stage 120b may include two charge transfer nodes vgn1, vgn2, which can control the transistors MN1, MN2 of the inverter structure 1366 which have the second conduction type (e.g. NMOS transistors MN1, MN2), e.g. the gates thereof. The two charge transfer nodes vgn1, vgn2 can have a smaller electrical voltage swing (i.e. a peak-to-valley value) than the output 1302a of the first level shifter 1302, e.g. smaller than the first signals clk4*vp* and clk4*vn*, e.g. less than or equal to approximately 80% of the output 1302a. If the first signals clk4*vp* and clk4*vn* have an electrical voltage swing of approximately 5 volts (e.g. between 0 volts and −5 volts), the electrical voltage swing Vp of the two charge transfer nodes vgp1, vgp2 can be approximately 4 volts (e.g. between VSSL and VDD_auxn).

In other words, the electrical supporting voltage VDD_auxn can be approximately VSSL+Vp, for example approximately VSSL+4 volts.

If the two switches MP1, MN1 of the first inverter and/or the two switches MP2, MN2 of the second inverter have a switching threshold of approximately 1 volt, the power loss of the electric shunt current can thus be in an acceptable range. To put it another way, the power loss of the electric shunt current would be more than 20 times greater if the switches of the inverter structure 1366 were controlled with an electrical voltage swing corresponding to the electrical voltage difference between the first high-voltage terminal 1352 and the second high-voltage terminal 1356 (as in the case of level shifter 1500, for example). In other words, an electrical voltage for switching the inverter structure (electrical switching voltage) can be smaller (e.g. according to the absolute value) than VDDH, VSSL and/or the difference thereof.

The first (e.g. complementary) signals clk4vp and clk4vn can be provided by means of the first level shifter 1302. The first level shifter 1302 can be configured for converting the input signal from VDD=2.7 volts into VDD4V=5 volts. The first level shifter 1302 may include a different circuit architecture than the second level shifter, e.g. one of the circuit architectures described herein.

The electrical supporting voltage VDD4V at the supporting voltage terminal 1360 may be optional, e.g. if fast switching of the inverter structure 1366 is necessary. Illustratively, an electrical supply voltage of VDD=2.7 volts, which attains only 80% of the effective electrical voltage swing at the gates of the inverter structure 1366, may bring about slower switching than with an electrical voltage swing corresponding to the electrical supporting voltage VDD4V. The electrical supporting voltage VDD4V can be generated by means of a voltage doubler (not illustrated), e.g. by means of an individual charge pump stage, or more generally by means of an amplifier which converts VDD into VDD4V, e.g. in an unregulated manner.

The circuit architecture of the level shifter circuit 1800 may illustratively be sufficient for high-voltage switches including a thin gate (core oxide), with an extended drain (termed "high voltage drain extended").

In accordance with various embodiments, the electrical voltage for switching the inverter structure 1366 can be generated by means of the two partial stages 120a, 120b, which correspond in their circuit architecture, or more generally in their charge pump type (e.g. Pelliconi or Dickson). A static electrical voltage supply for regulating the electrical voltage can thus be dispensed with.

Furthermore, by means of the level shifter circuit 1800, it is possible to achieve a sufficiently good power supply rejection ratio (PSRR for short) for the electrical voltage difference for switching the inverter structure 1366 (also referred to as gate control signal). The VDDH and/or VSSL can be generated for example on the chip itself, e.g. by means of a respective on-chip charge pump. VDDH and/or VSSL can have a ripple of 1 volt or more, e.g. with a changing load. The PSRR depends on the ratio of the capacitances of the buffer coupling C1, C2 and the coupling capacitors C3 to C6.

The input signal of the level shifter circuit 1800 (which is coupled in at the input 1302e of the first level shifter 1302) can be a periodic signal (e.g. a clock signal), i.e. e.g. have a temporally invariable frequency. In the case of an aperiodic signal profile of the input signal, the operating point of the level shifter circuit 1800 can drift, e.g. if long switching cycles (e.g. without a switching process) result therefrom.

The level shifter circuit 1800 or one of the level shifter circuits described above can be implemented in a read-out circuit (e.g. in an application-specific integrated circuit). The read-out circuit can be integrated together with a sensor (e.g. a sound sensor, such as a MEMS microphone) into a chip (integrated circuit) or a chip module (circuit module) or form these. By way of example, the level shifter circuit 1800, on the output side 1304a, can be coupled into a chopper, e.g. for the purpose of switching the chopper, as described in even greater detail below. What can thus be achieved is that a predefined signal-to-noise ratio can be obtained (illustratively maximized). Illustratively, the switches of the chopper may require the most accurate temporal fit possible with which they are switched, in order that the ripple (switching pulses) brought about by the switching at the input of the read-out circuit turns out to be as low as possible.

Illustratively, a level shifter circuit 1800 can use the capacitive coupling 1306 between the first level shifter 1302 and the second level shifter 1304 for transmitting at least one control signal (i.e. one control signal or a plurality of control signals) to the inverter structure 1366 of the second level shifter 1304, e.g. the gates thereof. The peak-to-valley value (e.g. the amplitude) of the at least one control signal at the gates of the inverter structure 1366 need not necessarily have a large value. Therefore, the peak-to-valley value of the at least one control signal can be reduced, which increases the speed of the switching of the inverter structure 1366 of the second level shifter 1304, e.g. already on account of general limitations of the rate of rise (i.e. of the temporal gradient) of the at least one control signal. Alternatively or additionally, an overlap of two or more control signals can thereby be reduced, which saves electrical power, e.g. at the switches of the inverter structure 1366. The electrical supporting voltage VDD_auxp, VDD_auxn provided by the first latch and/or second latch can make it possible to control the inverter structure 1366, e.g. the gates thereof, with the required peak-to-valley value and thus improve the PSSR.

Figure 19A:
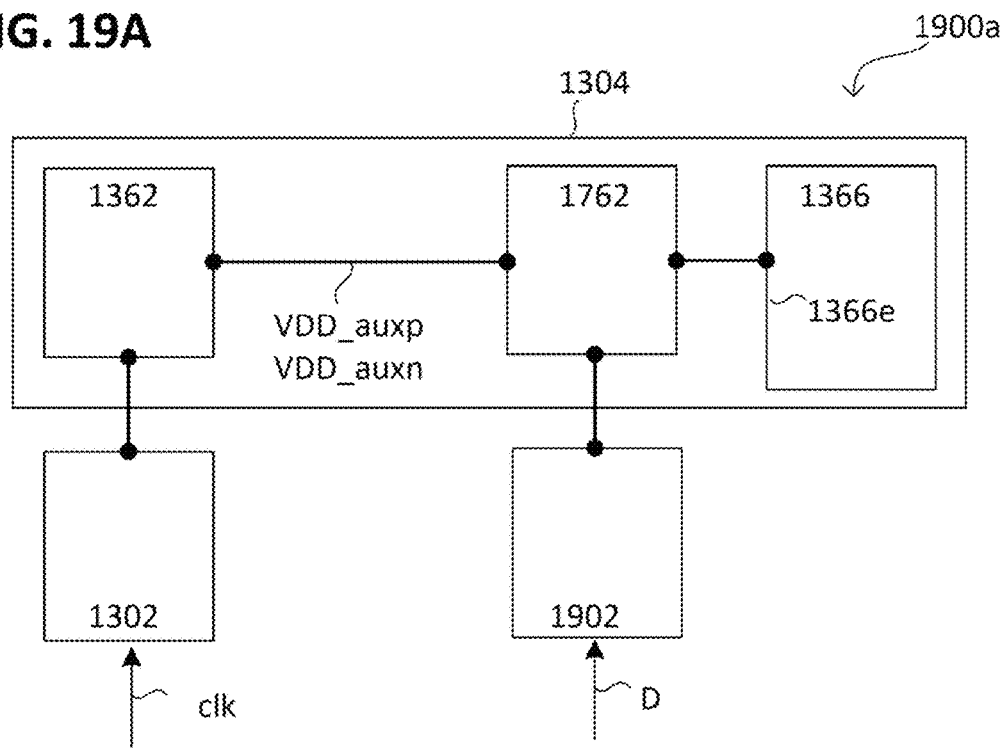

FIG. 19A illustrates a level shifter circuit 1900a in accordance with various embodiments in a schematic circuit diagram. The level shifter circuit 1900a can substantially correspond to the level shifter circuit described above, wherein the charge pump 1362 (also referred to as first charge pump 1362) is configured for providing the first electrical supporting voltage VDD_auxp and/or the second electrical supporting voltage VDD_auxn.

The level shifter signal of the first level shifter 1302 can be coupled into the first charge pump 1362 (e.g. into the clock input thereof). A second charge pump 1762 can be connected between the first charge pump 1362 and the inverter 1366. The level shifter signal of a third level shifter 1902 can be coupled into the second charge pump 1762 (e.g. into the clock input thereof), i.e. a third (e.g. aperiodic) level shifter signal.

A clock signal, i.e. a periodic first input signal clk, e.g. a rectangular signal, can be coupled into the first level shifter 1302. An arbitrary second input signal D (also referred to as data signal D), e.g. an aperiodic or periodic input signal, can be coupled into the third level shifter 1902. The level shifter circuit 1900a can be configured for the level shifting of the second input signal D to the output level. Illustratively, drifting of the first electrical supporting voltage VDD_auxp and/or of the second electrical supporting voltage VDD_auxn can be prevented by means of the first charge pump 1362, which is connected e.g. in parallel with the second charge pump 1762.

Figure 19B:
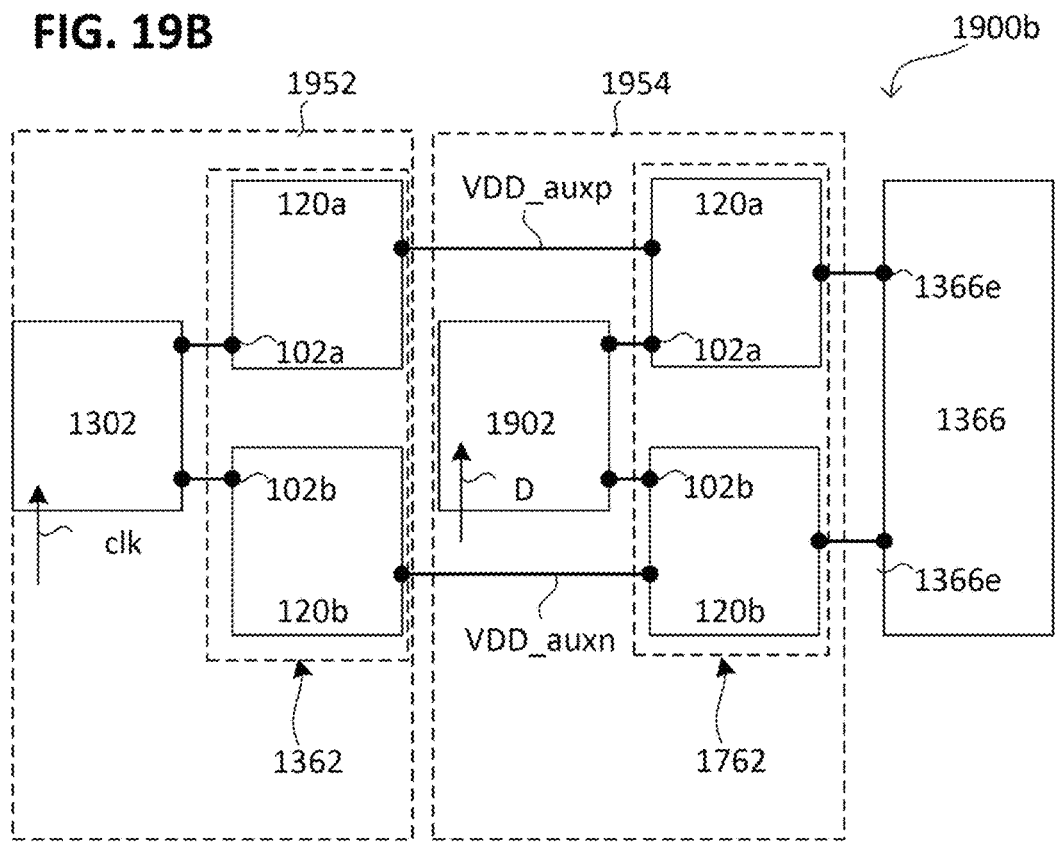

FIG. 19B illustrates a level shifter circuit 1900b, In accordance with various embodiments in a schematic circuit diagram analogously to the level shifter circuits described above, wherein the first charge pump 1362 and the second charge pump 1762 can each include two partial stages 120a, 120b.

The first charge pump 1362 and the first level shifter 1302 can also be referred to as a supporting circuit 1952. The second charge pump 1762 and the third level shifter 1302 can also be referred to as a data circuit 1954.

The data circuit 1954 can be configured for the level shifting of the second input signal D to the second level shifter signal (which can be provided and/or coupled out at the output 1304a of the second level shifter 1304). The data circuit 1954 can be configured for providing and/or obtaining the first electrical supporting voltage VDD_auxp and the second electrical supporting voltage VDD_auxn, e.g. by means of the first input signal clk coupled therein. By way of example, a first partial stage 120a of the first charge pump 1362 can be configured for providing the first electrical supporting voltage VDD_auxp. Alternatively or additionally, the second partial stage 120b of the first charge pump 1362 can be configured for providing the second electrical supporting voltage VDD_auxn.

The first electrical supporting voltage VDD_auxp can be coupled into the first partial stage 120a of the second charge pump 1762. The second electrical supporting voltage VDD_auxn can be coupled into the second partial stage 120b of the second charge pump 1762.

Figure 20:
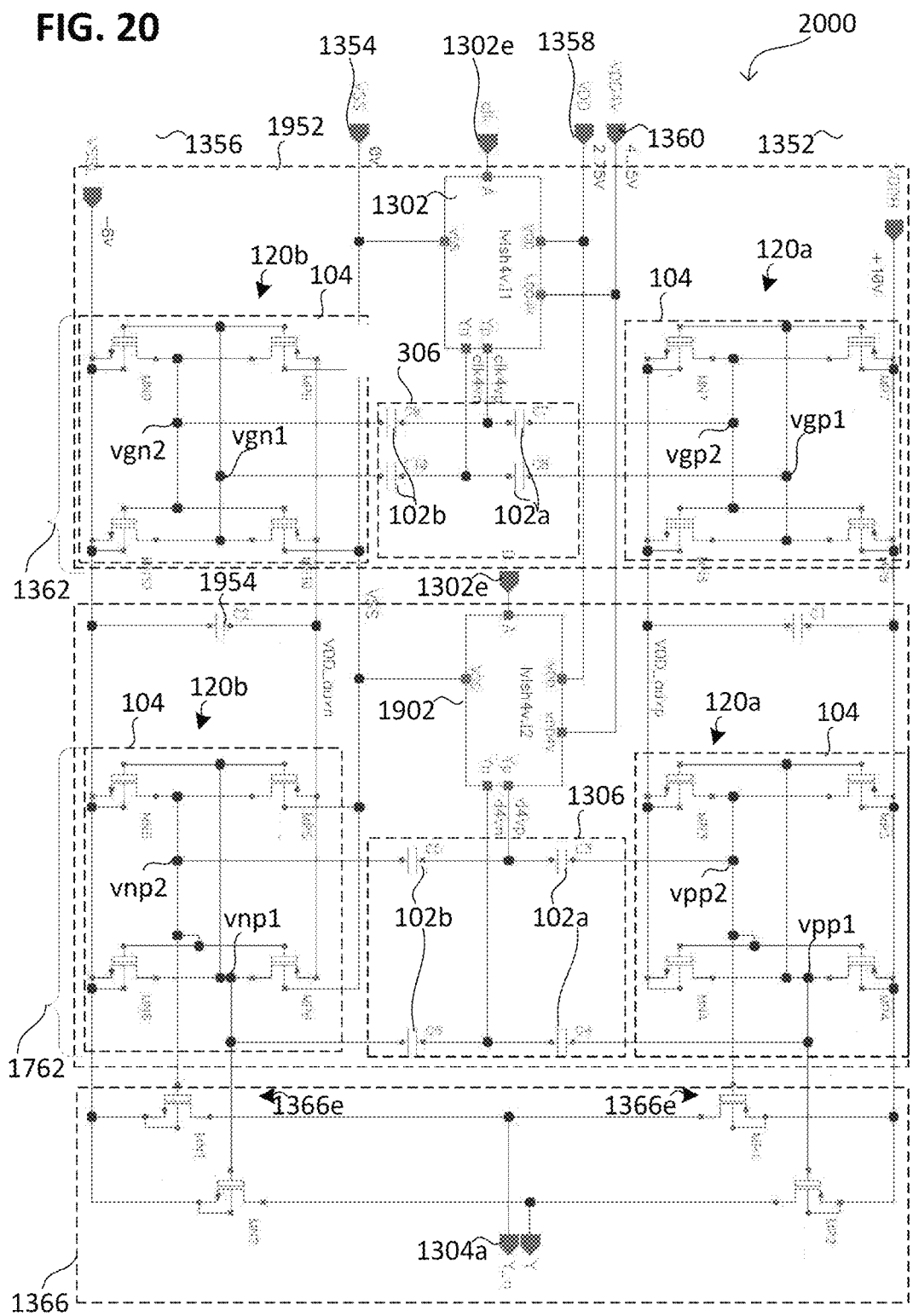

FIG. 20 illustrates a level shifter circuit 2000 in accordance with various embodiments in a schematic circuit diagram. The level shifter circuit 2000 can substantially correspond to the level shifter circuit described above.

The capacitive coupling 1306 between the first level shifter 1302 and the switch structure 104 of the first charge pump 1362 can be provided by means of the charge storage 102a, 102b of the first charge pump 1362 (e.g. including capacitors C7 to C10).

The capacitive coupling 1306 between the second level shifter 1902 and the switch structure 104 of the second charge pump 1762 can be provided by means of the charge storages 102a, 102b of the second charge pump 1762 (e.g. including capacitors C3 to C6).

The buffer coupling can be provided by means of the capacitors C1, C2.

Figure 21A:
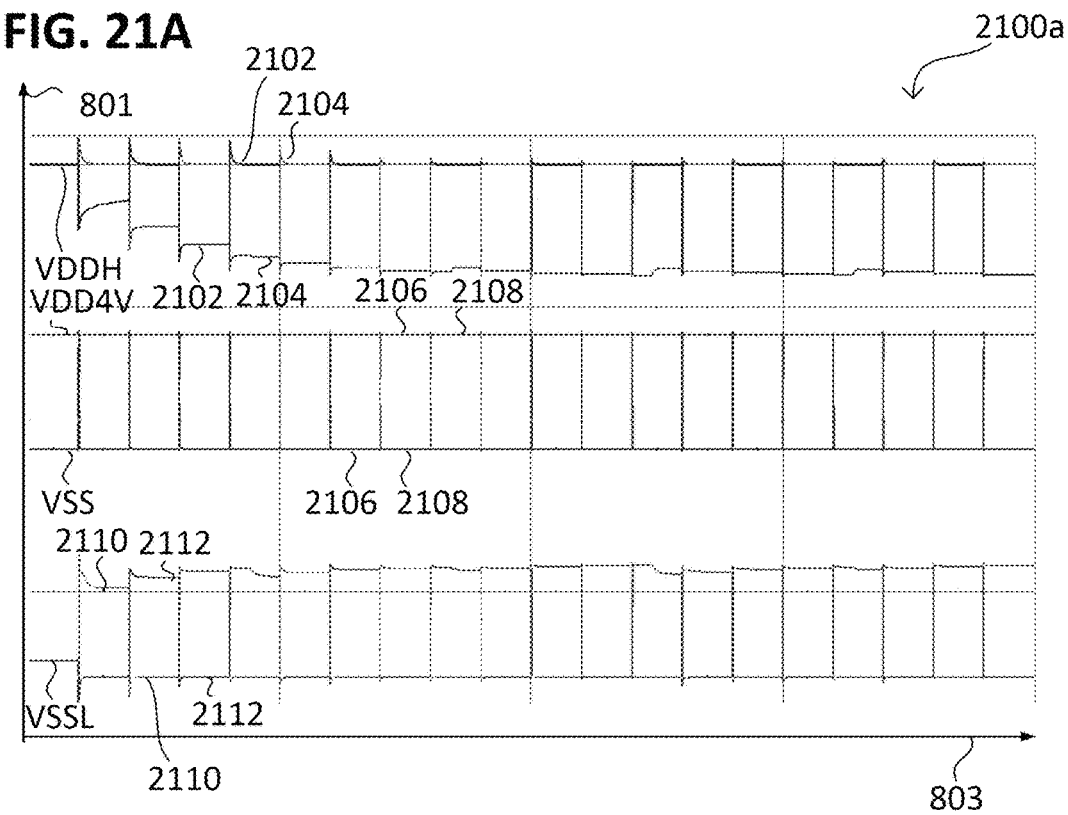
FIGS. 21A and 21B respectively show a signal profile in accordance with various embodiments in a schematic diagram.

FIG. 21A illustrates a signal profile 2100a in accordance with various embodiments in a schematic diagram illustrating a signal characteristic 801 (e.g. an electrical voltage of the signal, in arbitrary units) against time 803 (in arbitrary units), e.g. in the supporting circuit 1952.

Line 2102 represents the temporal profile of a first signal (e.g. the electrical voltage thereof or the electrical potential thereof, illustratively an inverter switching signal) at a first charge transfer node vgp1 of the first partial stage 120a of the first charge pump 1362, and line 2104 represents the temporal profile of a second signal (e.g. the electrical voltage thereof or the electrical potential thereof, illustratively an inverter switching signal) at a second charge transfer node vgp2 of the first partial stage 120a of the second charge pump 1762. The first signal and the second signal can optionally be coupled into a first input 1366e of the inverter structure 1366 (e.g. if no data circuit is required). The first signal and the second signal can be configured in a push-pull fashion with respect to one another.

Line 2106 represents the temporal profile of the first level shifter signal clk4vp and line 2108 represents the temporal profile of the additional first level shifter signal clk4vn. The first level shifter signal clk4vp and the additional first level shifter signal clk4vn can be configured in a push-pull fashion and be provided by means of the first level shifter 1302.

The first level shifter signal clk4vp can be coupled into the first charge storage 102a of the first charge pump 1362. In other words, the first level shifter signal clk4vp can be capacitively coupled into the second level shifter 1304.

The additional first level shifter signal clk4vn can be coupled into the second charge storage 102b of the first charge pump 1362. In other words, the additional first level shifter signal clk4vn can be capacitively coupled into the second level shifter 1304.

Line 2110 represents the temporal profile of a third signal (e.g. the electrical voltage thereof or the electrical potential thereof) at a first charge transfer node vgn1 of the second partial stage 120b of the first charge pump 1362, and line 2112 represents the temporal profile of a fourth signal (e.g. the electrical voltage thereof or the electrical potential thereof) at a second charge transfer node vnclk2, vgn2 of the second partial stage 120b of the first charge pump 1362. The third signal and the fourth signal can be coupled into a second input 1366e of the inverter structure 1366. The third signal and the fourth signal can be configured in a push-pull fashion.

Figure 21B:
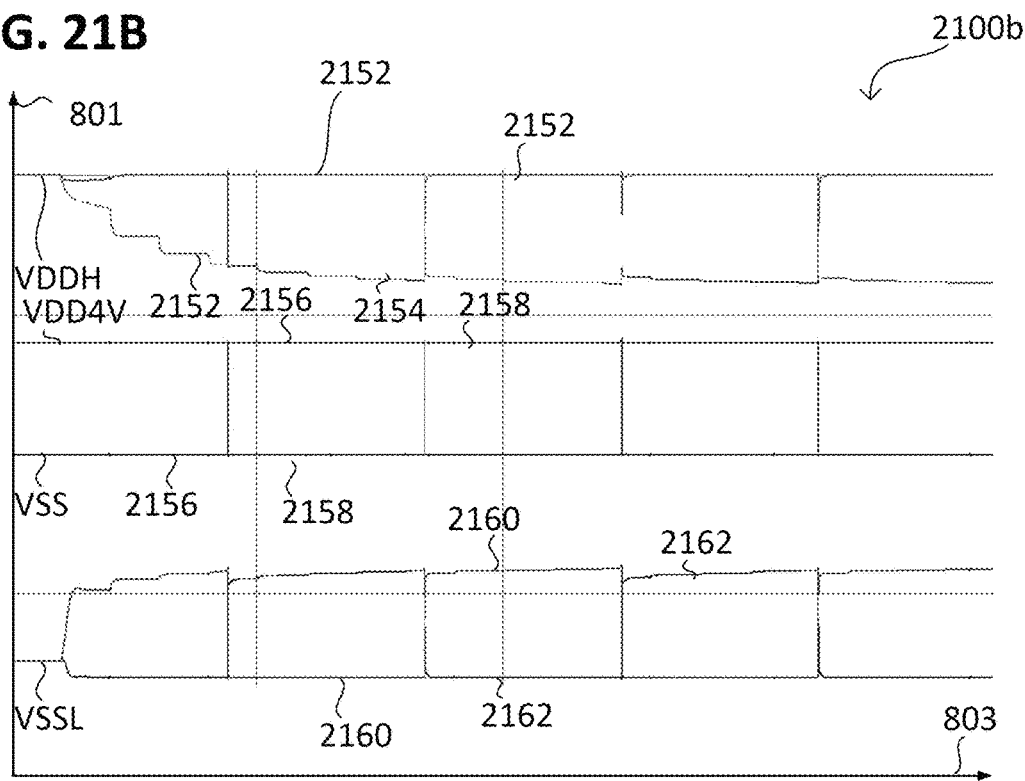

FIG. 21B illustrates a signal profile 2100b in accordance with various embodiments in a schematic diagram illustrating a signal characteristic 801 (e.g. an electrical voltage of the signal, in arbitrary units) against time 803 (in arbitrary units), e.g. in the data circuit 1954.

Line 2152 represents the temporal profile of a first signal (e.g. the electrical voltage thereof or the electrical potential thereof, illustratively an inverter switching signal) at a first charge transfer node Vpp1 of the first partial stage 120a of the second charge pump 1762, and line 2154 represents the temporal profile of a second signal (e.g. the electrical voltage thereof or the electrical potential thereof, illustratively an inverter switching signal) at a second charge transfer node Vpp2 of the first partial stage 120a of the second charge pump 1762. The first signal and the second signal can be coupled into a first input 1366e of the inverter structure 1366. The first signal and the second signal can be configured in a push-pull fashion.

Line 2156 represents the temporal profile of the third level shifter signal d4vp and line 2158 represents the temporal profile of the additional third level shifter signal d4vn. The third level shifter signal d4vp and the additional third level shifter signal d4vn can be configured in a push-pull fashion and be provided by means of the third level shifter 1902.

The third level shifter signal d4vp can be coupled into the first charge storage 102a of the second charge pump 1762. In other words, the third level shifter signal d4vp can be capacitively coupled into the second level shifter 1304.

The additional third level shifter signal d4vn can be coupled into the second charge storage 102b of the second charge pump 1762. In other words, the additional third level shifter signal d4vn can be capacitively coupled into the second level shifter 1304.

Line 2160 represents the temporal profile of a third signal (e.g. the electrical voltage thereof or the electrical potential thereof) at a first charge transfer node vnp1 of the second partial stage 120b of the second charge pump 1762, and line 2162 illustrates the temporal profile of a fourth signal (e.g. the electrical voltage thereof or the electrical potential thereof) at a second charge transfer node vnp2 of the second partial stage 120b of the second charge pump 1762. The third signal and the fourth signal can be coupled into a second input 1366*e* of the inverter structure 1366. The third signal and the fourth signal can be configured in a push-pull fashion.

Figure 22A:
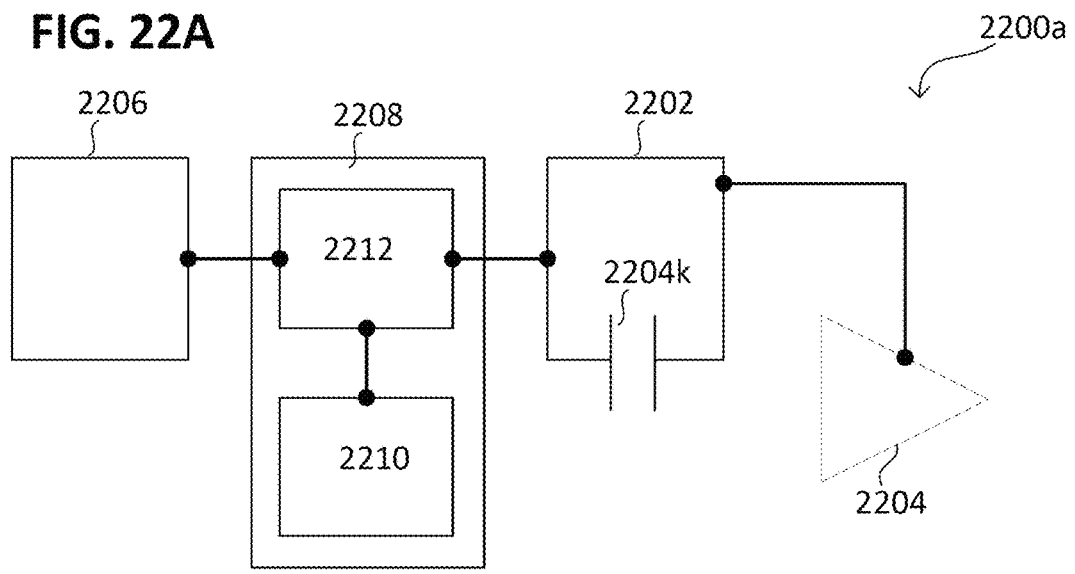
FIGS. 22A, 22B, 23 and 25 respectively show a measuring arrangement in accordance with various embodiments in a schematic circuit diagram.

FIG. 22A illustrates a measuring arrangement 2200*a* in accordance with various embodiments in a schematic circuit diagram.

The measuring arrangement 2200*a* may include a bridge circuit 2202 including a plurality of capacitive two-terminal networks (also referred to as capacitive bridge circuit 2202), at least one two-terminal network of which includes a capacitance 2204*k* of a micromechanical sensor.

The measuring arrangement 2200*a* may furthermore include an amplifier 2204 and an electrical DC voltage source 2206 and a chopper 2208, which is coupled between the bridge circuit 2202 and the electrical DC voltage source 2206. The input-side capacitance of the amplifier 2204 can be approximately of just the same magnitude as the capacitance 2204*k* of the micromechanical sensor, i.e. can deviate less than approximately 50% therefrom, e.g. can be equal to the capacitance 2204*k* with a deduction of approximately 25% thereof or less, e.g. can be equal to the capacitance 2204*k* with a deduction of approximately 10% thereof or less, e.g. can be equal to the capacitance 2204*k* with a deduction of approximately 5% thereof or less.

The chopper 2208 may include at least one charge storage 2210 and a switch structure 2212. The switch structure 2212 can be configured to couple the charge storage 2210 alternately to the electrical DC voltage source 2206 and the bridge circuit 2202, such that an electrical mixed voltage is coupled into the bridge circuit 2202. The switch structure 2212 may include or be formed from at least one intermediate switch (also referred to as pole-changing switch).

An electrical mixed voltage can be understood to be a superimposition (electrical summation voltage) of an electrical AC voltage with an electrical DC voltage, e.g. by series connection of two corresponding electrical voltage sources. The electrical DC voltage can optionally be zero; in that case the electrical mixed voltage can be an electrical AC voltage, i.e. an electrical voltage whose polarity changes over the course of time (e.g. with regular repetition) and whose mean value over time is zero.

An electrical working voltage of the amplifier 2204 can be approximately VDD.

Figure 22B:
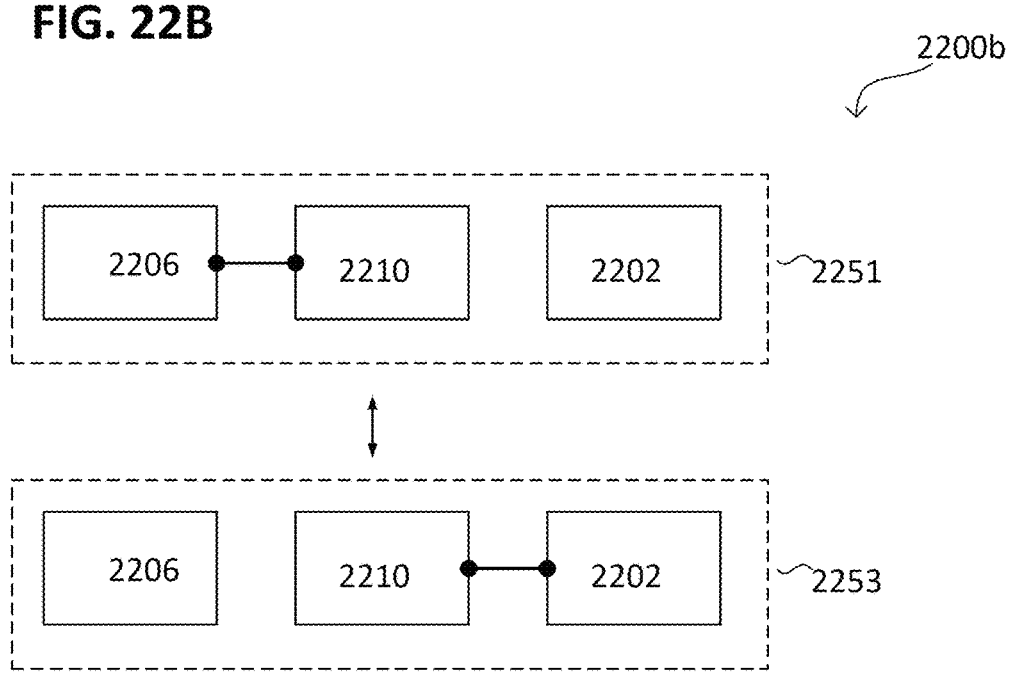

FIG. 22B illustrates a measuring arrangement 2200*b* in accordance with various embodiments in a schematic flow diagram.

In accordance with various embodiments, the charge storage 2210 can be charged by means of the electrical DC voltage source 2206 if the switch structure 2212 couples the charge storage 2210 to the electrical DC voltage source 2206, i.e. in a charging phase 2251. Analogously, the charge storage 2210 can be discharged by means of the bridge circuit 2202 if the switch structure 2212 couples the charge storage 2210 to the bridge circuit 2202, i.e. in a discharging phase 2253.

The chopper 2208, e.g. the switch structure 2212 thereof, can be driven by means of a level shifter circuit, e.g. by means of one of the level shifter circuits described herein. In other words, a level shifter signal can be coupled into the chopper 2208 (for controlling the chopper 2208).

The signal (e.g. the level shifter signal) coupled into the chopper 2208 can have a frequency of more than 50 kHz (kilohertz), e.g. in a range of approximately 50 kHz to approximately 5 MHz (megahertz), e.g. in a range of approximately 50 kHz to approximately 250 kHz. By way of example, the signal coupled into the chopper 2208 can have at least double the frequency in regard to the frequency band to be measured by means of the sensor.

Figure 23:
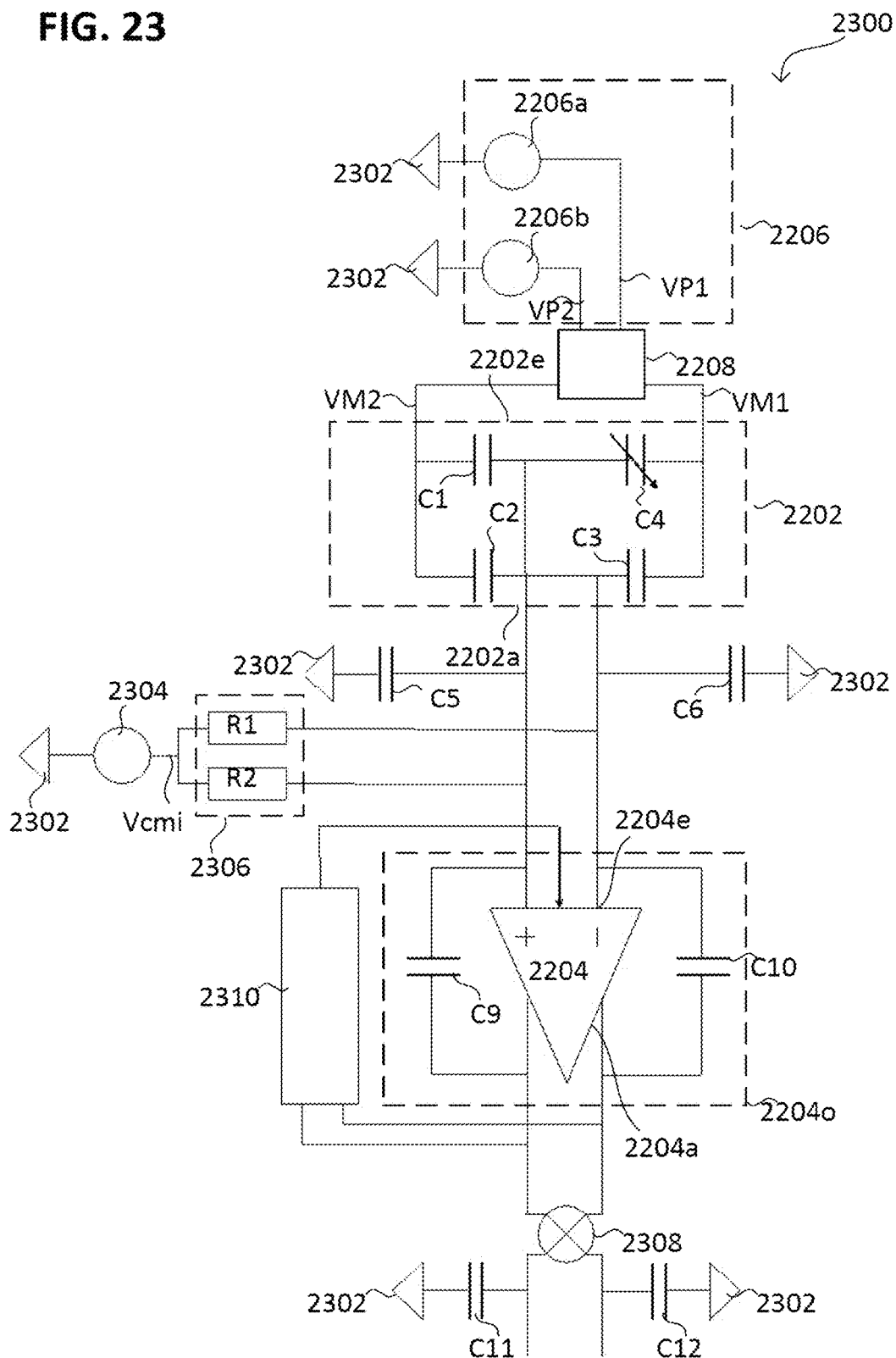

FIG. 23 illustrates a measuring arrangement 2300 in accordance with various embodiments in a schematic circuit diagram.

The electrical DC voltage source 2206 may include a first charge pump 2206*a* and/or a second charge pump 2206*b*. By way of example, the first charge pump 2206*a* or the second charge pump 2206*b* can be omitted. The first charge pump 2206*a* and/or the second charge pump 2206*b* can be configured as described herein. By way of example, the first charge pump 2206*a* and/or the second charge pump 2206*b* can be configured in accordance with the charge pump illustrated in FIG. 1 or some other charge pump described herein.

The first charge pump 2206*a* can be configured to provide a first electrical potential VP1 of the electrical DC voltage on the output side. If the first charge pump 2206*a* is omitted, the first electrical potential VP1 can be a reference potential (e.g. electrical ground) present at the reference terminal 2302. The second charge pump 2206*b* can be configured to provide a second electrical potential VP2 of the electrical DC voltage on the output side. If the second charge pump 2206*b* is omitted, the second electrical potential VP2 can be a reference potential (e.g. electrical ground) present at the reference terminal 2302.

The electrical DC voltage, i.e. the difference between the first electrical potential VP1 and the second electrical potential VP2, can be greater (in terms of its absolute value) than the electrical supply voltage, e.g. greater than VDD, VDDH, VSSL, e.g. greater than approximately 6 volts, e.g. greater than approximately 8 volts, e.g. greater than approximately 10 volts, e.g. greater than approximately 12 volts, e.g. greater than approximately 14 volts, e.g. greater than approximately 16 volts, e.g. greater than approximately 18 volts.

By way of example, the first electrical potential VP1 can be positive relative to the electrical reference potential, e.g. +10 volts. Alternatively or additionally, the second electrical potential VP2 can be negative relative to the electrical reference potential, e.g. −8 volts.

The bridge circuit 2202 may include a plurality of capacitances (e.g. C1 to C4), at least one capacitance (e.g. C4) of which may include or be formed from a capacitance of the micromechanical sensor. Alternatively or additionally, at least one of the other capacitances (e.g. C1, C2 or C3) may include or be formed from an additional capacitance of the micromechanical sensor. In other words, the micromechanical sensor may include at least one capacitance (e.g. one, two, three, four, etc.) which is coupled into the measuring arrangement 2300 by means of the measuring bridge 2202.

On the input side 2202*e* (i.e. by its input 2202*e*), the bridge circuit 2202 can be coupled to the chopper 2208, such that the electrical mixed voltage is coupled into the measuring bridge. On the output side 2202*a* (i.e. by its output 2202*a*), the bridge circuit 2202 can be coupled to the input 2204*e* of the amplifier 2204, such that an output signal of the bridge circuit 2202 is coupled into the amplifier.

The output of the bridge circuit 2202 can optionally be stabilized by means of a buffer coupling (including at least one capacitor C5, C6). The output of the bridge circuit 2202 can optionally be stabilized by means of an electrical supporting voltage 2306, e.g. resistively by means of ohmic resistors R1, R2. The electrical supporting voltage can be generated by means of an additional electrical DC voltage source 2304. The additional electrical DC voltage source 2304 may include at least one charge pump. The resistive coupling 2306 may include at least one ohmic resistor R1, R2.

In general, as an alternative or in addition to an ohmic resistor (e.g. in the case of the ohmic resistors R1, R2), a resistor may include or be formed from a transistor which is operated at a suitable operating point.

The input 2204e of the amplifier 2204 can optionally be capacitively coupled to the output 2204a of the amplifier 2204 (that is to say that the amplifier 2204 may include a capacitive feedback), e.g. by means of at least one capacitor C9, C10. The amplifier 2204 and the capacitive feedback C9, C10 can form an integrator 2204o (that is to say that the amplifier 2204 can be interconnected in an integrator configuration). Optionally, a voltage regulator 2310 can be interconnected in parallel with the amplifier 2204, which voltage regulator 2310 couples the input 2204e of the amplifier 2204 to the output 2204a of the amplifier 2204.

The output 2204a of the amplifier 2204 can be coupled to a rectifier 2308. The rectifier 2308 can be configured to rectify the signal coupled out by the amplifier 2204. By way of example, the rectifier 2308 may include or be formed from at least one intermediate switch (e.g. including four cross-connected switches). The rectifier 2308 can optionally be coupled on the output side to a further buffer coupling C11, C12 (including at least one capacitor C11, C12). In other words, the (rectified) signal coupled out by means of the rectifier 2308 can be capacitively stabilized.

The rectifier 2308 (e.g. the intermediate switch thereof) can be switched synchronously with the chopper 2208 (e.g. the intermediate switch thereof). Illustratively, the rectifier 2308 can subject the signal modulated by the chopper to inverse modulation.

The pink noise (also referred to as 1/f noise, also referred to in English as "flicker noise") of the amplifier 2204 (including e.g. an operational amplifier) can be reduced or prevented by means of the intermediate switches. Illustratively, the chopper 2308, e.g. the intermediate switch 2212 thereof, can be raised to the electrical supply voltage of the capacitive sensor (e.g. the micromechanical sensor), which makes it possible e.g. to operate the latter with a signal source having a very large impedance.

The capacitive bridge circuit 2202 may include for example four capacitors C1 to C4 having the same capacitance. As an alternative or in addition to the capacitors, it is also possible to use other capacitive components (e.g. a transistor) having a capacitance. In other words, each branch of the bridge circuit 2202 can have a negative (i.e. capacitive) reactance.

The measuring arrangement 2300 can be interconnected in a sample-and-hold circuit (sample-and-hold configuration).

FIG. 24 illustrates a signal profile 2400 in accordance with various embodiments in a schematic diagram illustrating a signal characteristic 801 (e.g. an electrical voltage of the signal, in arbitrary units) against time 803 (in arbitrary units).

The first electrical potential VP1 (e.g. a positive electrical potential) and/or the second electrical potential VP2 (e.g. a negative electrical potential) can be coupled into the chopper 2208. By means of the chopper 2208, a first electrical mixed voltage VM1 and/or a second electrical mixed voltage VM2 can be coupled out and/or coupled into the bridge circuit 2202. Optionally, an electrical reference potential can be used instead of the first electrical potential VP1 or the second electrical potential VP2. By means of the intermediate switch, the electrical voltage of the bridge output can be held at a constant electrical potential.

The first electrical mixed voltage VM1 and/or the second electrical mixed voltage VM2 can have a peak-to-valley value corresponding approximately to the electrical DC voltage of the electrical DC voltage source 2206 (i.e. the difference between the first electrical potential VP1 and the second electrical potential VP2). The first electrical mixed voltage VM1 and the second electrical mixed voltage VM2 can be configured in a push-pull fashion by means of the chopper 2208. In other words, the first electrical mixed voltage VM1 can be at the first electrical potential VP1, while the second electrical mixed voltage VM2 can be at the second electrical potential VP2. If the chopper switches over, the second electrical mixed voltage VM2 can be at the first electrical potential VP1, while the first electrical mixed voltage VM1 can be at the second electrical potential VP2.

The first electrical mixed voltage VM1 and/or the second electrical mixed voltage VM2 may include or be formed from a rectangular signal (i.e. include a rectangular signal waveform).

The electrical supporting voltage Vcmi (or the associated electrical potential) provided by the additional electrical DC voltage source 2304 can be between the first electrical potential VP1 and the second electrical potential VP2, for example approximately half. The difference between the electrical supporting voltage Vcmi and the first electrical potential VP1, and the second electrical potential VP2, can be less than or equal to approximately Vbias (electrical working voltage) of the micromechanical sensor, e.g. less than or equal to the admissible electrical voltage with which the micromechanical sensor can be read (e.g. without being damaged). In other words, it can be the case that VP1=Vcmi+Vbias and it can be the case that VP2=Vcmi−Vbias. By way of example, Vbias can be greater than 2.5 volts, e.g. greater than 5 volts, e.g. greater than 7.5 volts, e.g. approximately 8 volts. For a Vbias of 8 volts, the electrical input voltage of the measuring bridge 2202 (or the electrical DC voltage of the electrical DC voltage source 2206) can be approximately 16 volts or less.

If the measuring bridge 2202 is completely balanced (that is to say that each capacitive two-terminal network has the same capacitance), only the signal caused by the micromechanical sensor is coupled into the amplifier 2204. If the measuring bridge 2202 is incompletely balanced, a ripple of the signal coupled into the amplifier 2204 can result, which can be at least partly reduced for example by means of the buffer coupling C5, C6. Alternatively or additionally, either capacitor C5 or capacitor C6 can be used in order to produce the symmetry of the measuring bridge 2202 (e.g. by compensating for tolerances of parasitic capacitances). This can support suppression of the ripple of the two mixed voltages (also referred to as common-mode rejection of the measuring bridge 2202).

In accordance with various embodiments, the common-mode rejection of the measuring bridge 2202 (e.g. if the latter is completely balanced) can suppress noise of the supply voltage coupled into the sensor. The resulting noise can be lower, the better the temporal fit of the electrical mixed voltages VM1, VM2 coupled into the measuring bridge 2202.

The common-mode rejection ratio (CMRR for short) can be understood to be a value describing a change in an electrical output voltage, as a reaction to the two electrical input potentials changing uniformly (by the same value, i.e.

in a common-mode fashion), or if one electrical input voltage, i.e. its mean value over time, shifts relative to an electrical reference potential.

In a common-mode fashion can be understood to mean that two electrical potentials, electrical signals, electrical voltages, etc. change by a value having the same sign, e.g. by the same absolute value. In a push-pull fashion can be understood to mean, for example, that two electrical potentials, electrical signals, electrical voltages, etc. change by a value having a different sign, e.g. by the same absolute value.

As an alternative to a rectangular signal waveform, other signal profiles can be provided, e.g. a trapezoidal signal waveform and/or a triangular signal waveform, or a superimposition thereof.

Figure 25:
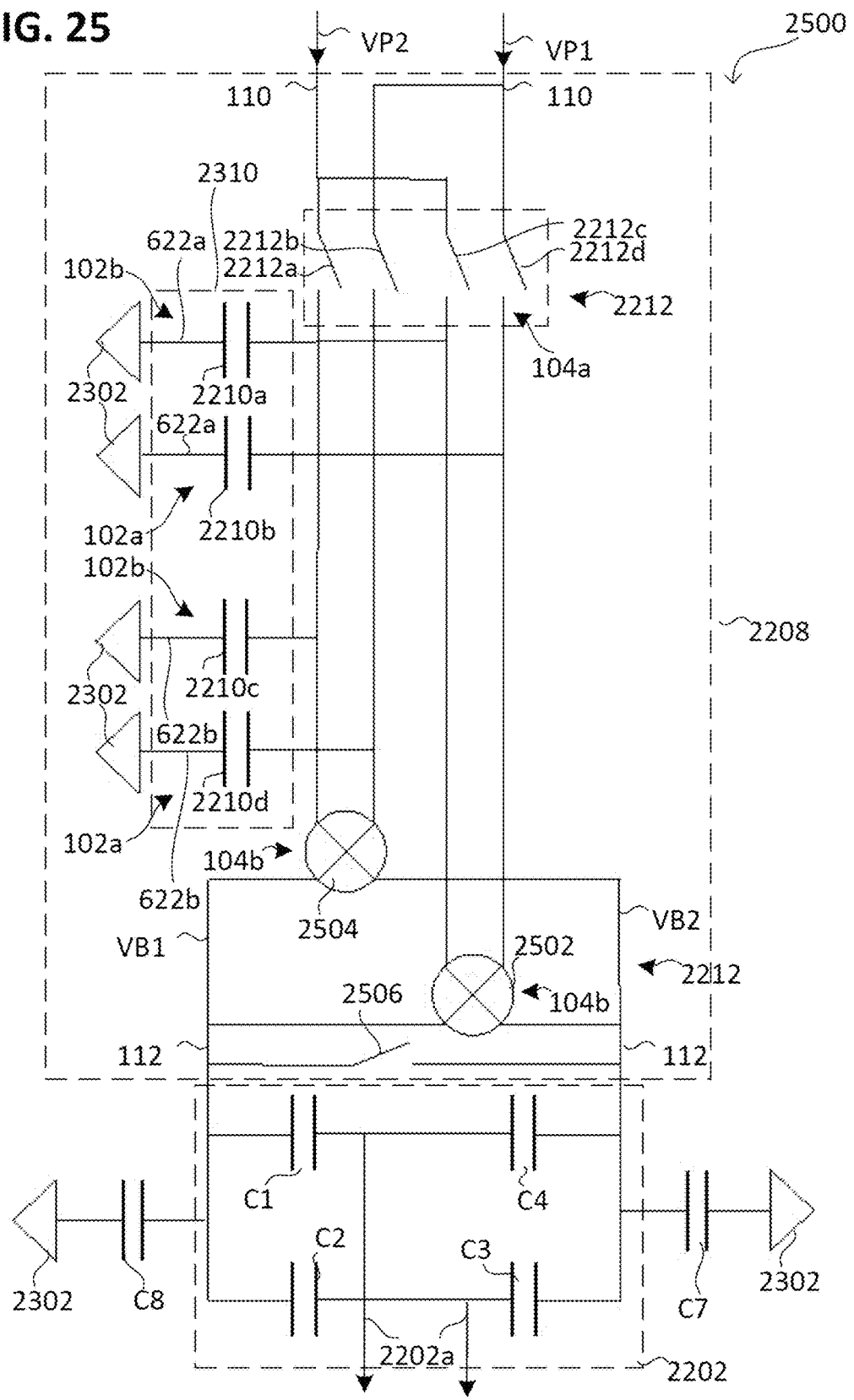

FIG. 25 illustrates a measuring arrangement 2500 in accordance with various embodiments in a schematic circuit diagram.

The chopper 2208 may include a charge storage arrangement 2310, which may include a plurality of charge storages 2210a, 2210b, 2210c, 2210d, e.g. two first charge storages 2210a, 2210b, which form a first charge storage pair 2210a, 2210b, and/or two second charge storages 2210c, 2210d, which form a second charge storage pair 2210c, 2210d. Each charge storage 2210a, 2210b, 2210c, 2210d of the charge storage arrangement 2310 may include or be formed from at least one capacitive component, e.g. at least one capacitor. The charge storage arrangement 2310 may be necessary, for example, if the chopper 2208 is implemented with the electrical DC voltage source 2206 jointly in a chip. If they are implemented by means of different chips, the charge storage arrangement 2310 can optionally be dispensed with.

The switch structure 2212 may include a plurality of (e.g. cross-connected) switches 2212a, 2212b, 2212c, 2212d (also referred to as chopper switches), each switch of which can be connected between a charge storage 2210a, 2210b, 2210c, 2210d of the charge storage arrangement 2310 (i.e. respectively different charge storages) and the electrical DC voltage source 2206.

The switch structure 2212 may furthermore include a first connecting switch 2502 (e.g. including or formed from a first intermediate switch 2502), which can be connected between the first charge storage pair 2210a, 2210b and the measuring bridge 2202. Alternatively or additionally, the switch structure 2212 may include a second first connecting switch 2504 (e.g. including or formed from a second intermediate switch 2504), which can be connected between the second charge storage pair 2210c, 2210d and the measuring bridge 2202. Instead of the intermediate switches 2502, 2504, it is also possible to use other switches in a crossed interconnection.

Optionally, the switch structure 2212 may include an additional switch 2506, which couples the input terminals of the measuring bridge to one another and/or the output terminals of the chopper 2208 to one another. By means of the additional switch 2506, the plurality of capacitors C1 to C4 of the bridge circuit can be discharged relative to one another.

Illustratively, the measuring bridge 2202 may include two parallel-connected capacitive voltage dividers (first voltage divider C1, C4 and second voltage divider C2, C3), which each provide an output terminal of the output 2202a of the measuring bridge 2202. Each voltage divider of the measuring bridge 2202 may include two capacitive two-terminal networks, between which the output terminal (or output node) is connected. The additional switch 2506 can be connected in parallel with the two voltage dividers of the measuring bridge 2202. The additional switch 2506 in a closed state can connect each capacitive two-terminal network of the measuring bridge 2202 to form a mesh.

The measuring arrangement 2500 can optionally include a buffer coupling C7, C8 (including at least one capacitor C7, C8), between which the (two capacitive two-terminal networks of the) measuring bridge 2202 can be connected.

Figure 26:
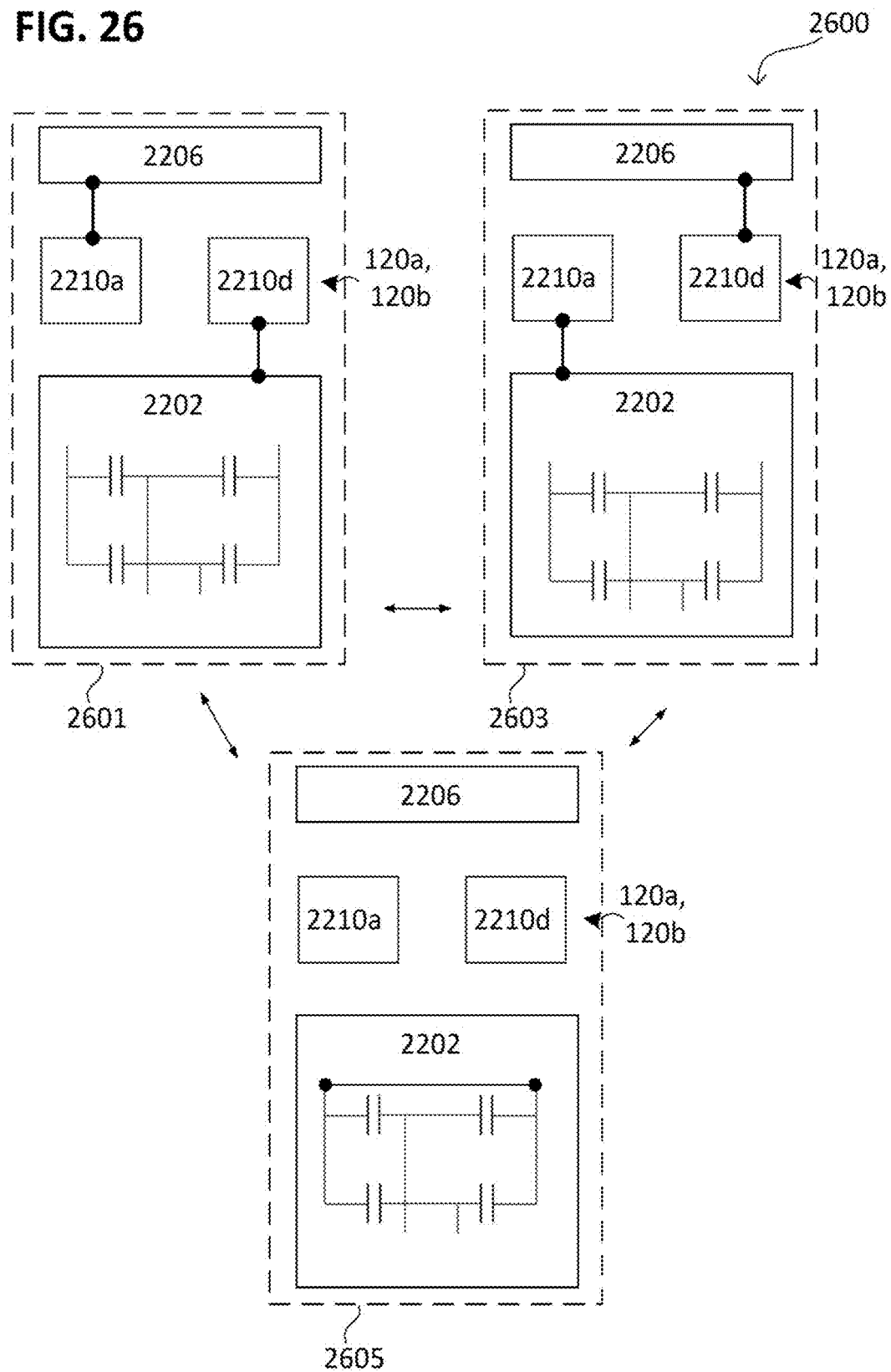
FIGS. 26, 27 and 28 respectively show a charge transfer cycle in accordance with various embodiments in a schematic flow diagram.

FIG. 26 illustrates a charge transfer cycle 2600 of a chopper 2208 in accordance with various embodiments in a schematic flow diagram.

Illustratively, the charge storages of the chopper 2208 can be driven similarly to the charge storages of a charge pump.

The charge transfer cycle 2600 may include a first phase 2601 (also referred to as first chopper phase 2601), in which a first charge storage 2210a is coupled to the electrical DC voltage source 2206, or the electrical DC voltage thereof, and is decoupled from the bridge circuit 2202 (by way of example, the first charge storage 2210a can be in the first partial stage phase 151). Alternatively or additionally, in the first phase 2601 a second charge storage 2210d can be decoupled from the electrical DC voltage source 2206, or the electrical DC voltage thereof and be coupled to the bridge circuit 2202 (by way of example, the second charge storage 2210d can be in the third partial stage phase 155).

The charge transfer cycle 2600 may furthermore include a second phase 2603 (also referred to as second chopper phase 2603), in which the first charge storage 2210a is decoupled from the electrical DC voltage source 2206, or the electrical DC voltage thereof, and is coupled to the bridge circuit 2202 (by way of example, the first charge storage 2210a can be driven in accordance with the third partial stage phase 155). Alternatively or additionally, in the second phase 2603, the second charge storage 2210d can be coupled to the electrical DC voltage source 2206, or the electrical DC voltage thereof, and be decoupled from the bridge circuit 2202 (by way of example, the second charge storage 2210d can be driven in accordance with the first partial stage phase 151).

Optionally, the charge transfer cycle 2600 may include a third phase 2605 (also referred to as third chopper phase 2605), in which the plurality of capacitors of the measuring bridge 2202, or the voltage dividers thereof, are coupled to one another (i.e. to form a mesh) for the purpose of discharging (that is to say that the input of the bridge circuit 2202 can be bridged), e.g. by means of the additional switch 2506. Alternatively or additionally, in the third chopper phase 2605, the first charge storage 2210a and/or the second charge storage 2210d can be decoupled from the bridge circuit 2202 (by way of example, the first charge storage 2210a and/or the second charge storage 2210d can be driven in accordance with the second partial stage phase 153).

In the first chopper phase 2601 and/or in the second chopper phase 2603, the additional switch 2506 can be in an open state.

In accordance with various embodiments, the charge storages of a charge storage pair can be switched similarly to those of a charge pump stage, with the difference that a temporally constant signal (instead of the charge transfer signal) is coupled into the charge storages 102a, 102b (that is to say that their clock input 622a, 622b is at a temporally constant electrical potential) and the second switches 104b are cross-connected. By way of example, two charge pump stages (e.g. each including two partial stages 120a, 120b) can be connected in parallel with one another.

Figure 27:
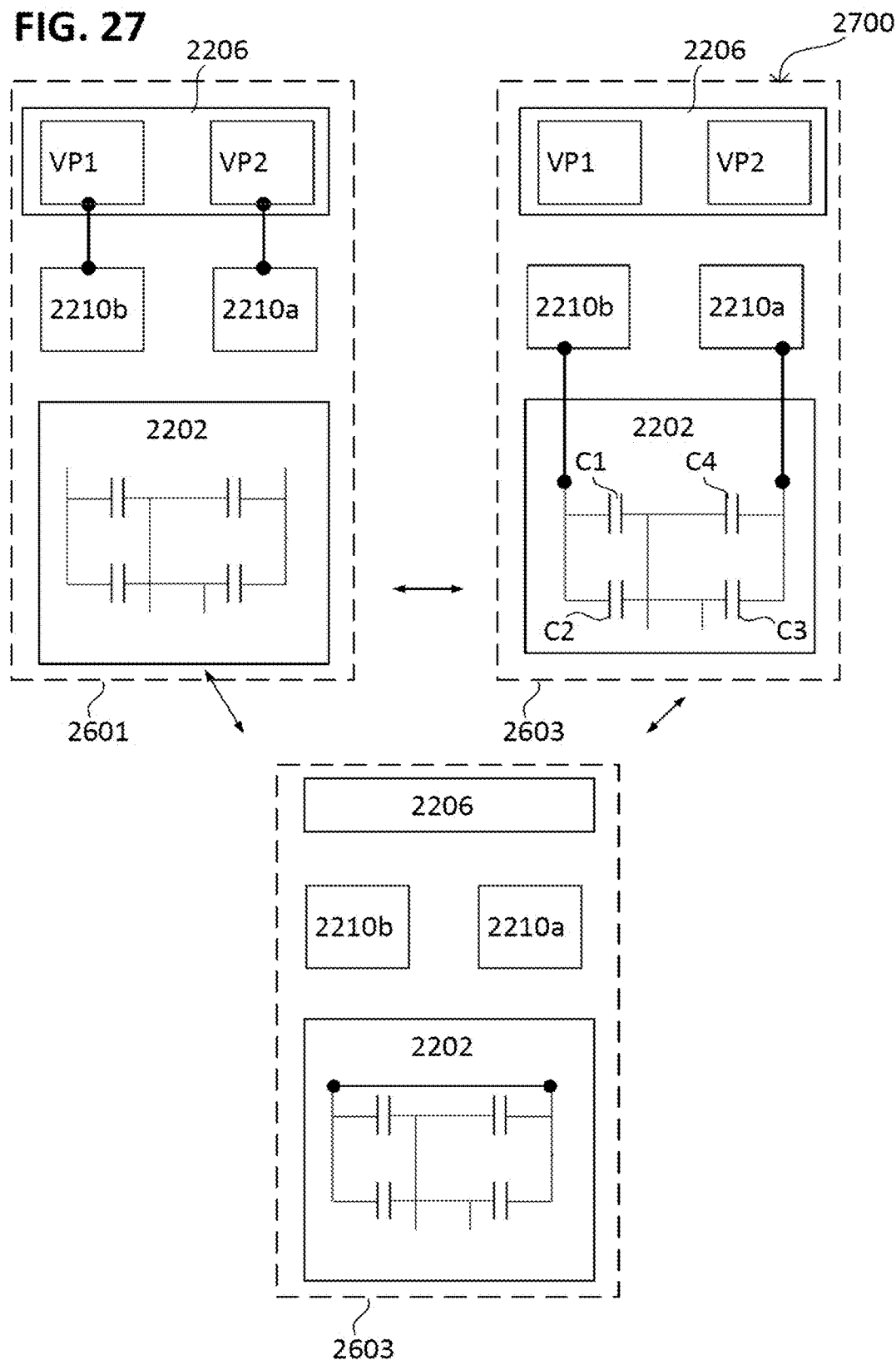

FIG. 27 illustrates a charge transfer cycle 2700 of a chopper 2208 in accordance with various embodiments in a schematic flow diagram.

In the first chopper phase 2601, the first charge storage 2210a (e.g. in accordance with the first partial stage phase 151) can be coupled to the electrical potential VP1 of the electrical DC voltage source 2206 (or the electrical DC voltage), and in the second chopper phase 2603 (e.g. in accordance with the third partial stage phase 155) it can be coupled to the measuring bridge 2202, e.g. to a first capacitor C1 of the first voltage divider C1, C4 of the measuring bridge 2202 and/or to a first capacitor C2 of the second voltage divider C2, C3 of the measuring bridge 2202.

In the first chopper phase 2601, a third charge storage 2210b (also referred to as additional first charge storage 2210b) of the chopper 2208 (e.g. in accordance with the first partial stage phase 151) can be coupled to the second electrical potential VP2 of the electrical DC voltage source 2206 (or the electrical DC voltage), and in the second chopper phase 2603 (e.g. in accordance with the third partial stage phase 155) it can be coupled to the measuring bridge 2202, e.g. to a second capacitor C4 of the first voltage divider C1, C4 of the measuring bridge 2202 and/or be coupled to a second capacitor C3 of the second voltage divider C2, C3 of the measuring bridge 2202.

Optionally, in the third chopper phase 2605, the first charge storage 2210a and/or the third charge storage 2210b can be decoupled from the bridge circuit 2202 (e.g. in accordance with the second partial stage phase 153). Optionally, the plurality of capacitors of the measuring bridge 2202, or the voltage dividers thereof, can be coupled to one another (i.e. to form a mesh) for the purpose of discharging, e.g. by means of the additional switch 2506.

Figure 28:
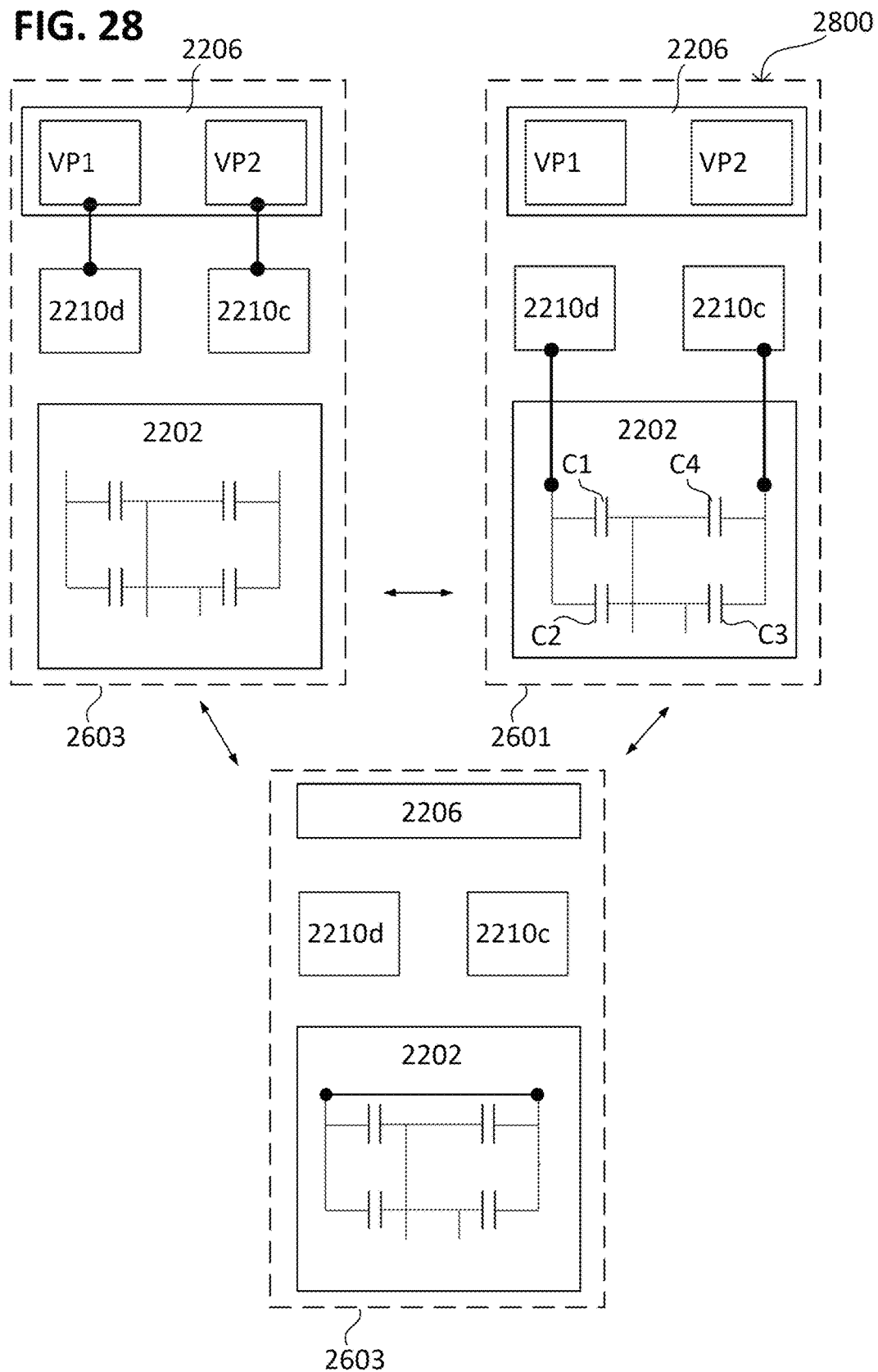

FIG. 28 illustrates a charge transfer cycle 2800 of a chopper 2208 in accordance with various embodiments in a schematic flow diagram.

In the second chopper phase 2603, the second charge storage 2210c (e.g. in accordance with the first partial stage phase 151) can be coupled to the second electrical potential VP2 of the electrical DC voltage source 2206 (or the electrical DC voltage), and in the first chopper phase 2601 (e.g. in accordance with the third partial stage phase 155) it can be coupled to the second capacitor C4 of the first voltage divider C1, C4 of the measuring bridge 2202 and/or be coupled to the second capacitor C3 of the second voltage divider C2, C3 of the measuring bridge 2202.

In the second chopper phase 2603, a fourth charge storage 2210d (also referred to as additional second charge storage 2210d) of the chopper 2208 (e.g. in accordance with the first partial stage phase 151) can be coupled to the second electrical potential VP2 of the electrical DC voltage source 2206 (or the electrical DC voltage), and in the first chopper phase 2601 (e.g. in accordance with the third partial stage phase 155) it can be coupled to the first capacitor C1 of the first voltage divider C1, C4 of the measuring bridge 2202 and/or be coupled to the first capacitor C2 of the second voltage divider C2, C3 of the measuring bridge 2202.

Optionally, in the third chopper phase 2605, the second charge storage 2210c and/or the fourth charge storage 2210d can be decoupled from the bridge circuit 2202 (e.g. in accordance with the second partial stage phase 153). Optionally, the plurality of capacitors of the measuring bridge 2202, or the voltage dividers thereof, can be coupled to one another (i.e. to form a mesh) for the purpose of discharging, e.g. by means of the additional switch 2506.

Figure 29A:
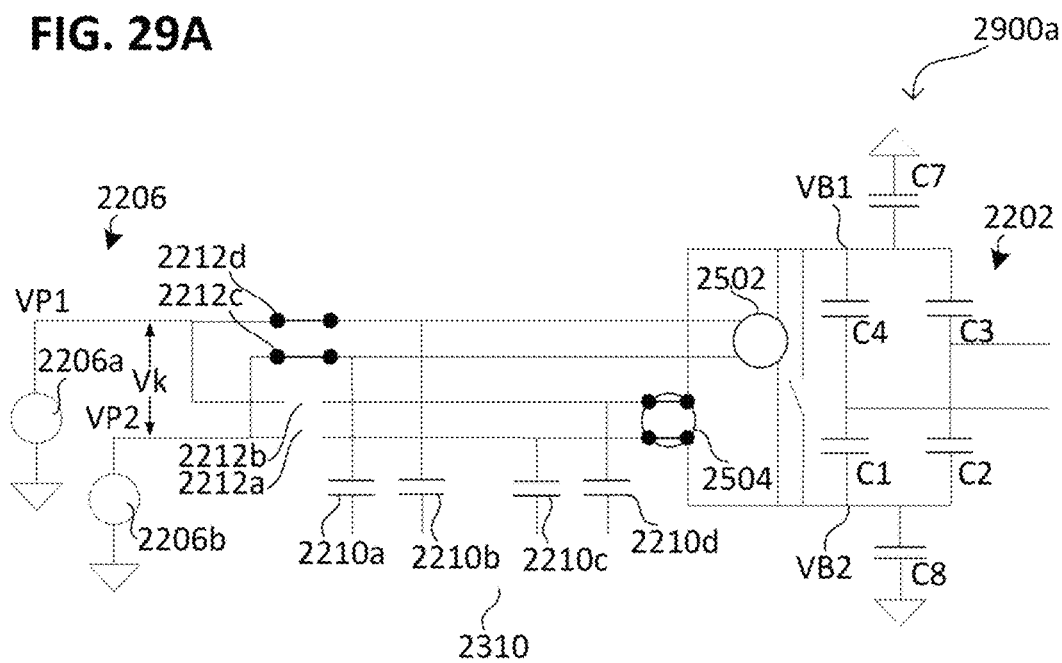
FIGS. 29A and 29B respectively show a measuring arrangement in accordance with various embodiments in a schematic circuit diagram.
Figure 29B:
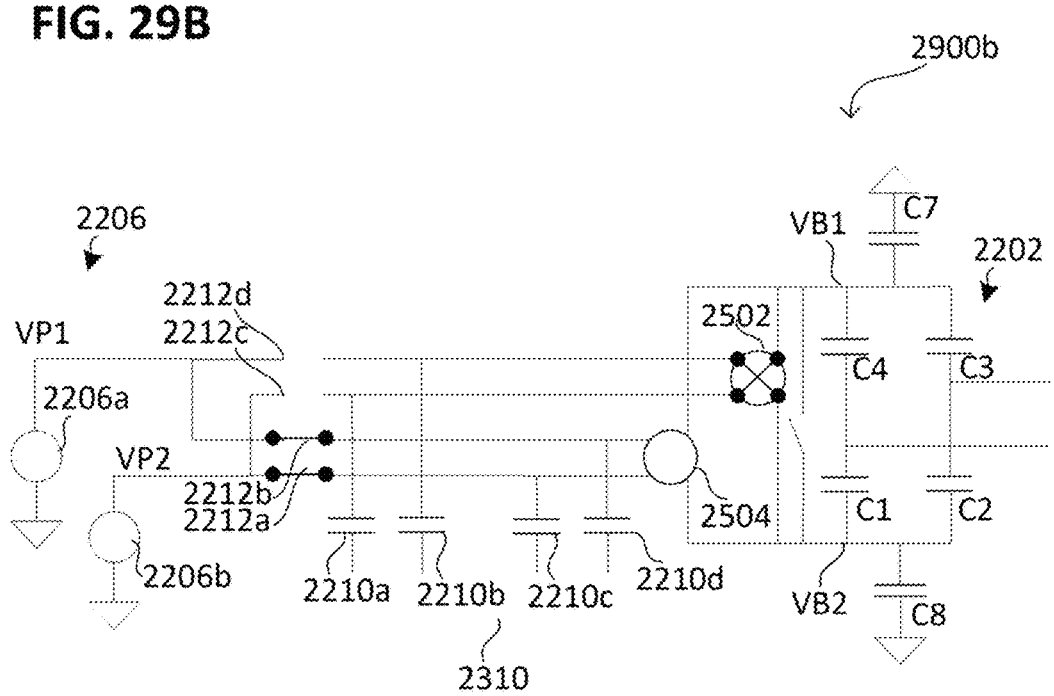

FIG. 29A and FIG. 29B illustrate a measuring arrangement in accordance with various embodiments in a schematic circuit diagram in a first chopper phase 2900a and a second chopper phase 2900b of the charge transfer cycle.

The charge storages 2210a, 2210b, 2210c, 2210d of the charge storage arrangement 2310 are used for providing an electrical supply voltage in accordance with the electrical working voltage (Vbias) of the micromechanical sensor. A very fast and low-noise control amplifier can thus be dispensed with. Illustratively, the charge storage arrangement 2310 enables a more expedient and simpler circuit architecture.

In accordance with various embodiments, the charge storage arrangement 2310 may include a first charge storage pair 2210a, 2210b and a second charge storage pair 2210c, 2210d, each charge storage pair of which includes two charge storages.

In the first chopper phase 2900a and in the second chopper phase 2900b (e.g. each approximately half a charge transfer cycle minus the switching process), one of the charge storage pairs can be charged, e.g. to the required electrical voltage, and the other charge storage pair can be coupled to the measuring bridge 2202. In this case (e.g. together with the other charge storage pair) the measuring bridge 2202 can be electrically insulated (e.g. electrically floating) from the electrical reference potential and/or the electrical DC voltage source 2206.

With the or each transition between the first chopper phase 2900a and the second chopper phase 2900b, the polarity of the measuring bridge 2202 can be changed (i.e. interchanged or inverted), that is to say that a switching process can take place. By way of example, the charge transfer cycle may include, between the first chopper phase 2900a and the second chopper phase 2900b, in each case a second partial stage phase 2953, in which the switch structure 2212 of the chopper 2208 is in a switching process.

In the first chopper phase 2900a, the first connecting switch 2502 can have an open state. In other words, the first charge storage pair 2210a, 2210b can be decoupled from the measuring bridge 2202 by means of the first connecting switch 2502. Furthermore, in the first chopper phase 2900a, the second connecting switch 2504 can have a first closed state. In other words, the second charge storage pair 2210c, 2210d can be coupled to the measuring bridge 2202 by means of the second connecting switch 2504.

In the second chopper phase 2900b, the second connecting switch 2504 can have an open state. In other words, the second charge storage pair 2210c, 2210d can be decoupled from the measuring bridge 2202 by means of the second connecting switch 2504. Furthermore, in the first chopper phase 2900a, the first connecting switch 2502 can be in a second closed state. In other words, the first charge storage pair 2210a, 2210b can be coupled to the measuring bridge 2202 by means of the second connecting switch 2504.

The first closed state and the second closed state of the first connecting switch 2502 and/or of the second connecting switch 2504 can differ in a polarity (with respect to VP1 and VP2). In other words, the connecting switch(es) 2502, 2504 can interchange the polarity of the measuring bridge 2202 upon the transition between the two closed states. The connecting switches 2502, 2504 can thus be configured in such a way that the polarity of a first input node VB1 of the measuring bridge 2202 and of a second input node VB2 of the measuring bridge 2202 are interchanged upon the transition between the first chopper phase 2900a and the second chopper phase 2900b. The voltage dividers of the measuring bridge 2202 can be connected in parallel between the first input node VB1 of the measuring bridge 2202 and the second input node VB2 of the measuring bridge 2202.

As an alternative to the configuration illustrated, the second connecting switch 2504 can have the second closed state in the first chopper phase 2900a and the first connecting switch 2502 can be in the first closed state in the first chopper phase 2900b.

The or each transition between the first chopper phase 2900a and the second chopper phase 2900b, e.g. after the first chopper phase 2900a and/or after the second chopper phase 2900b, can optionally include the third chopper phase. In the optional third chopper phase (e.g. in a first step) all the charge storages of the charge storage arrangement 2310 can be decoupled from the measuring bridge 2202. Alternatively or additionally, in the optional third chopper phase (e.g. in a second step) the measuring bridge 2202 can be discharged.

By way of example, each half charge transfer cycle of the chopper (also referred to as chopper cycle) may include a third chopper phase.

In accordance with various embodiments, the capacitance of the measuring bridge 2202 and the capacitance of the charge storages of the charge storage arrangement 2310 can be coordinated with one another in such a way that, upon the coupling of the charge storages of the charge storage arrangement 2310 to the measuring bridge 2202, an electrical supply voltage in accordance with the electrical working voltage is present at the capacitance of the micromechanical sensor, that is to say that the electrical supply voltage corresponds to Vbias.

The electrical working voltage of a component (e.g. of the micromechanical sensor and/or of the amplifier) can be defined by an operating point of the component. The operating point can illustratively represent the parameters with which the component can be operated. For starting up and/or operating the component, an electrical supply voltage (VDD) greater than or equal to the electrical working voltage (Vbias) can be applied to said component. The operating point of a component is the quiescent state in the absence of a coupled-in signal. It is described by a specific point on the characteristic curve. Proceeding from this point, the electric current and/or the electrical voltage can change, e.g. if a useful signal is coupled in. In order to achieve as undistorted, symmetrical signal transmission as possible, the operating point can lie for example in the middle of the characteristic curve, i.e. between maximum and minimum electrical voltage and/or electric current intensity.

If the measuring bridge 2202 is incompletely balanced, a temporal mismatch of the signal coupled into the amplifier 2204 can result, which can be at least partly reduced for example by means of the buffer coupling C7, C8 (in other words, the temporal fit can be increased). Alternatively or additionally, either capacitor C7 or capacitor C8 can be used in order to establish the symmetry of the measuring bridge 2202 (e.g. by compensating for tolerances of parasitic capacitances). This can support suppression of the temporal mismatch of the two mixed voltages (also referred to as common-mode rejection of the measuring bridge 2202). By way of example, the buffer coupling C7, C8 can be configured in such a way that edge steepnesses of VB1 and VB2 are substantially identical (i.e. deviate less than 10% from one another), such that they are configured with a temporal fit. Illustratively, the branches of the measuring bridge may include identical capacitances in order that the rise times of VB1, VB2 are approximately identical upon the switchover of the intermediate switches. If the rise times differ from one another to an excessively great extent, voltage spikes can arise at the two bridge outputs 2202a during the switchover.

By way of example, each charge storage of the charge storage arrangement 2310 can have a first capacitance K1, e.g. in a range of approximately 10 pF (picofarads) to approximately 500 pF, e.g. in a range of approximately 50 pF to approximately 100 pF, e.g. approximately 80 pF. Analogously, the measuring bridge 2202 can have a second capacitance K3=2·K2 corresponding to the sum of the parallel-connected capacitive two-terminal networks of the measuring bridge 2202, e.g. the sum of the capacitances of the following: of the first voltage divider C1, C4 and of the second voltage divider C2, C3 and optionally (i.e. if present) of the capacitance of the buffer coupling C7, C8. By way of example, it may be the case that K2=C4+C3=C2+C1 or (if the buffer coupling C7, C8 is present) K2=C4+C3+C7=C2+C1+C8. Optionally, the capacitance of C7 and/or C8 can be zero.

By way of example, the sum of the capacitances of the first voltage divider C1, C4 and of the capacitor C5 can be in a range of approximately 1 pF to approximately 50 pF, e.g. in a range of approximately 5 pF to approximately 25 pF, e.g. can be approximately 10 pF. Alternatively or additionally, the sum of the capacitances of the second voltage divider C2, C3 and of the capacitor C6 can be in a range of approximately 1 pF to approximately 50 pF, e.g. in a range of approximately 5 pF to approximately 25 pF, e.g. can be approximately 10 pF.

In order that, from the DC voltage Vk=VP1−VP2 provided by means of the electrical DC voltage source 2206, the required working voltage Vbias is provided at the individual branches (two-terminal networks) of the measuring bridge 2202 (e.g. is not exceeded), the capacitances of the measuring bridge 2202 and of the chopper 2208 can be coordinated with one another in such a way that the electrical potentials VP1, VP2, with which the charge storages of the chopper 2208 are charged, upon the discharging thereof into the measuring bridge, decrease to Vbias. In other words, it may be the case that Vbias≤VB1−VB2≤Vk, e.g. 2·Vbias=VB1−VB2≤Vk and/or at least 2·Vbias≤Vk.

In accordance with various embodiments, the DC voltage Vk can be greater than double the working voltage Vbias. In other words, the ratio of Vk/Vbias can be greater than 2. By way of example, an electrical voltage of Vbias or less can be present at least at each of the capacitors C1, C2, C3, C4 of the capacitive voltage dividers (i.e. 2·Vbias=VB1−VB2), such that the sensor can be operated with its working voltage Vbias or more (e.g. a maximum of 10% less).

The voltage with which the charge storages of the chopper 2208 are charged (e.g. equal to VP1 and/or VP2), upon the discharging thereof into the measuring bridge, can decrease to the ratio of the capacitances to one another, namely K1/(K1+K2) (each charge storage illustratively discharges into a branch of the first capacitive voltage divider and a branch of the second capacitive voltage divider). In order that approximately or at most Vbias is present at each of the capacitors C1, C2, C3, C4 of the capacitive voltage dividers, Vk/(VB1−VB2) can be equal to (K1+K2)/K1 or more, which results for 2·Vbias=VB1−VB2:

$$Vk/Vbias \leq (K1+K2)/(0.5 \cdot K1).$$

In other words, it may be the case that Vbias·(K1+K2) ≥0.5·Vk·K1 or Vk≤Vbias·(K1+K2)/(0.5·K1). The ratio (K1+K2)/(0.5·K1) can be rewritten as 2+2·K2/K1=2+K3/K1. In other words, the ratio of the DC voltage Vk to the working voltage Vbias can be greater than two by at most the ratio of the second capacitance K3 to the first capacitance. K3 denotes the capacitive sum of the plurality of capacitances of the measuring bridge 2202, i.e. the input capacitance K3 thereof (capacitance K3 of the input of the measuring bridge 2202).

By providing K2=C4+C3=C2+C1 (or K2=C4+C3+C7=C2+C1+C8, if the buffer coupling C7 is present), what can be achieved is that the outputs 2202a of the measuring bridge 2202 remain approximately at the same potential upon the polarity reversal of the bridge voltages VB1, VB2 (i.e. upon the switching of the connecting switches 2502, 2504).

Illustratively, each charge storage of the charge storage arrangement 2310 can be charged to the electrical DC voltage Vk. If the charge storage is then coupled to the measuring bridge 2202, said charge storage partly discharges into the measuring bridge 2202 (charge transfer into the measuring bridge 2202), wherein its electrical voltage is reduced, specifically in the ratio of the capacitances to one another.

In the case where K2=C4+C3+C7=C2+C1+C8=10 pF and the capacitance of each charge storage of the charge storage arrangement 2310 is approximately 80 Pf, the charge storages of the charge storage arrangement 2310 can be charged to 9/8 of the working voltage. In other words, Vk can be approximately 9/8 of the working voltage. By way of example, it may be the case that C4 C1 C7 C2 C3 C8, e.g. approximately 3.5 pF.

Optionally, an electrical (common-mode) input voltage Vin_op of the amplifier 2204 can be different than zero; by way of example, said voltage can be in a range of approximately 0.5 volt to approximately 5 volts, e.g. can be approximately 1.3 volts. It may thus be necessary to shift all the electrical voltages by Vin_op. The electrical mixed voltage can then be provided with a mean value over time of approximately Vin_op.

By way of example, the first electrical potential VP1 can be the electrical reference potential+Vin_op+Vk/2 e.g. approximately 10.3 volts. By way of example, the second electrical potential VP2 can be the electrical reference potential+Vin_op−Vk/2, e.g. approximately −7.7 volts. Given the above ratio of 9/8, at VB1 approximately +9.3 volts and at VB2 approximately −6.7 volts can then be present in the first chopper phase. Analogously, at VB2 approximately +9.3 volts and at VB1 approximately −6.7 volts can then be present in the second chopper phase.

The connecting switches 2502, 2504 can have an approximately identical ohmic resistance. Alternatively or additionally, the connecting switches 2502, 2504 can have an approximately identical switching behavior, e.g. approximately identical switching times. An illustratively sufficient rate of rise and/or the time fit thereof can thus be achieved, which avoids excessively large electrical voltage spikes, e.g. at the amplifier 2204.

Figure 30A:
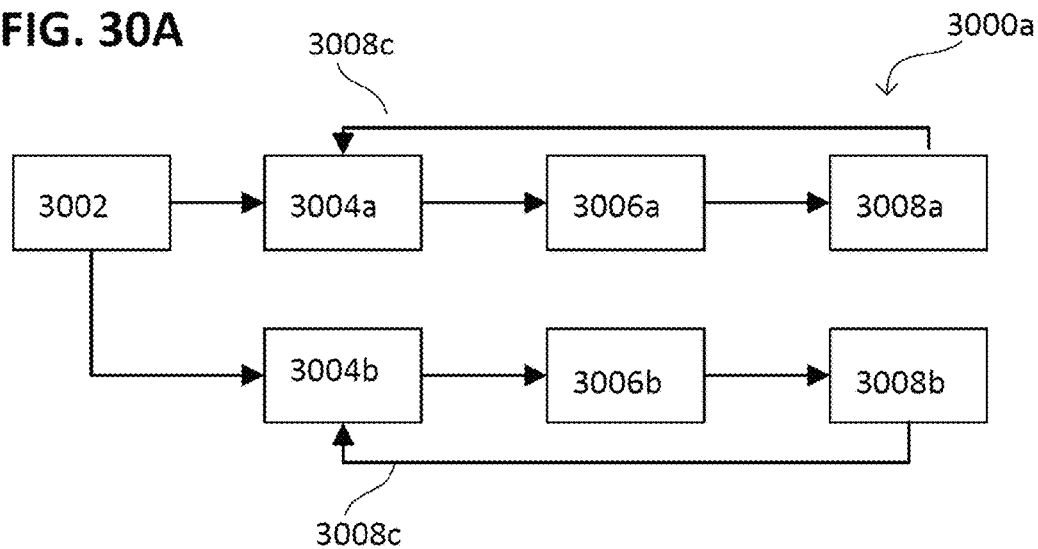
FIGS. 30A and 30B respectively show a measuring arrangement in accordance with various embodiments in a schematic circuit diagram.

FIG. 30A illustrates a measuring arrangement 3000a in accordance with various embodiments in a schematic circuit diagram.

The measuring arrangement 3000a may include a clock generator 3002, which can be configured for providing a reference clock 1002 (e.g. 12.5 megahertz). The clock generator 3002 can be operated for example with VDD (e.g. in a range of approximately 2.6 volts to approximately 2.75 volts).

The measuring arrangement 3000a (also cf. FIG. 39) may furthermore include a first charge pump 3004a, which can be configured for providing the first electrical potential VP1 (e.g. 10.3 volts). The first charge pump 3004a may include for example four or more charge pump stages 220a, 220b interconnected in series, e.g. each charge pump stage including exactly one partial stage 120a or two partial stages 120a, 120b interconnected in parallel. Alternatively or additionally, the measuring arrangement 3000a may include a second charge pump 3004b, which can be configured for providing the second electrical potential VP2 (e.g. −7.7 volts). The second charge pump 3004b may include for example four or more charge pump stages 220a, 220b interconnected in series, e.g. each charge pump stage including exactly one partial stage 120a or two partial stages 120a, 120b interconnected in parallel.

Optionally the first charge pump 3004a can be omitted if the first electrical potential VP1 is equal to the electrical reference potential. Alternatively, the second charge pump 3004b can be omitted, e.g. if the second electrical potential VP2 is equal to the electrical reference potential.

The measuring arrangement 3000a may furthermore include at least one first charge storage 3006a (e.g. the first charge storage 2210a and/or the third charge storage 2210a) for providing a first potential of the electrical mixed voltage (e.g. approximately 9.3 volts). The first electrical potential VP1 (e.g. in the first chopper phase) can be coupled into the at least one first charge storage 3006a and the first electrical potential of the electrical mixed voltage (e.g. in the second chopper phase) can be coupled out (i.e. be coupled into the measuring bridge 2202). Alternatively or additionally, the measuring arrangement 3000a may include at least one second charge storage 3006b (e.g. the second charge storage 2210b and/or the fourth charge storage 2210d) for providing a second electrical potential of the electrical mixed voltage (e.g. approximately −6.7 volts). The second electrical potential VP2 (e.g. in the second chopper phase) can be coupled into the at least one second charge storage 3006b and the first electrical potential of the electrical mixed voltage (e.g. in the first chopper phase) can be coupled out (i.e. be coupled into the measuring bridge 2202).

By way of example, the at least one first charge storage 3006a can be omitted, e.g. if the first charge pump 3004a is omitted. By way of example, the at least one second charge storage 3006b can be omitted, if the second charge pump 3004b is omitted.

The measuring arrangement 3000a may furthermore include a first voltage regulator 3008a for regulating 3008c (controlling and/or regulating) the electrical voltage coupled out from the at least one first charge storage 3006a (i.e. coupled into the measuring bridge 2202), e.g. to 9.3 volts. Alternatively or additionally, the measuring arrangement 3000a may include a second voltage regulator 3008b for regulating 3008c (controlling and/or regulating) the electrical voltage coupled out from the at least one second charge storage 3006b (i.e. coupled into the measuring bridge 2202), e.g. to −6.7 volts.

If the first electrical potential VP1 is approximately 0 volts (that is to say that it is at approximately the electrical reference potential), the second electrical potential VP2 may include the negative electrical DC voltage −Vk (e.g. −18 volts). If the second electrical potential VP2 is approximately 0 volts (that is to say that it is at approximately the electrical reference potential), the first electrical potential VP1 may include the positive electrical DC voltage+Vk (e.g. +18 volts). In order that the micromechanical sensor can be operated with a uniform electrical voltage (e.g. given a mean value over time of the electrical mixed voltage of +8 volts or −8 volts) less than or equal to Vbias, the input of the amplifier can be at the mean value over time of the electrical mixed voltage (e.g. at +8 volts). In that case, one of the two charge pumps and the two charge storages thereof can be dispensed with. In return, however, the uniform charging or charge reversal of both sides (e.g. to +16 V and 0 V) may be more difficult to realize.

The first electrical potential VP1 can be provided by means of the first charge pump 3004a. The first charge pump 3004a may include or be formed from a Pelliconi charge pump or Pelliconi charge pump stage (e.g. if VP1 is positive). Alternatively or additionally, the first charge pump 3004a may include or be formed from a Bootstrap Dickson charge pump or Bootstrap Dickson charge pump stage, e.g. the charge pump illustrated in FIG. 1 (e.g. if VP1 is negative).

The second electrical potential VP2 can be provided by means of the second charge pump 3004b. The second charge pump 3004b may include or be formed from a Pelliconi charge pump or Pelliconi charge pump stage (e.g. if VP2 is positive). Alternatively or additionally, the first charge pump 3004a may include a Bootstrap Dickson charge pump or Bootstrap Dickson charge pump stage, e.g. the charge pump illustrated in FIG. 1 (e.g. if VP2 is negative).

In accordance with various embodiments, the charging of the charge storages 2210a, 2210b, 2210c, 2210d of the charge storage arrangement 2310 can be controlled and/or regulated (e.g. by means of a controller) by the first charge pump 3004a and/or the second charge pump 3004b being switched on and off. Afterward, a fine setting of the electrical potential of the charge storages 2210a, 2210b, 2210c, 2210d of the charge storage arrangement 2310 can be carried out, e.g. by means of capacitively coupled-in voltage regulators 3008a, 3008b.

Figure 30B:
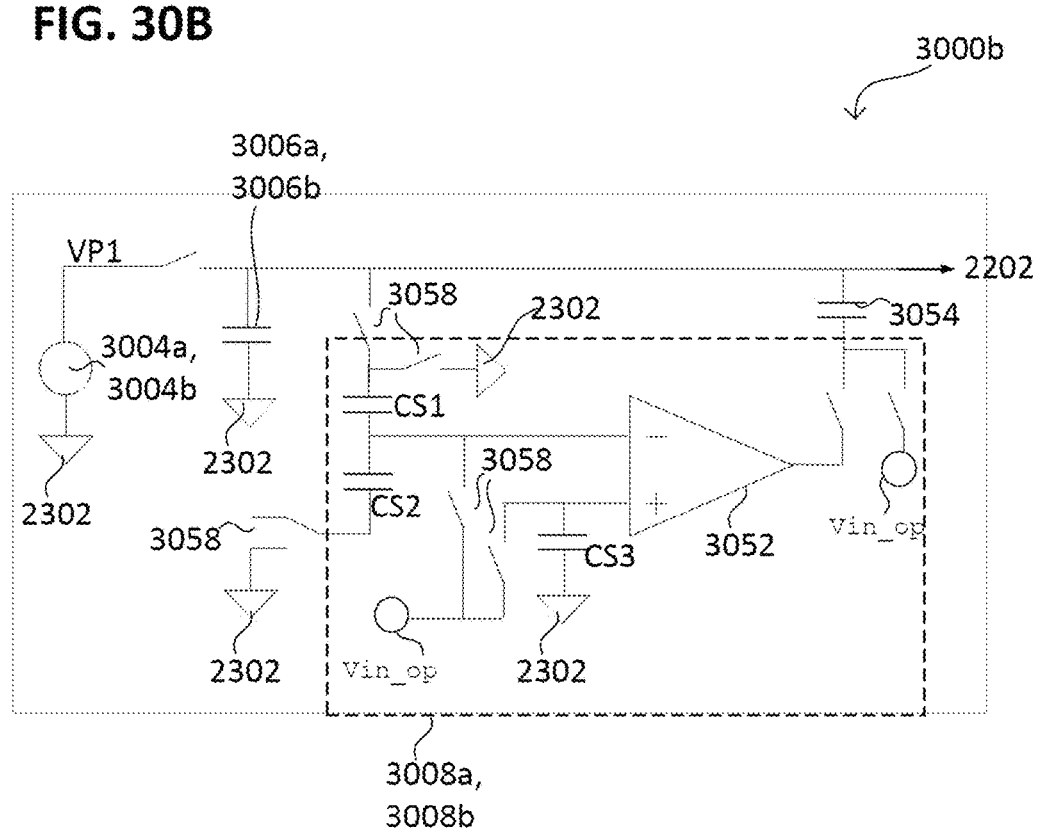

FIG. 30B illustrates a measuring arrangement 3000b in accordance with various embodiments in a schematic circuit diagram, said measuring arrangement including one of the voltage regulators 3008a, 3008b.

The voltage regulator 3008a, 3008b can be capacitively coupled to the measuring bridge and/or to the at least one first charge storage 3006a or the at least one second charge storage 3006b, e.g. by means of the capacitive component 3054 (e.g. a capacitor).

The voltage regulator 3008a, 3008b may include an amplifier 3052 (e.g. including a comparator). Furthermore, the voltage regulator 3000b may include a plurality of capacitors CS1 (e.g. having approximately 350 femtofarads (IF)), CS2 (e.g. having approximately 2.77 picofarads (pF)), and CS3 (e.g. having approximately 3 pF), which are connected among one another and to the amplifier 3052 by means of switches 3508.

If the charge storage 3008a, 3008b (the at least one first charge storage 3006a or the at least one second charge storage 3006b) is charged to VP1 (e.g. to Vin_op+vk/2, e.g. Vin_op+9 volts) or VP2 (e.g. to Vin_op−vk/2, e.g. to Vin_op−9 volts), it is decoupled from the charge pump 3004a, 3004b (e.g. in a manner controlled by means of the amplifier 3052). Afterward, the voltage regulator 3008a, 3008b regulates the electrical potential of the charge storage 3006a, 3006b to a predefined value (e.g. to Vin_op−vbias or Vin_op+vbias). By means of coupling the charge storages 3006a, 3006b to the measuring bridge 2202, the electrical voltage of the charge storages 3006a, 3006b is scaled to the electrical potential associated with the electrical working voltage (e.g. to Vin_op−vbias or Vin_op+vbias).

FIG. 31 illustrates a signal profile 3100 in accordance with various embodiments in a schematic diagram illustrating a signal characteristic 801 (e.g. an electrical voltage of the signal, in arbitrary units) against time 803 (in arbitrary units).

Lines 3102 in each case represent the temporal profile of the signal (e.g. the electrical voltage thereof) at the nodes VB1 and VB2 of the measuring bridge 2202. The signals 3102 at the nodes VB1 and VB2 can be switched over twice between VP1 and VP2 in the chopper cycle 3102a. The rate of rise of the electrical potential change 3102b of the signals 3102 can be configured in such a way that the latter overlap in time (also referred to as temporal fit), that is to say that the switches are simultaneously (i.e. in the switching interval 3110) in a switching process.

Line 3104 represents the temporal profile of the signal (e.g. the electrical voltage thereof of e.g. approximately 1 volt or more) at the input of the amplifier 2204 (without signal from the micromechanical sensor), which has a signal-to-noise ratio of more than approximately $10^5$ (e.g. more than approximately $10^6$) and/or noise (e.g. electrical voltage spikes) of less than approximately 200 millivolts (mV) e.g. less than approximately 100 millivolts.

Lines 3106 in each case represent the temporal profile of the signal (e.g. the electrical voltage thereof) which is coupled out by the amplifier 2204, e.g. on the basis of a signal generated by means of the micromechanical sensor.

Lines 3108 in each case represent the temporal profile of a signal (e.g. the electrical voltage thereof) which is generated by means of the micromechanical sensor.

Figure 32:
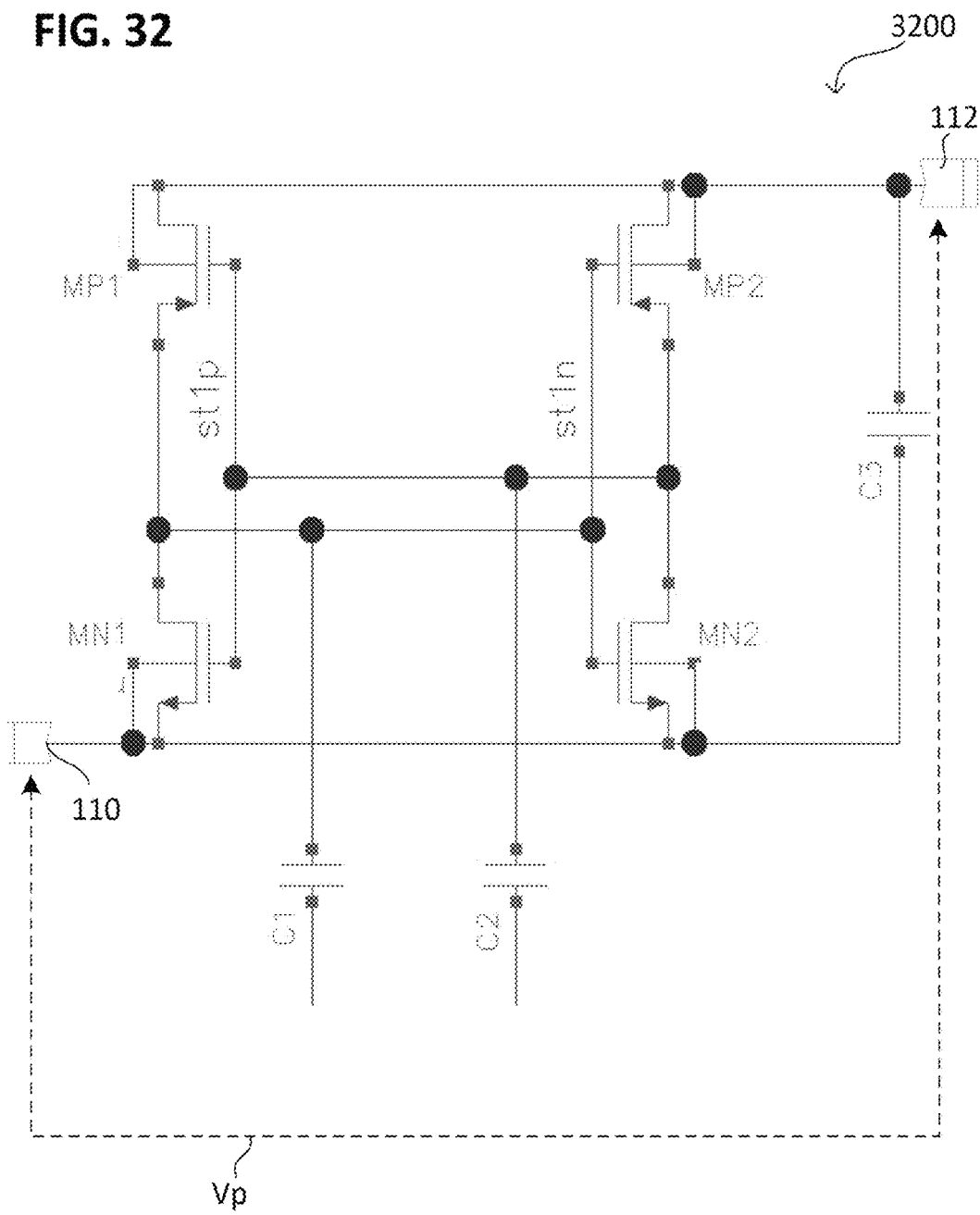
FIGS. 32 and 34 respectively show a charge pump stage in accordance with various embodiments in a schematic circuit diagram.

FIG. 32 illustrates a charge pump stage 3200 in a Pelliconi circuit architecture in accordance with various embodiments in a schematic circuit diagram, i.e. a Pelliconi charge pump stage 3200. A charge pump in a Pelliconi circuit architecture may include or be formed from one or a plurality of series-interconnected charge pump stages in a Pelliconi circuit architecture.

In accordance with various embodiments, the charge pump stage 3200 may include a latch, e.g. a CMOS latch. The latch may include two cross-connected inverters (first inverter MP1, MN1 and second inverter MP2, MN2) and two charge storages C1, C2.

The first inverter MP1, MN1 and the second inverter MP2, MN2 of the latch can be pumped by means of the charge storages C1, C2 (e.g. each including one or a plurality of capacitors, also referred to as pump capacitors). Complementary signals (i.e. signals configured in a push-pull fashion), e.g. clock signals, can be coupled into the charge storages C1, C2. The charge pump stage 3200 can be configured for generating a positive electrical voltage swing Vp (e.g. of approximately VDD), i.e. the electrical potential difference Vp between input 110 and output 112 (but may not be suitable for generating a negative electrical voltage swing).

In load-free operation, the entire generated electrical voltage swing of a charge pump (e.g. of the Pelliconi charge pump) can correspond to the positive electrical voltage swing Vp times the number of its series-interconnected charge pump stages 3200.

Maximally an electrical voltage of Vp is dropped across the switches MP1, MN1, MP2, MN2 (each e.g. including or formed from a transistor). However, the n-channel switches MN1, MN2 require an insulated p-type well (also referred to as p-well) and/or the p-channel switches MP1, MP2 require an insulated n-type well (also referred to as n-well). Only the insulated p-type well and/or n-type well and the pump capacitors C1, C2 have to have a higher electrical dielectric strength than the Vp. In specific cases, for this purpose it is possible to generate a negative electrical voltage (which is applied e.g. to the substrate) while the substrate of the charge pump stage 3200 remains or is grounded (e.g. at 0 volts). Conventional CMOS technology, e.g. on the basis of a p-doped substrate, can, by means of the substrate, provide an insulated p-type well (e.g. by means of a triple well), but cannot provide an insulated n-type well for negative voltages (e.g. a negative charge pump). Therefore, it is not possible or it is possible only with difficulty to apply a negative electrical voltage to the insulated n-type well.

Figure 33A:
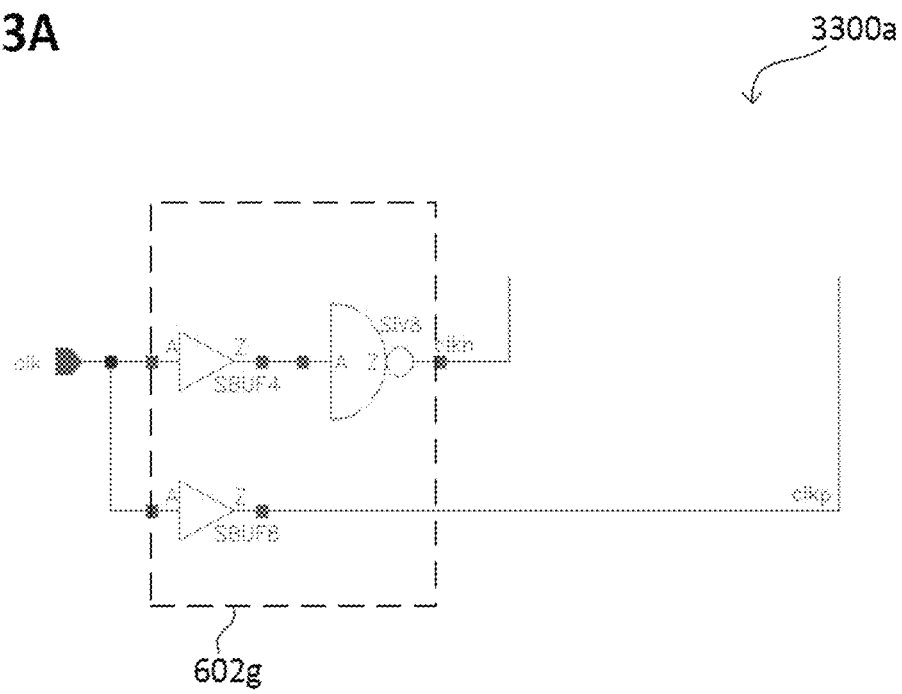
FIGS. 33A and 33B respectively show a control circuit in accordance with various embodiments in a schematic circuit diagram.
Figure 33B:
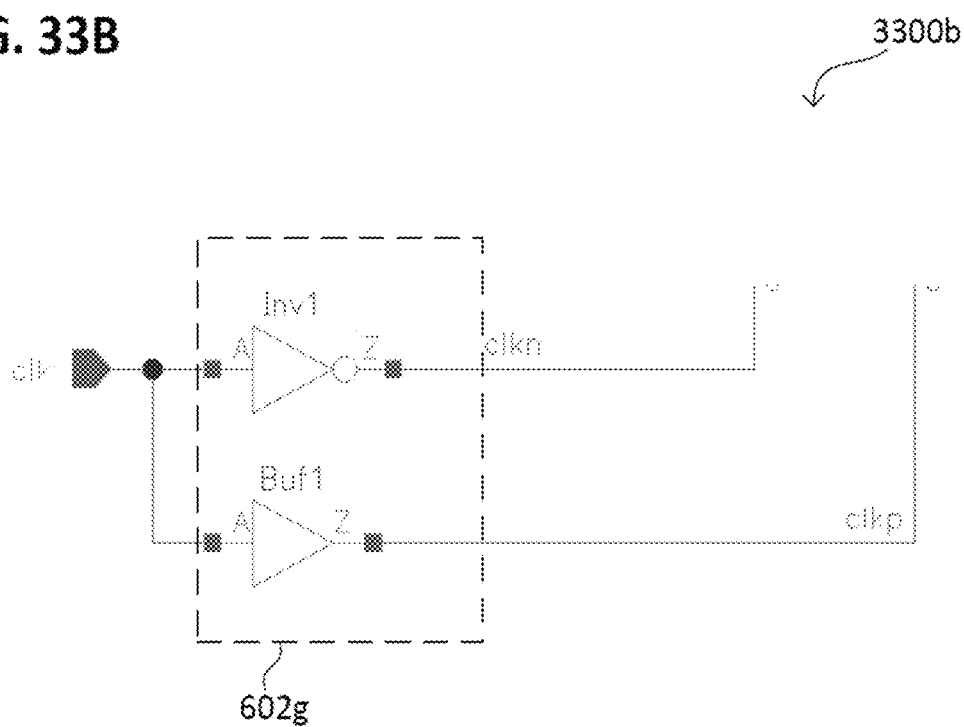

FIG. 33A and FIG. 33B respectively illustrate a control circuit 3300a, 3300b in accordance with various embodiments in a schematic circuit diagram.

The control circuit 3300a, 3300b may include a push-pull generator 602g. On the input side, a control signal clk (e.g. generated by means of a clock generator), e.g. a basic control signal (e.g. a reference clock), can be coupled into the control circuit 3300a, 3300b. The control circuit 3300a, 3300b can be configured for providing two complementary control signals clkp, clkn (e.g. a first control signal clkn and a second control signal clkp complementary thereto), i.e. which oscillate in a push-pull fashion.

Figure 34:
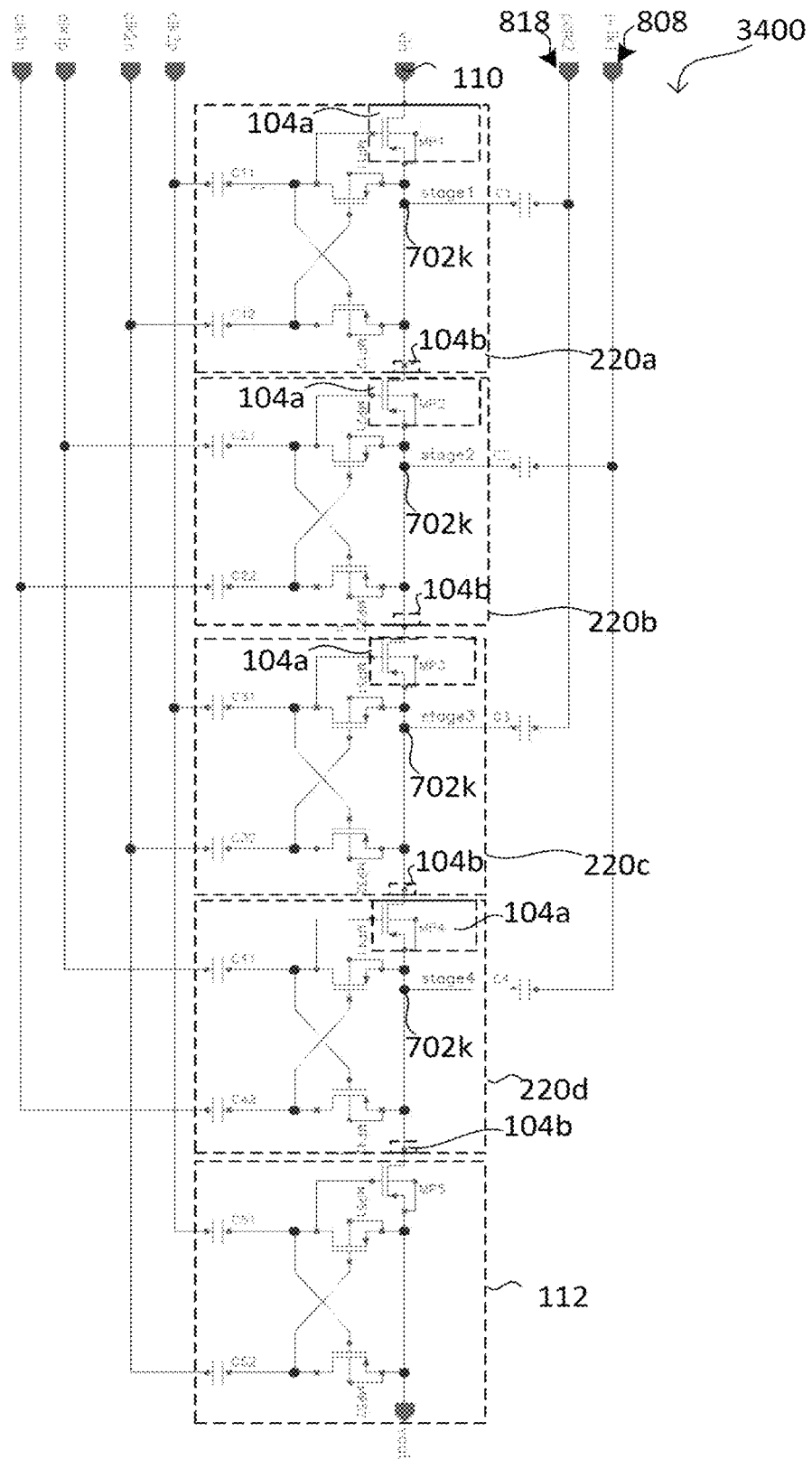

FIG. 34 illustrates a charge pump 3400 in a Dickson circuit architecture in accordance with various embodiments in a schematic circuit diagram, i.e. a Dickson charge pump 3400.

The charge pump 3400 is illustrated in FIG. 34 with four charge pump stages 220a, 220b, 220c, 220d interconnected in series. In accordance with various embodiments, the charge pump 3400 can alternatively include fewer than four charge pump stages 220a, 220b, 220c, 220d (e.g. one, two or three charge pump stages 220a, 220b, 220c, 220d) or more than four charge pump stages 220a, 220b, 220c, 220d.

The switches MP0, MP1, MP2, MP3, MP4, MP5, MP11, MP12, MP21, MP22, MP31, MP32, MP41, MP42, MP51, MP52 of the switch structure 104 (e.g. each including or formed from a transistor) may include the same conduction type (e.g. re-channel or p-channel) and/or be driven by means of four control signals clk2p, clk2n, clk1p, clk1n. The two control signals clk2p, clk2n can be configured in a push-pull fashion (i.e. be configured in a complementary fashion) and/or the two control signals clk1p, clk1n can be configured in a push-pull fashion.

Respectively complementary control signals pclk1, pclk2 can be coupled into the charge storages C1, C2, C3, C4 of successive charge pump stages 3400.

Optionally, as described above, a second switch 104b can be connected between each charge storage C1, C2, C3, C4 and the downstream charge pump stage. If the second switches 104b are omitted, it may be necessary for the first switches 104a to have a greater electrical dielectric strength, e.g. at least double the electrical voltage Vp generated per charge pump stage 220a, 220b, 220c, 220d (e.g. twice VDD).

In the case e.g. where a negative electrical voltage swing is intended to be generated, it is possible to use a Dickson charge pump 3400 or the Dickson charge pump stages 220a, 220b, 220c thereof, as described herein. The Dickson charge pump (or the charge pump stages thereof) makes it possible to reduce the electrical voltage loss of Vth per charge pump stage of the charge pump, e.g. by using an actively controlled switch structure 104 (cf. FIG. 1), e.g. by NMOS switches 104b actively controlled by means of a control signal. For controlling the switch structure 104, the four control signals clk2p, clk2n, clk1p, clk1n can be coupled in, e.g. coupled in capacitively by means of capacitors C11, C12, C21, C22, C31, C32, C41, C42.

On account of the circuit architecture of the self-charging Dickson charge pump 3400, it may be necessary that the transistors thereof must withstand double the electrical supply voltage. For a large electrical supply voltage (e.g. more than 0.5 volt), high-voltage transistors are therefore required for the Dickson charge pump, which transistors, in comparison with low-voltage transistors, usually increase tenfold the required area occupation of the Dickson charge pump (i.e. the required chip area) and increase the power consumption thereof. The use of high-voltage transistors can likewise necessitate internal feedback for the control blocks (e.g. by means of a Bootstrap circuit), since these usually have a greater electrical threshold voltage and a poorer GM. Alternatively, a lower electrical supply voltage (e.g. less than 0.5 volt) can be used. In return, this can be compensated for by means of a larger number of charge pump stages, which in turn increase the required area occupation of the Dickson charge pump and the power consumption thereof.

Figure 35:
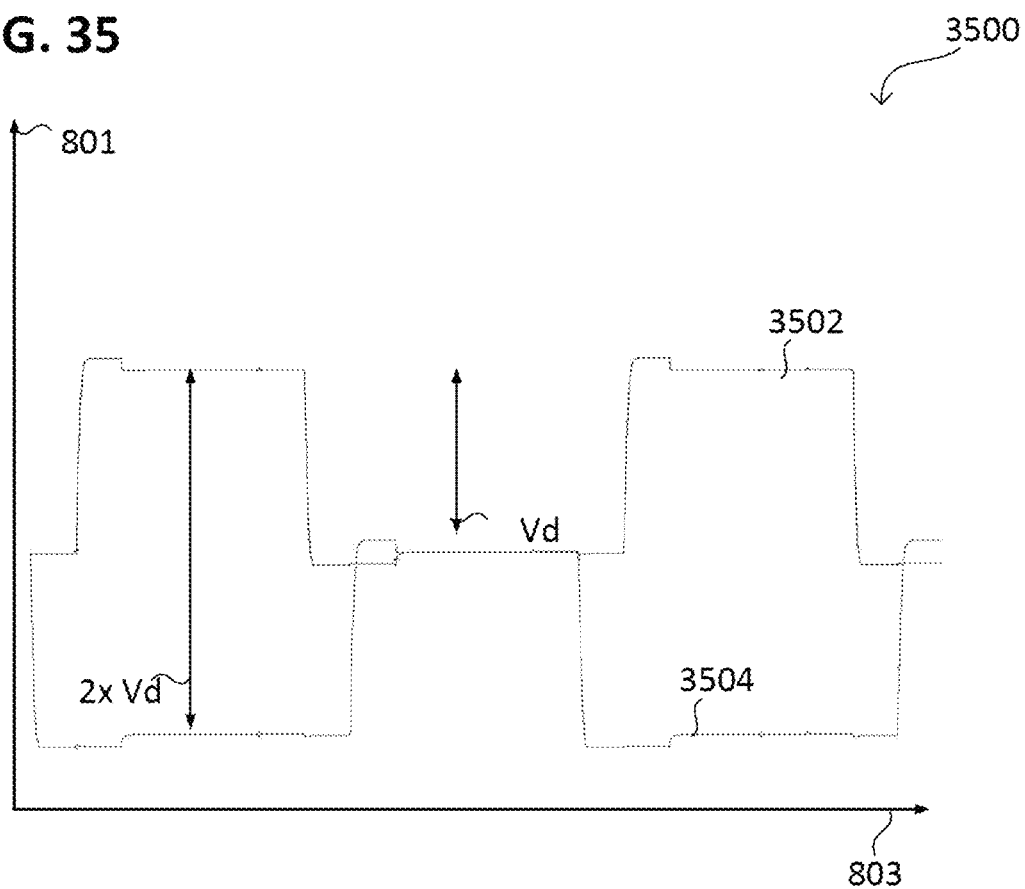
FIGS. 35 and 37 respectively show a signal profile in accordance with various embodiments in a schematic diagram.

FIG. 35 illustrates a signal profile 3500 in accordance with various embodiments in a schematic diagram illustrating a signal characteristic 801 (e.g. an electrical voltage of the signal, in arbitrary units) against time 803 (in arbitrary units), e.g. without second switches 104b.

The signal characteristic 3502 of the charge storage node 702k of the first charge pump stage 220a and/or of the third charge pump stage 220c can progress in accordance with the coupled-in charge transfer signal 808 (cf. FIG. 8 and FIG. 10). The signal characteristic 3504 of the charge storage node 702k of the second charge pump stage 220b and/or of the third charge pump stage 220d can progress in accordance with the (e.g. capacitively) coupled-in charge transfer signal 818. The electrical voltage difference between the charge storage node 702k of two successive charge pump stages can correspond approximately to double the electrical voltage difference Vd provided per charge pump stage. If the peak-to-valley value of the charge transfer signals 808, 818 is approximately VDD (e.g. approximately 1.5 volts), the electrical voltage difference between the charge storage nodes 702k of two successive charge pump stages can be approximately double VDD.

If a second switch 104b (e.g. a controlled NMOS switch) is connected between the charge storage of a charge pump stage and the downstream charge pump stage, the required electrical dielectric strength of the switches 104a, 104b (first switch 104a and second switch 104b) can be reduced, e.g. to a maximum of Vd. In other words, the charge storage of the charge pump stage can be decoupled from the input 110 and output 112 thereof by means of the switches 104a, 104b. Thus, the charge pump stage can be formed with low-voltage transistors having a smaller size. In return, this necessitates double the amount of switches 104a, 104b and an additional control signal for controlling the second switches 104b per charge pump stage or per partial stage, which, however, can be reused for the complementary charge pump stages. By way of example, the switches 104a, 104b which are connected between the charge storages of adjacent charge pump stages can be driven by means of a common control signal.

In accordance with various embodiments, a or each charge pump stage (more generally a or each partial stage) can be configured as scalable. In other words, a charge pump may include one or a plurality of charge pump stages (more generally one or a plurality of partial stages) whose operated number of charge pump stages (more generally partial stages) can be set (e.g. regulated and/or controlled) (e.g. during operation of the charge pump), e.g. by means of a configuration bit. Alternatively or additionally, a charge pump may include one or a plurality of charge pump stages (more generally one or a plurality of partial stages) whose charge storage (in terms of the capacitance thereof) can be set (e.g. regulated and/or controlled) (e.g. during operation of the charge pump), e.g. by means of an additional configuration bit.

Independently of the use of the second switches 104b, the charge pump may require two complementary charge transfer signals pclk1, pclk2 for the even and odd charge pump stages. A or each charge pump stage may include or be formed from exactly one partial stage or two partial stages interconnected in parallel. Independently of the use of the second switches 104b, the or each charge pump stage may require two complementary charge transfer signals pclk1, pclk2 for the two partial stages interconnected in parallel. If two partial stages interconnected in parallel are used for the or each charge pump stage, it is possible to reduce the ripple of the coupled-out signal (illustratively since this enables a charge transfer per half charge transfer cycle).

Independently of whether a charge pump includes exactly one partial stage or two partial stages per charge pump stage, it may require the same capacitance of the charge storage or charge storages per charge pump stage. Illustratively, the sum of the capacitance of the charge storages of the two partial stages interconnected in parallel may be of just the same magnitude as the capacitance of the charge storage if exactly one partial stage is used instead of the two partial stages interconnected in parallel. By way of example, the charge storage of the exactly one partial stage may include two capacitors interconnected in parallel with one another. It is thus possible to maintain the area occupation for the charge storage per charge pump stage.

In accordance with various embodiments, a Dickson charge pump can be used instead of a Pelliconi charge pump, e.g. for providing a positive electrical voltage (for example if no insulated p-type well is available for the NMOS switches).

Figure 36A:
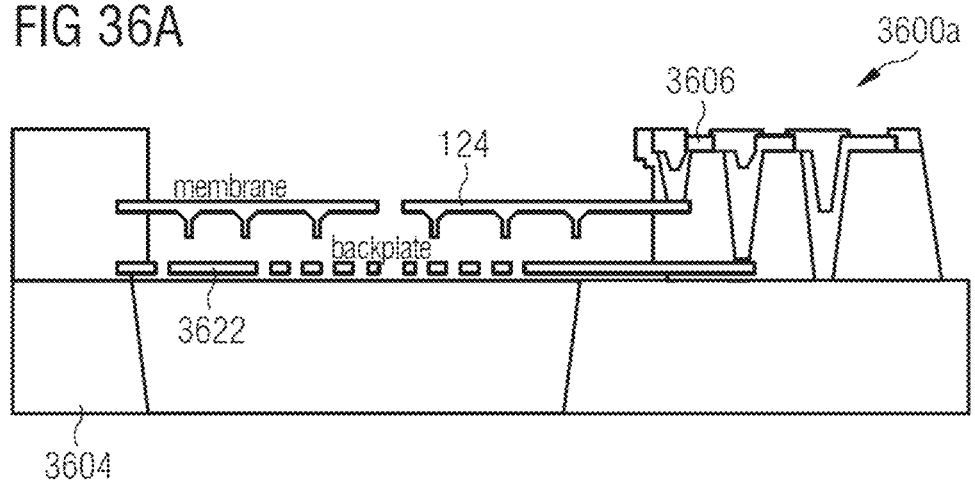
FIGS. 36A, 36B and 36C respectively show a micromechanical sensor in accordance with various embodiments in a schematic cross-sectional view.
Figure 36B:
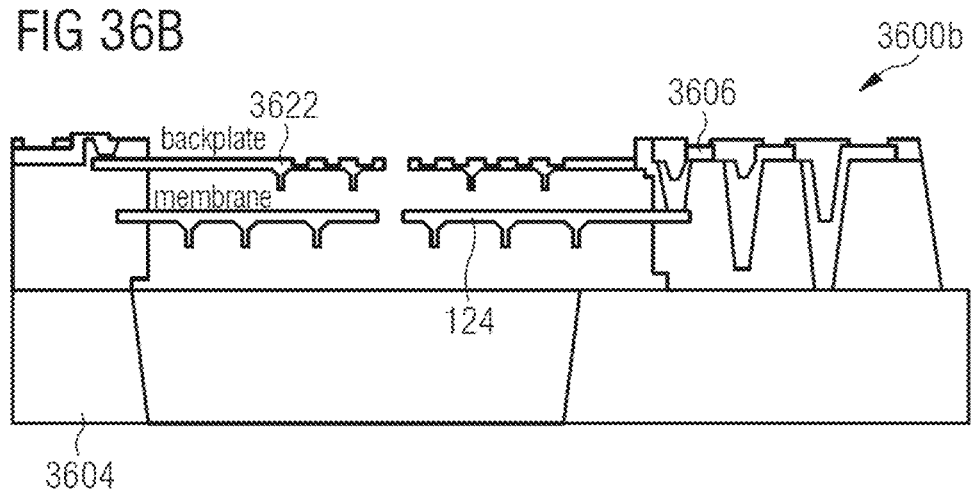
Figure 36C:
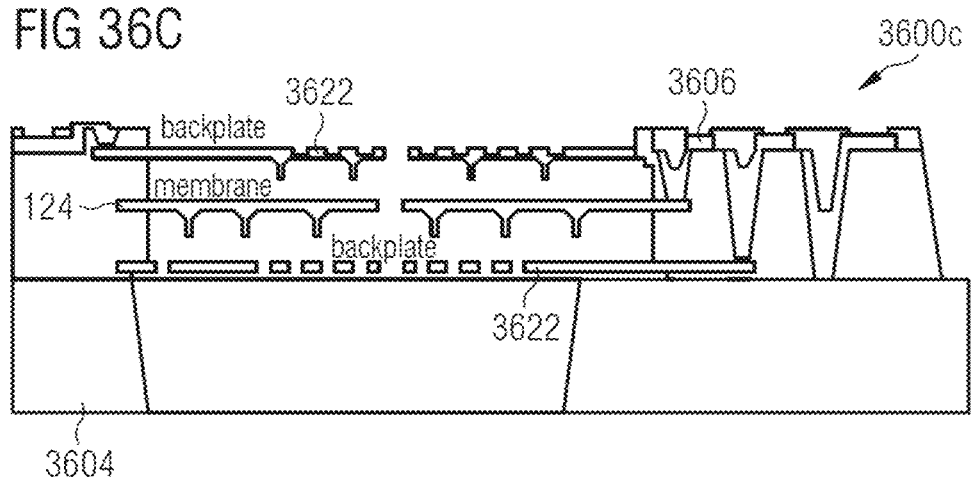

FIG. 36A, FIG. 36B and FIG. 36C respectively illustrate a micromechanical sensor 3600a, 3600b, 3600c in accordance with various embodiments in a schematic cross-sectional view.

The micromechanical sensor 3600a (more generally micromechanical sensor or MEMS sensor) can be configured for converting between mechanical energy and electrical energy. By way of example, the micromechanical sensor 3600a can convert a mechanical signal into an electrical signal, and vice versa.

The micromechanical sensor 3600a may include a substrate 3604 (e.g. a semiconductor substrate, e.g. including or formed from silicon), a membrane 124 and at least one backplate 3622 (e.g. one backplate 3622 or two backplates 3622). The membrane 3624 can be separated from the at least one backplate 3622 by means of a gap, e.g. by means of an air gap, and can be carried (e.g. in physical contact) by the substrate.

The membrane 124 and the or each backplate 3622 can form a capacitive component that provides a capacitance of the sensor. If the membrane 124 oscillates, e.g. in a manner excited by a mechanical signal, the or each capacitance of the sensor can correspondingly change, which can be detected by means of an electrical contact structure 3606 (e.g. including or formed from a metal).

Figure 37:
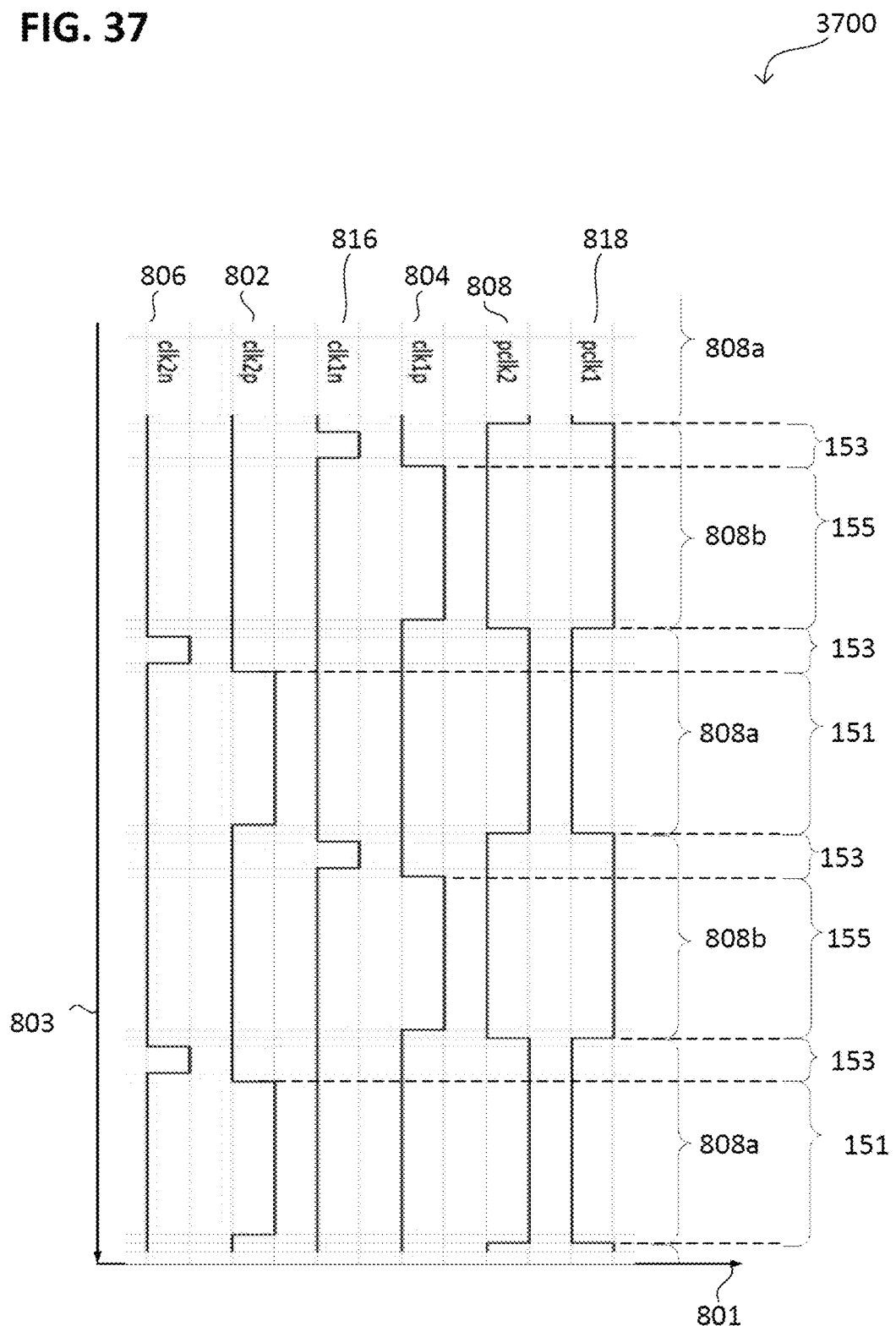

FIG. 37 illustrates a signal profile 3700 in accordance with various embodiments in a schematic diagram illustrating a signal characteristic 801 (e.g. an electrical voltage of the signal, in arbitrary units) against time 803 (in arbitrary units).

In the second partial stage phase 153 of the first cycle section 808a and the second partial stage phase 153 of the second cycle section 808b, the second control signal 804 and the first control signal 802 can correspond in their state (a low state, illustratively an open state), such that the charge storage is decoupled from the input and an output of the charge pump stage. In the first partial stage phase 151 and in the third partial stage phase 155, the second control signal 804 and the first control signal 802 can differ from one another in their state (illustratively one in a low state and one in a high state).

The first control signal 802 (clk2p) and the optional second control signal 804 (clk1p) can be offset with respect to one another by the duration of the first cycle section 808a (e.g. by one cycle half). The third control signal 806 (clk2n) and the optional additional third control signal 816 (clk1n) can be offset with respect to one another by the duration of the first cycle section 808a (e.g. by one cycle half). The fourth control signal 808 (pclk or pclk1) and the optional additional fourth control signal 818 (pclk2) can be configured in a push-pull fashion.

The fourth control signal 808 (pclk or pclk1) and the optional additional fourth control signal 818 (pclk) can each be a charge transfer signal ("power pumping clock") and/or be capacitively coupled to that of the internal electrical voltage (also as "Vint", "Vint1" or "Vint2"). The first control signal 802 (clk2p) can be capacitively coupled to the electrical gate voltage ("vg2p") of the first transistor M2 and/or to the electrical gate voltage ("vg2p2") of the additional second transistor M16 (i.e. coupled into them). The second control signal 804 (clk1p) can be capacitively coupled to the electrical gate voltage ("vg1p2") of the second transistor M6 and/or to the electrical gate voltage ("vg1p") of the additional first transistor M12 (i.e. coupled into them) (cf. FIG. 7 and FIG. 9).

The third control signal 806 (clk2n) can be an optional auxiliary signal and can be coupled to the electrical gate voltage ("vg2n") of the third transistor M4 (i.e. coupled into the latter). The additional third control signal 816 (clk1n) can be an additional optional auxiliary signal and can be coupled to the electrical gate voltage ("vg1n") of the additional third transistor M14 (i.e. coupled into the latter).

The first switch 104a (e.g. transistor M2 and/or transistor M12) can be a power switch for transferring electrical charge from the input 110 to the charge storage 102a, 102b (or to the charge transfer node 702k), e.g. if or as long as the first control signal 802 (clk2p) has a high state.

The second switch 104b (e.g. transistor M1 and/or transistor M11) can be a power switch for transferring electrical charge from the charge storage 102a, 102b (or the charge transfer node 702k) to the output 112, e.g. if or as long as the second control signal 804 (clk1p) has a high state.

The first leveling circuit 104d, 104c, 104e, e.g. its fifth switch 104e (e.g. transistor M3 and/or transistor M13), can be configured for discharging the control input of the first switch 104a (e.g. the electrical gate voltage thereof), e.g. if or as long as the fourth control signal 808 (pclk1) or the additional fourth control signal 818 (pclk2) has a low state.

The first leveling circuit 104d, 104c, 104e, e.g. its third switch 104c (e.g. transistor M4 and/or transistor M14), can be configured for discharging the control input of the first switch 104a (e.g. the electrical gate voltage thereof), e.g. if or as long as the third control signal 806 (clk2n) or the additional third control signal 816 (clk1n) has a high state, e.g. if or as soon as the fourth control signal 804 (pclk2) or the additional fourth control signal 814 (pclk2) has a high state.

The first leveling circuit 104d, 104c, 104e, e.g. its fourth switch 104d (e.g. transistor M5 and/or transistor M15), can be configured for discharging the control input of the third switch 104c (e.g. the electrical gate voltage thereof), e.g. if or as long as the first control signal 802 (clk2p) has a high state, e.g. if or as soon as the first switch 104a is closed.

The second leveling circuit 104f, e.g. its sixth switch 104f (e.g. transistor M6 and/or transistor M16), can be configured for discharging the control input of the second switch 104*b* (e.g. the electrical gate voltage thereof), e.g. if or as long as the fourth control signal 808 (clk2*p*) or the additional fourth control signal 818 (clk1*p*) has a high state, e.g. if or as soon as the second switch 104*b* is open or is opened.

The high state of the third control signal 806 (clk2*n*) or of the additional third control signal 816 (clk1*n*), in other words the closed state of the third switch 104*c*, in conjunction with the high state of the first control signal 802 (clk2*p*), in other words the closing of the first switch 104*a*, can make it possible to change the control input (or the electrical potential thereof) of the first switch 104*a* (vg2*p*) in two steps in each case by VDD.

If a second partial stage phase 153 is used in which the first switch 104*a* and the second switch 104*b* are simultaneously in a switching process, the first control signal 802 (clk2*p*) can be configured in a common-mode fashion with respect to the first charge transfer signal 808 (pclk1 or pk1*c*). Alternatively or additionally, the optional (if present) second control signal 804 (clk1*p*) can be configured in a common-mode fashion with respect to the (if present) second charge transfer signal 818 (pclk2) and/or be configured in a push-pull fashion with respect to the first control signal 802 (clk2*p*).

Figure 38A:
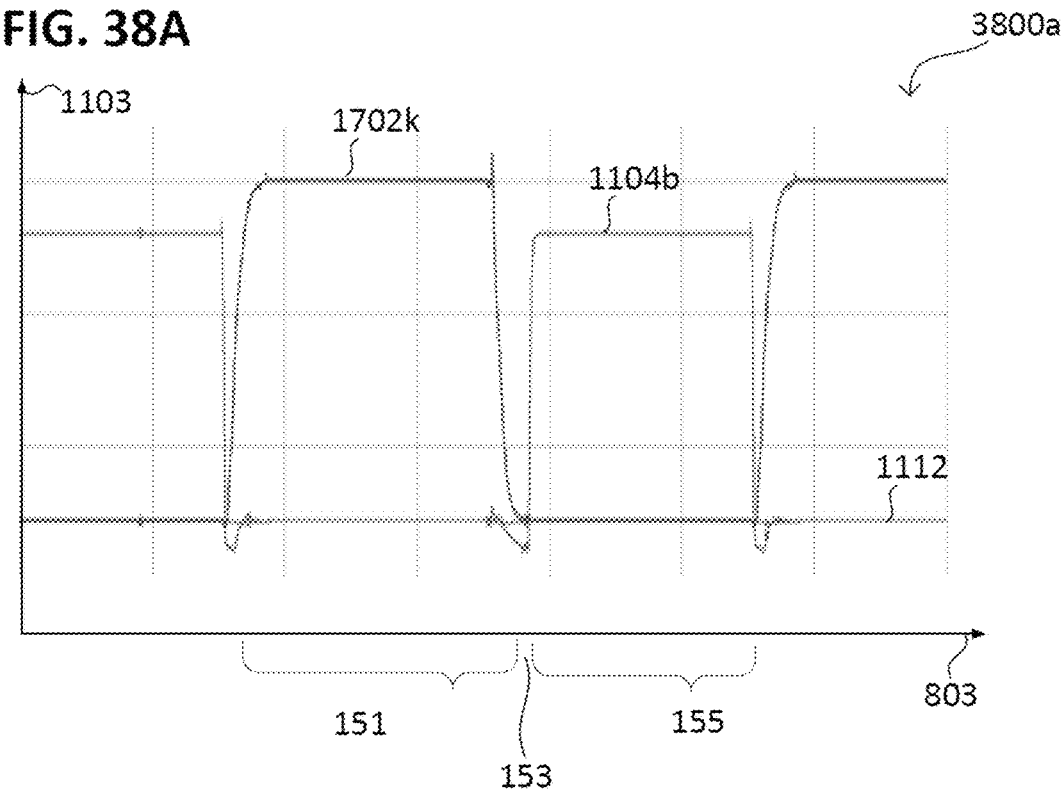
FIGS. 38A and 38B respectively show an electrical potential profile in accordance with various embodiments in a schematic diagram.
Figure 38B:
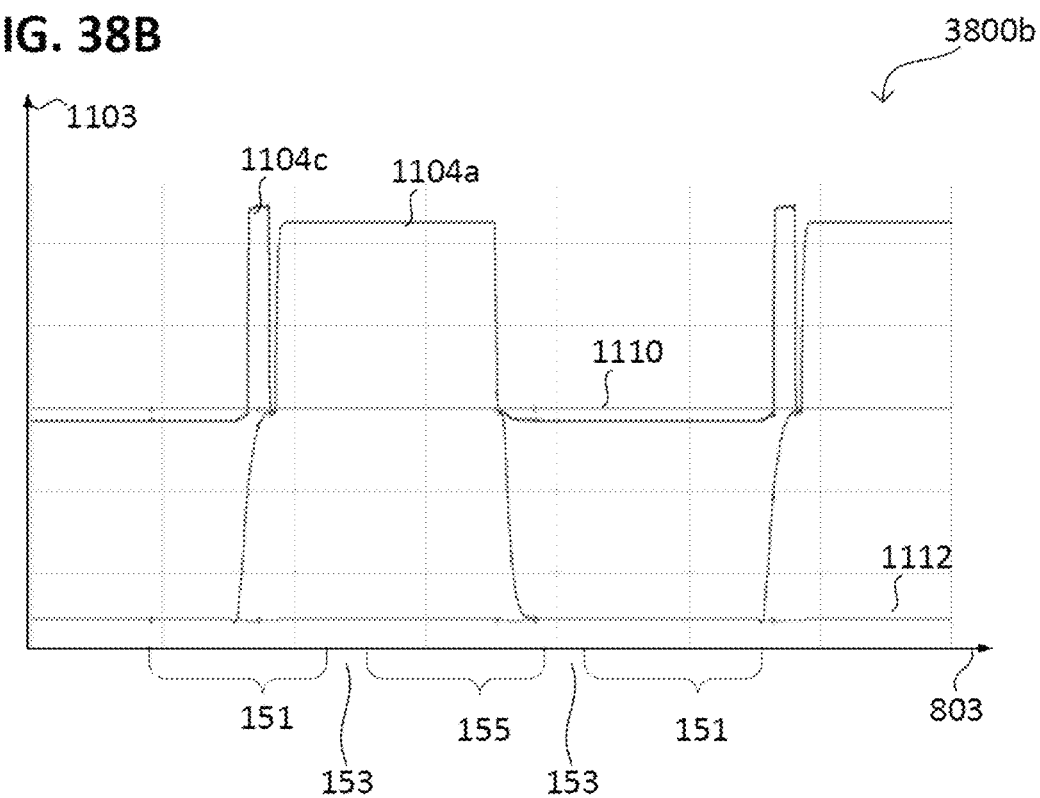

FIG. 38A and FIG. 38B respectively illustrate an electrical potential profile 3800*a*, 3800*b* in accordance with various embodiments in a schematic diagram, analogously to FIG. 12A, for example in a non-loaded state of the charge pump stage, wherein the electrical potential 1104*c* of the third switch 104*c*, e.g. at the control input thereof, can have its high state before the electrical potential 1104*a* of the first switch 104*a*.

Figure 39:
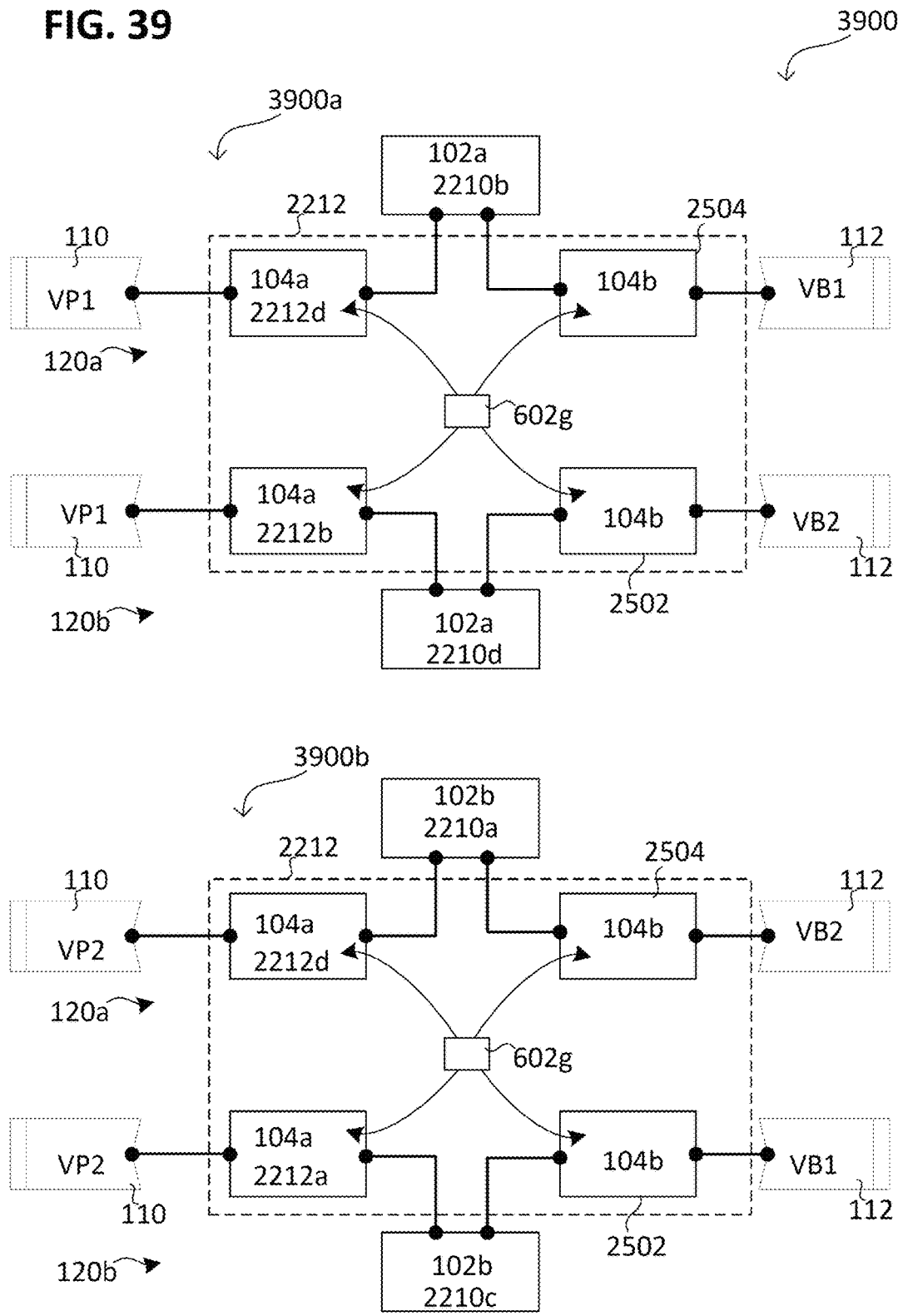
FIG. 39 shows a chopper in accordance with various embodiments in a schematic circuit diagram.

FIG. 39 illustrates a chopper 3900 in accordance with various embodiments in a schematic circuit diagram analogously to FIG. 25.

The chopper may include a first charge pump stage 3900*a* and optionally a second charge pump stage 3900*b*, which can each include two partial stages 120*a*, 120*b*. The second switches 104*b* of the or each charge pump stage 3900*a*, 3900*b* can be cross-connected and driven in such a way that these interchange the output terminals 112 (node VB1 and node VB2) with one another in the case of successive third partial stage phases 155.

The first switch 104*a* and the second switch 104*b* of the or each partial stage 120*a*, 120*b* of the or each charge pump stage 3900*a*, 3900*b* can be driven by means of a push-pull generator 602*g*. The push-pull generator 602*g* may include one level shifter or a plurality of level shifters as described herein.

In accordance with various embodiments, a circuit architecture for a chip and the circuit modules thereof are provided which reduce the power consumption and enable a more accurate timing control, greater edge steepness and/or a greater signal-to-noise ratio, e.g. a signal-to-noise ratio (also designated as SNR) of at least 75 dB (decibels). Illustratively, the circuit architecture makes it possible to generate a greater electrical DC voltage on the chip itself (on-chip generation), by means of which an amplifier circuit and/or signal chain of the chip can be supplied, such that the upper limit for the SNR is increased. An illustratively particularly low-noise measuring arrangement can be realized by means of the circuit architecture.

Illustratively, in accordance with various embodiments, an electrical mixed voltage source for the electrical supply of the signal chain is provided which provides an electrical mixed voltage having a peak-to-valley value of greater than double the electrical supply voltage, e.g. of more than 6 volts.

Illustratively, in accordance with various embodiments, a charge pump stage and a charge pump for the circuit architecture, e.g. for the electrical mixed voltage source, are provided, which requires a lower chip area and/or which has a lower power consumption. The charge pump stage or charge pump can be configured for generating a negative electrical voltage and/or be produced completely in one conduction type (e.g. p-type or n-type). Alternatively or additionally, the required electrical dielectric strength of the switches incorporated therein can be reduced. Illustratively, the charge pump stage or charge pump provided makes it possible to halve the electrical drain-source voltage, such that the full electrical voltage swing of the charge storage can be used for charge pumping.

Illustratively, in accordance with various embodiments, a level shifter circuit for the circuit architecture, e.g. for the chopper thereof, is provided, which requires a smaller chip area and/or has a lower power consumption.

In accordance with various embodiments, a measuring arrangement may include the following: a micromechanical sensor including a capacitance; a bridge circuit including a plurality of capacitances, at least one capacitance of which is the capacitance of the micromechanical sensor (that is to say that the latter represents the micromechanical sensor); an amplifier coupled, on the input side, to an output of the bridge circuit; an electrical DC voltage source configured to provide an electrical DC voltage; a chopper including at least one first charge storage and a switch structure; wherein the switch structure is configured to couple the first charge storage alternately to the electrical DC voltage and the bridge circuit for the purpose of coupling an electrical mixed voltage into the bridge circuit.

In accordance with various embodiments, a measuring arrangement may include the following: a micromechanical sensor including a capacitance; a bridge circuit including a plurality of capacitances, at least one capacitance of which is the capacitance of the micromechanical sensor; an amplifier coupled, on the input side, to an output of the bridge circuit and including an electrical working voltage; an electrical mixed voltage source configured to couple an electrical mixed voltage having a peak-to-valley value of more than the electrical working voltage (e.g. more than 6 volts) into the bridge circuit, e.g. of more than double the electrical working voltage, e.g. of more than triple the electrical working voltage. Alternatively or additionally, the working voltage can also be a working voltage of the micromechanical sensor, of the logic of a chip in which the measuring arrangement is implemented, and/or a charge pump of the measuring arrangement.

In accordance with various embodiments, the micromechanical sensor can have a working voltage; wherein the mixed voltage source is configured to provide the electrical mixed voltage having a peak-to-valley value of approximately double the working voltage.

In accordance with various embodiments, the mixed voltage source may include a first charge pump, which is configured to provide a first electrical potential of a DC voltage.

In accordance with various embodiments, the mixed voltage source may include at least one second charge pump, which is configured to provide a second electrical potential of the DC voltage.

In accordance with various embodiments, the mixed voltage source may include a switch structure configured to discharge the capacitances (e.g. a plurality of capacitors) if the mixed voltage has reached its extreme value.

In accordance with various embodiments, the mixed voltage source may include or be formed from a chopper and/or a DC voltage source.

In accordance with various embodiments, the mixed voltage source may include a DC voltage source configured to provide an electrical DC voltage.

In accordance with various embodiments, the mixed voltage source may include a chopper including at least one first charge storage and a switch structure; wherein the switch structure is configured to couple the first charge storage alternately to the DC voltage and the bridge circuit for the purpose of coupling an electrical mixed voltage into the bridge circuit.

In accordance with various embodiments, the mixed voltage source may include a switch structure configured to discharge the plurality of capacitances (e.g. a plurality of capacitors) if the mixed voltage has reached its extreme value.

In accordance with various embodiments, the electrical mixed voltage can have a peak-to-valley value of approximately 6 volts or more (e.g. of approximately 8 volts or more, e.g. of approximately 10 volts or more, e.g. of approximately 12 volts or more, e.g. of approximately 14 volts or more, e.g. of approximately 16 volts or more, e.g. of approximately 18 volts or more) and/or approximately 30 volts or less.

In accordance with various embodiments, the electrical supply voltage can be a DC voltage and have approximately 5 volts or less (e.g. approximately 4 volts or less, e.g. approximately 3 volts or less, e.g. approximately 2 volts or less, e.g. approximately 1.5 volts or less, e.g. approximately 1 volt) and/or approximately 0.5 volt or more.

The electrical supply voltage can be present at the charge pump, at a processor (e.g. the logic thereof) and/or at the micromechanical sensor) at the measuring arrangement.

The micromechanical sensor may include or be formed from a pressure sensor (e.g. for measuring a tire pressure or air pressure) and/or a sound sensor (or to put it more generally: a sound transducer). Alternatively, the micromechanical sensor may include or be formed from an acceleration sensor, a chemical sensor (e.g. a moisture sensor and/or a gas sensor), a force sensor, a position sensor, a particle sensor, a filling level sensor and/or gas sensor).

In accordance with various embodiments, the chopper can be configured to provide in a settled state at least one of the following: noise of the electrical mixed voltage of less than 200 µV (e.g. given a peak-to-valley value of the electrical mixed voltage of exactly 18 volts or more); a signal-to-noise ratio of the electrical mixed voltage of less than $10^5$; and/or noise of the electrical mixed voltage of less than $10^{-5}$ of a peak-to-valley value of the electrical mixed voltage.

In accordance with various embodiments, the chopper can be configured to provide in a settled state a first harmonic of the electrical mixed voltage having a peak-to-valley value of less than 200 µV (microvolts) and/or less than $10^{-5}$ of the peak-to-valley value of the electrical mixed voltage.

In accordance with various embodiments, the chopper can be configured to provide the electrical mixed voltage having a trapezoidal characteristic (e.g. rectangular characteristic) and/or a triangular characteristic. The trapezoidal characteristic (e.g. the rectangular characteristic) can deviate slightly from an ideal geometrical shape, e.g. with an exponential function edge (i.e. curved legs) or rounded corners. The area enclosed by the signal profile of the electrical mixed voltage can be maximized.

In accordance with various embodiments, the electrical DC voltage source may include a first charge pump, which is configured to provide a first electrical potential of the electrical DC voltage.

In accordance with various embodiments, the electrical DC voltage source may include at least one second charge pump, which is configured to provide a second electrical potential of the electrical DC voltage. Alternatively, the second electrical potential of the electrical mixed voltage can be an electrical reference potential, e.g. electrical ground. The electrical DC voltage can correspond to the difference between the first electrical potential and the second electrical potential.

In accordance with various embodiments, a peak-to-valley value of the electrical mixed voltage can be less than the electrical DC voltage.

In accordance with various embodiments, the switch structure can be configured to discharge the plurality of capacitances, e.g. a plurality of capacitors, (e.g. relative to one another or relative to electrical ground) if the first charge storage is decoupled from the bridge circuit. Discharge relative to one another can be understood such that the charges storaged therein mutually cancel one another out at least in part (by means of an exchange of charge along one another). In other words, the plurality of capacitances (e.g. capacitors) can be coupled to one another in such a way that the energy stored therein is released.

In accordance with various embodiments, the switch structure can be configured to drive the first charge storage in accordance with a charge transfer cycle of the chopper, wherein the charge transfer cycle includes: a first phase (also referred to as first chopper phase), in which the first charge storage is coupled to the electrical DC voltage and decoupled from the bridge circuit; a second phase (also referred to as second chopper phase), in which the first charge storage is decoupled from the electrical DC voltage and coupled to the bridge circuit.

In accordance with various embodiments, the chopper may include a second charge storage, wherein the switch structure is configured to drive the second charge storage in accordance with the charge transfer cycle of the chopper; wherein in the first phase the second charge storage is decoupled from the electrical DC voltage and coupled to the bridge circuit; wherein in the second phase the second charge storage is coupled to the electrical DC voltage and decoupled from the bridge circuit.

In accordance with various embodiments, the chopper can be configured to provide by means of the first charge storage a first clock signal of the electrical mixed voltage and by means of the second charge storage a second clock signal of the electrical mixed voltage, which oscillate in push-pull fashion.

In accordance with various embodiments, the at least two (complementary) clock signals can be temporarily coordinated with one another in such a way that an electrical voltage fluctuation at the output of the bridge circuit, said voltage fluctuation being brought about solely by the electrical mixed voltage, is less than 200 mV and/or less than $10^{-2}$ of the peak-to-valley value of the electrical mixed voltage. Illustratively, this can be provided by means of a level shifter or a plurality of level shifters which provide the at least two clock signals (as two complementary level shifter signals).

In accordance with various embodiments, the at least two clock signals can be temporarily coordinated with one another in such a way that a superposition of the two signals has an electrical voltage fluctuation of less than 200 mV and/or less than $10^{-2}$ of the peak-to-valley value of the electrical mixed voltage. Illustratively, the noise can decrease with the electrical voltage fluctuation.

In accordance with various embodiments, the switch structure can furthermore be configured to drive the bridge circuit in accordance with the charge transfer cycle; wherein the charge transfer cycle includes a third phase (also referred to as third chopper phase), in which the plurality of capacitances (e.g. a plurality of capacitors) are coupled to one another for the purpose of discharge and the first charge storage and/or the second charge storage are/is decoupled from the bridge circuit.

In accordance with various embodiments, the chopper may include an additional first charge storage, which is switched (i.e. driven) synchronously with the first charge storage by the switch structure, wherein the first charge storage is coupled to the first electrical potential of the electrical DC voltage in the first phase and to a first capacitance of the plurality of capacitances (e.g. a first capacitor of the plurality of capacitors) in the second phase; and wherein the additional first charge storage is coupled to a second electrical potential of the electrical DC voltage in the first phase and to a second capacitance of the plurality of capacitances (e.g. a second capacitor of the plurality of capacitors) in the second phase.

In accordance with various embodiments, the chopper can be configured to provide the first clock signal of the electrical mixed voltage by means of the additional first charge storage.

In accordance with various embodiments, the chopper may include an additional second charge storage, which is switched (i.e. driven) synchronously with the second charge storage by the switch structure, wherein the second charge storage is coupled to the second capacitance of the plurality of capacitances (e.g. to the second capacitor of the plurality of capacitors) in the first phase and to the second electrical potential of the electrical DC voltage in the second phase; and wherein the additional second charge storage is coupled to the first capacitance of the plurality of capacitances (e.g. to the first capacitor of the plurality of capacitors) in the first phase and to the second electrical potential of the electrical DC voltage in the second phase.

In accordance with various embodiments, the chopper can be configured to provide the second clock signal of the electrical mixed voltage by means of the additional second charge storage.

In accordance with various embodiments, the charge storages of the chopper can be identical in terms of their capacitance; and/or the charge storages of the chopper can have a greater capacitance than the bridge circuit (i.e. the sum of the capacitive electrical voltage dividers of the bridge circuit).

In accordance with various embodiments, the micromechanical sensor may include an electrical working voltage; wherein each charge storage of the chopper includes a first capacitance; wherein the bridge circuit includes a second capacitance, which represents the capacitive sum (i.e. in accordance with the interconnection) of the plurality of capacitances (e.g. of the plurality of capacitors); and wherein the chopper and the bridge circuit are configured with respect to one another in such a way that a ratio of the electrical DC voltage to the electrical working voltage is greater than 2 by at least a ratio of the second capacitance to the first capacitance.

In accordance with various embodiments, the micromechanical sensor may include a working voltage; wherein the DC voltage source is configured to generate the electrical DC voltage greater than double the working voltage.

In accordance with various embodiments, the measuring arrangement may furthermore include a voltage regulator configured to compare the electrical mixed voltage with an electrical reference potential and to regulate the electrical mixed voltage on the basis of the comparison.

In accordance with various embodiments, the voltage regulator can be configured to control and/or to regulate at least one charge pump of the electrical DC voltage source on the basis of the comparison.

In accordance with various embodiments, the voltage regulator can be configured to start and/or to stop at least one charge pump of the electrical DC voltage source on the basis of the comparison.

In accordance with various embodiments, the voltage regulator can be configured to regulate at least one of the following variables of the electrical mixed voltage: a peak-to-valley value; a peak value; and/or a DC value (corresponds to the mean value over time).

In accordance with various embodiments, a chip may include the measuring arrangement as described herein, e.g. implemented in a substrate of the chip.

In accordance with various embodiments, the measuring arrangement may furthermore include an electrical supply voltage source (which provides the electrical supply voltage). By way of example, the electrical supply voltage source can be configured for contactlessly transmitting electrical energy (e.g. by means of magnetic induction). Alternatively, the electrical DC voltage source and/or the electrical supply voltage source can be provided by means of a separate chip (illustratively an external electrical voltage source).

In accordance with various embodiments, a level shifter circuit may include the following: a signal source; a level shifter (also referred to as second level shifter); wherein the signal source, on the output side, is capacitively coupled to an input of the level shifter; and wherein the signal source and the level shifter are galvanically isolated from one another.

In accordance with various embodiments, the signal source may include an additional level shifter (also referred to as first level shifter), which is configured for providing a first level shifter signal, which is capacitively coupled into the level shifter.

In accordance with various embodiments, the signal source may include a push-pull generator configured for providing two push-pull signals, which are capacitively coupled into the level shifter.

In accordance with various embodiments, the level shifter can be configured for providing the second level shifter signal; wherein the first level shifter signal or the two push-pull signals and the second level shifter signal correspond in a frequency.

In accordance with various embodiments, a level shifter circuit may include the following: a push-pull generator; a level shifter (also referred to as second level shifter); wherein the push-pull generator, on the output side, is capacitively coupled to an input of the level shifter; and wherein the push-pull generator and the level shifter are galvanically isolated from one another.

In accordance with various embodiments, the push-pull generator may include or be formed from a level shifter (also referred to as first level shifter). By way of example, the first level shifter can be configured for generating two level-shifted push-pull signals, i.e. two signals which are in push-pull configuration with respect to one another (that is to say that said signals are complementary).

In accordance with various embodiments, a level shifter circuit may include the following: a push-pull generator for providing two complementary signals (also referred to as two push-pull signals); a level shifter; wherein the push-pull generator is coupled to the level shifter in such a way that the two complementary signals are capacitively coupled into the level shifter; and wherein the push-pull generator and the level shifter are galvanically isolated from one another.

In accordance with various embodiments, a level shifter circuit may include the following: a first level shifter; a second level shifter; wherein the first level shifter, on the output side, is capacitively coupled to an input of the second level shifter; and wherein the first level shifter and the second level shifter are galvanically isolated from one another.

In accordance with various embodiments, a level shifter circuit may include the following: a first level shifter for providing a level shifter signal; a second level shifter; wherein the first level shifter is coupled to the second level shifter in such a way that the level shifter signal is capacitively coupled into the second level shifter; and wherein the first level shifter and the second level shifter are galvanically isolated from one another.

In accordance with various embodiments, the first level shifter can be configured for providing a first level shifter signal, which is capacitively coupled into the second level shifter.

In accordance with various embodiments, the push-pull generator can be configured for providing two push-pull signals, which are capacitively coupled into the second level shifter. Each push-pull signal of the two push-pull signals may optionally include or be formed from a level shifter signal.

In accordance with various embodiments, the second level shifter can be configured for providing a second level shifter signal, which includes at least one of the following: a greater amplitude than the first level shifter signal and/or than the two push-pull signals; a greater peak-to-valley value than the first level shifter signal and/or than the two push-pull signals; a greater peak value than the first level shifter signal; and/or a greater mean value than the first level shifter signal and/or than the two push-pull signals.

In accordance with various embodiments, the second level shifter can be configured for providing the second level shifter signal; wherein the first level shifter signal or the two push-pull signals and the second level shifter signal correspond in a frequency.

In accordance with various embodiments, the level shifter circuit may furthermore include a charge storage, which capacitively couples the signal source (e.g. the first level shifter thereof and/or the push-pull generator thereof) on the output side to an input of the (second) level shifter.

In accordance with various embodiments, the second level shifter may include an inverter structure, which on the input side is coupled to the input of the second level shifter and/or on the output side provides an output of the second level shifter.

In accordance with various embodiments, the second level shifter may include a first charge pump configured to provide an electrical voltage difference for switching the inverter structure, e.g. an electrical voltage difference of more than the electrical supply voltage.

In accordance with various embodiments, the signal source (e.g. the first level shifter thereof and/or the push-pull generator thereof), on the output side, can be capacitively coupled to a clock input of the first charge pump.

In accordance with various embodiments, the inverter structure, on the input side, can furthermore be connected to the clock input of the first charge pump for the purpose of switching the inverter structure in accordance with a clock (in other words in accordance with a charge transfer cycle) of the first charge pump.

In accordance with various embodiments, the second level shifter may include a second charge pump, which is connected between the inverter structure and the signal source (e.g. the first charge pump thereof and/or the push-pull generator thereof), wherein the inverter structure, on the input side, is furthermore connected to a clock input of the second charge pump stage (e.g. including cross-coupled inverters or formed therefrom) for the purpose of switching the inverter structure in accordance with a clock of the second charge pump (i.e. in accordance with a charge transfer cycle of the second charge pump).

In accordance with various embodiments, the level shifter circuit may furthermore include an additional signal source, which, on the output side, is capacitively coupled to the clock input of the second charge pump.

In accordance with various embodiments, the additional signal source may include a further additional level shifter (also referred to as third level shifter), which is configured for providing a third level shifter signal, which is capacitively coupled into the level shifter.

In accordance with various embodiments, the additional signal source may include an additional push-pull generator configured for providing two additional push-pull signals, which are capacitively coupled into the level shifter.

In accordance with various embodiments, the level shifter circuit may furthermore include an additional push-pull generator, which, on the output side, is capacitively coupled to the clock input of the second charge pump.

In accordance with various embodiments, the additional push-pull generator may include or be formed from a third level shifter.

In accordance with various embodiments, the additional push-pull generator can be configured for providing two additional push-pull signals, which are capacitively coupled into the second level shifter.

In accordance with various embodiments, the level shifter circuit may furthermore include a third level shifter, which, on the output side, is capacitively coupled to the clock input of the second charge pump.

In accordance with various embodiments, the third level shifter can be configured for providing a third level shifter signal, which is capacitively coupled into the second level shifter.

In accordance with various embodiments, the third level shifter can be configured for providing a second level shifter signal including at least one of the following: a greater amplitude than the third level shifter signal and/or than the two additional push-pull signals; a greater peak-to-valley value than the third level shifter signal and/or than the two additional push-pull signals; a greater peak value than the third level shifter signal; and/or a greater mean value than the third level shifter signal and/or than the two additional push-pull signals.

In accordance with various embodiments, the second level shifter can be configured for providing a second level shifter signal; wherein the third level shifter signal and/or the two additional push-pull signals and the second level shifter signal correspond in a frequency.

In accordance with various embodiments, a level shifter circuit may include the following: a signal source; an inverter structure; a charge pump including a charge storage; wherein the signal source, on the output side, is capacitively coupled to an input of the inverter structure by means of the charge storage; and wherein the inverter structure and the signal source are galvanically isolated from one another.

In accordance with various embodiments, the signal source may include a level shifter configured for providing a first level shifter signal, which is capacitively coupled into the inverter structure.

In accordance with various embodiments, the signal source may include a push-pull generator configured for providing two push-pull signals, which are capacitively coupled into the inverter structure.

In accordance with various embodiments, the level shifter circuit may furthermore include: an additional signal source, which, on the output side, is coupled to a charge storage of the additional charge pump.

In accordance with various embodiments, the additional signal source may include an additional level shifter, which is configured for providing a third level shifter signal, which is coupled into the additional charge pump.

In accordance with various embodiments, the additional signal source may include an additional push-pull generator configured for providing two additional push-pull signals, which are coupled into the additional charge pump.

In accordance with various embodiments, a level shifter circuit may include the following: a level shifter and/or a push-pull generator; an inverter structure; a charge pump including a charge storage; wherein the level shifter and/or the push-pull generator, on the output side, are/is capacitively coupled to an input of the inverter structure by means of the charge storage; and wherein the inverter structure and the level shifter and/or the push-pull generator are galvanically isolated from one another.

In accordance with various embodiments, the level shifter can be configured for providing a first level shifter signal, which is capacitively coupled into the inverter structure.

In accordance with various embodiments, the push-pull generator can be configured for providing two push-pull signals, which are capacitively coupled into the inverter structure.

In accordance with various embodiments, the inverter structure can be configured for providing a second level shifter signal including at least one of the following: a greater amplitude than the first level shifter signal and/or than the two push-pull signals; a greater peak-to-valley value than the first level shifter signal; a greater peak value than the first level shifter signal and/or than the two push-pull signals; and/or a greater mean value than the first level shifter signal and/or than the two push-pull signals.

In accordance with various embodiments, the inverter structure can be configured for providing a second level shifter signal; wherein the first level shifter signal and/or the two push-pull signals and the second level shifter signal correspond in a frequency.

In accordance with various embodiments, the charge pump can be configured for switching the inverter structure in accordance with a charge transfer cycle of the charge storage.

In accordance with various embodiments, the charge pump can be configured to provide an electrical voltage difference for switching the inverter structure.

In accordance with various embodiments, the level shifter circuit may furthermore include an additional charge pump configured to provide an electrical voltage difference for switching the inverter structure; wherein the charge pump is connected between the inverter structure and the additional charge pump.

In accordance with various embodiments, the level shifter circuit may furthermore include an additional signal source, which, on the output side, is coupled to a charge storage of the additional charge pump.

In accordance with various embodiments, the additional signal source may include an additional level shifter, which is configured for providing a third level shifter signal, which is coupled into the additional charge pump.

In accordance with various embodiments, the additional signal source may include an additional push-pull generator configured for providing two additional push-pull signals, which are coupled into the additional charge pump.

In accordance with various embodiments, the level shifter circuit may furthermore include an additional level shifter and/or an additional push-pull generator, which, on the output side, is coupled to a charge storage of the additional charge pump.

In accordance with various embodiments, the additional level shifter can be configured for providing a third level shifter signal, which is coupled into the additional charge pump.

In accordance with various embodiments, the additional push-pull generator can be configured for providing two additional push-pull signals, which are coupled into the additional charge pump.

In accordance with various embodiments, the inverter structure can be configured for providing a second level shifter signal including at least one of the following: a greater amplitude than the third level shifter signal and/or the two additional push-pull signals; a greater peak-to-valley value than the third level shifter signal and/or the two additional push-pull signals; a greater peak value than the third level shifter signal; and/or a greater mean value than the third level shifter signal and/or the two additional push-pull signals.

In accordance with various embodiments, the inverter structure can be configured for providing a second level shifter signal; wherein the third level shifter signal and/or the two additional push-pull signals and the second level shifter signal correspond in a frequency.

In accordance with various embodiments, a measuring arrangement may include a level shifter circuit in accordance with various embodiments, e.g. implemented in a substrate of the measuring arrangement.

In accordance with various embodiments, a chip may include a level shifter circuit in accordance with various embodiments, e.g. implemented in a substrate of the chip.

In accordance with various embodiments, a charge pump stage may include the following: a charge storage; and a switch structure configured to drive the charge storage in accordance with a charge transfer cycle of the charge storage, wherein the charge transfer cycle includes: a first phase (also referred to as first partial stage phase), in which the charge storage is coupled to an input of the charge pump stage, a second phase (also referred to as second partial stage phase), in which the charge storage is decoupled from the input and from an output of the charge pump stage; and a third phase (also referred to as third partial stage phase), in which the charge storage is coupled to the output of the charge pump stage.

In accordance with various embodiments, a charge pump stage may include the following: a charge storage; and a switch structure including a first switch (including or formed from a first transistor) and a second switch (including or formed from a second transistor); a first control circuit configured to drive the charge storage in accordance with a charge transfer cycle of the charge storage, wherein the charge transfer cycle includes: a first phase, in which the charge storage is coupled to an input of the charge pump stage by means of the first switch, a second phase, in which the first switch and the second switch are simultaneously in a switching process; and a third phase, in which the charge storage is coupled to an output of the charge pump stage by means of the second switch; wherein the first switch and the second switch (e.g. the transistors thereof) include the same channel conduction type (e.g. PMOS or NMOS).

In accordance with various embodiments, the switch structure may include the following: a first switch, which is connected between the charge storage and the input; a second switch, which is connected between the charge storage and the output of the charge pump stage; and a first control circuit, which is configured to close the first switch in the first phase and to open it in the second and third phases, and to open the second switch in the first and second phases and to close it in the third phase.

In accordance with various embodiments, the control circuit can be capacitively coupled to the first switch and/or to the second switch (i.e. by means of a capacitive coupling). In other words, the control circuit can provide at least one control signal which is capacitively coupled into the first switch and/or the second switch.

In accordance with various embodiments, the control circuit can be connected to the first switch by means of a first capacitive coupling and/or to the second switch by means of a second capacitive coupling.

In accordance with various embodiments, the switch structure may furthermore include: a leveling circuit configured to couple the first capacitive coupling to the charge storage in the second phase and/or in the third phase; and/or to couple the second capacitive coupling to the output of the charge pump stage in the second phase and/or in the first phase.

In accordance with various embodiments, the leveling circuit may include: a third switch, which is connected between the first control circuit and the charge storage, a second control circuit, which is configured to open the third switch at least in the first phase and/or the second phase and to close it at least once in the third phase.

In accordance with various embodiments, the leveling circuit may include: a fourth switch, which is connected between the second control circuit and the charge storage, wherein the first control circuit is configured to switch the fourth switch synchronously with the first switch.

In accordance with various embodiments, the leveling circuit may include: a fifth switch, which is configured to electrically connect the first control circuit to the charge storage in the second phase and/or third phase, e.g. as long as a voltage at the input of the charge pump stage satisfies a predefined criterion.

In accordance with various embodiments, the leveling circuit may include: a sixth switch, which is configured to electrically connect the first control circuit to the output of the charge pump stage in the second phase and/or first phase, e.g. as long as an electrical voltage provided by the charge storage satisfies a predefined criterion.

In accordance with various embodiments, a charge pump stage may furthermore include: an additional charge storage; an additional switch structure, which is configured to couple the additional charge storage to an output of the charge pump stage in the first phase, to decouple it from the input of the charge pump stage and the output of the charge pump stage in the second phase, and to couple it to the input of the charge pump stage in the third phase. In other words, the additional charge storage and the charge storage can be driven complementarily to one another and/or be interconnected in parallel with one another.

In accordance with various embodiments, the switch structure and the additional switch structure may include a common control circuit.

In accordance with various embodiments, a charge pump stage may furthermore include: an additional charge storage; and an additional switch structure, which is configured to drive the additional charge storage in a push-pull fashion with respect to the charge storage (such that the input of the charge pump stage is coupled either to the charge storage or to the additional charge storage and/or is decoupled therefrom in the second phase).

In accordance with various embodiments, a charge pump stage may furthermore include: an additional charge storage; and an additional switch structure; wherein the switch structure and the additional switch structure are configured in push-pull fashion with respect to one another in such a way that the input of the charge pump stage is coupled either to the charge storage or to the additional charge storage and/or is decoupled therefrom in the second phase.

In accordance with various embodiments, the switches of the switch structure and/or of the additional switch structure can be formed using low-voltage technology.

In accordance with various embodiments, the switches of the switch structure and/or of the additional switch structure can be formed in the same well and/or include the same channel conduction type.

In accordance with various embodiments, the charge pump stage may furthermore include a clock controller configured for providing a clock signal in accordance with the charge transfer cycle and for coupling the clock signal into the charge storage and/or the switch structure.

In accordance with various embodiments, the charge pump stage may furthermore include a substrate, wherein the switch structure and the charge storage are formed in the substrate.

In accordance with various embodiments, the substrate can be doped with a dopant of a first type (e.g. p-doped) and include a well doped with a dopant of a second type (e.g. n-doped), wherein each switch of the switch structure includes a channel provided by means of the well. The channel can then be doped with the dopant of the second type (i.e. include a conduction type of the second type). The dopant of the first type can be p-type, for example, and the dopant of the second type can be n-type, for example, or vice versa. By way of example, an n-doped substrate may include a p-type well. Each switch of the switch structure (e.g. PMOS switch) can be arranged in the p-type well. By way of example, a positive charge pump can be provided by means of PMOS switches.

In accordance with various embodiments, the substrate can be doped with a dopant of a first type (e.g. n-doped) and include a first well, which is doped with a dopant of a second type (e.g. p-doped) and includes a second well, which is doped with a dopant of a first type (e.g. n-doped) (also referred to as triple well), wherein each switch of the switch structure includes a channel provided by means of the second well. The channel can then be doped with an or the dopant of the first type (i.e. include a conduction type of the first type). The dopant of the first type can be p-type, for example, and the dopant of the second type can be n-type, for example, or vice versa. By way of example, the second well can be arranged in the first well. By way of example, a p-doped substrate may include an n-type well in which a p-type well is arranged. Each switch of the switch structure (e.g. NMOS switch) can be arranged in the p-type well. By way of example, a negative charge pump can be provided by means of NMOS switches. Optionally, the second well and the substrate may include different dopants of the first type.

A negative charge pump or negative charge pump stage can be understood to mean that this provides a smaller electrical potential than is coupled into it (e.g. less than the electrical reference potential and/or less than the electrical supply voltage), e.g. a negative voltage. A positive charge pump or positive charge pump stage can be understood to mean that this provides a greater electrical potential than is coupled into it (e.g. greater than the electrical reference potential and/or greater than the electrical supply voltage), e.g. a positive voltage.

In accordance with various embodiments, a charge pump may include a plurality of charge pump stages which are interconnected in series with one another and each charge pump stage of which is configured in accordance with one or more embodiments.

In accordance with various embodiments, a charge pump stage may include: two partial stages, which are interconnected in parallel with one another between the input and the output of the charge pump stage and each partial stage of which includes the following: a charge storage; a switch structure configured to drive the charge storage in accordance with a charge transfer cycle of the charge storage, wherein the charge transfer cycle includes: a first phase, in which the charge storage is coupled to an input of the charge pump stage, a second phase, in which the charge storage is decoupled from the input of the charge pump stage and an output of the charge pump stage; and a third phase, in which the charge storage is coupled to the output of the charge pump stage; wherein the charge transfer cycles of the two partial stages are configured in push-pull fashion with respect to one another, such that the input of the charge pump stage is alternately coupled to the charge storages of the two partial stages and/or decoupled therefrom in the second phase.

In accordance with various embodiments, a charge pump stage may include the following: two partial stages, which are interconnected in parallel with one another between the input and the output of the charge pump stage and each partial stage of which includes the following: a charge storage; a switch structure including a first switch (e.g. including a first transistor or formed therefrom) and a second switch (e.g. including a second transistor or formed therefrom) and configured to drive the charge storage in accordance with a charge transfer cycle of the charge storage, wherein the charge transfer cycle includes: a first phase, in which the charge storage is coupled to an input of the charge pump stage by means of the first switch, a second phase, in which the first switch and the second switch are simultaneously in a switching process; and a third phase, in which the charge storage is coupled to an output of the charge pump stage by means of the second switch; wherein the first switch and the second switch include the same channel conduction type; wherein the charge transfer cycles of the two partial stages are configured in push-pull fashion with respect to one another, such that the input of the charge pump stage is alternately coupled to the charge storages of the two partial stages and/or decoupled therefrom in the second phase.

In accordance with various embodiments, the switch structures of the two partial stages can each include: a first switch, which is connected between the charge storage and the input of the charge pump stage; a second switch, which is connected between the charge storage and the output of the charge pump stage; a first control circuit, which is configured to close the first switch in the first phase and to open it in the second and third phases; and to open the second switch in the first and second phases and to close it in the third phase.

In accordance with various embodiments, the control circuit of each partial stage can be capacitively coupled to the first switch and/or to the second switch of the respective partial stage.

In accordance with various embodiments, the control circuit of each partial stage can be connected to the first switch by means of a first capacitive coupling and/or to the second switch of the respective partial stage by means of a second capacitive coupling.

In accordance with various embodiments, the switch structures of the two partial stages can each furthermore include: a leveling circuit configured to couple the first capacitive coupling to the charge storage in the second phase and/or in the third phase; and/or to couple the second capacitive coupling to the output of the charge pump stage in the second phase and/or in the first phase.

In accordance with various embodiments, the leveling circuits of the two partial stages can each furthermore include: a third switch, which is connected between the first control circuit and the charge storage, a second control circuit, which is configured to open the third switch at least in the first phase and/or the second phase, and to close it at least once in the third phase.

In accordance with various embodiments, the leveling circuits of the two partial stages can each furthermore include: a fourth switch, which is connected between the second control circuit and the charge storage, wherein the first control circuit is configured to switch the fourth switch synchronously with the first switch.

In accordance with various embodiments, the leveling circuits of the two partial stages can each furthermore include: a fifth switch, which is configured to electrically connect the first control circuit to the charge storage in the second phase and/or third phase, e.g. as long as an electrical voltage at the input of the charge pump stage satisfies a predefined criterion.

In accordance with various embodiments, the leveling circuits of the two partial stages can each furthermore include: a sixth switch, which is configured to electrically connect the first control circuit to the output of the charge pump stage in the second phase and/or first phase, e.g. as long as an electrical voltage provided by the charge storage satisfies a predefined criterion.

In accordance with various embodiments, the two partial stages may include a first partial stage and a second partial stage; wherein the first control circuit of the first partial stage is configured to synchronously switch the first switch of the first partial stage and the second switch of the second partial stage; and wherein the first control circuit of the second partial stage is configured to synchronously switch the second switch of the first partial stage and the first switch of the second partial stage.

In accordance with various embodiments, the switches of the switch structure and/or of the additional switch structure can be formed using low-voltage technology.

In accordance with various embodiments, the switches of the switch structure can be formed in the same well and/or include the same channel conduction type.

In accordance with various embodiments, the charge pump stage may furthermore include a clock controller configured for providing a clock signal in each case for each of the two partial stages in accordance with the charge transfer cycle of the respective partial stage and for coupling the clock signal into the respective charge storage and/or the respective switch structure.

In accordance with various embodiments, the charge pump stage may furthermore include a substrate, wherein the two partial stages (or at least the switch structure thereof and/or at least the charge storage thereof) are formed in the substrate.

In accordance with various embodiments, the substrate can be doped with a dopant of a first type and include a well doped with a dopant of a second type, wherein each switch of the switch structure of each of the two partial stages includes a channel provided by means of the well.

In accordance with various embodiments, a charge pump may include a plurality of charge pump stages which are interconnected in series with one another and each charge pump stage of which is configured in accordance with various embodiments.

In accordance with various embodiments, a charge pump may include the following: a plurality of charge pump stages which are interconnected in series with one another and of which a first charge pump stage includes a first charge storage and a second charge pump stage includes a second charge storage; a switch structure configured to drive the first charge storage and the second charge storage in accordance with a charge transfer cycle of the plurality of charge pump stages, wherein the charge transfer cycle includes: a first phase, in which the first charge storage is coupled to the second charge pump stage, a second phase, in which the first charge storage is decoupled from the second charge pump stage and the second charge storage is decoupled from the first charge pump stage; and a third phase, in which the second charge storage is coupled to the first charge pump stage.

In accordance with various embodiments, a charge pump may include: a plurality of charge pump stages which are interconnected in series with one another and of which a first charge pump stage includes a first charge storage and a second charge pump stage includes a second charge storage; a switch structure including a first transistor and a second transistor; a first control circuit configured to drive the first charge storage and the second charge storage in accordance with a charge transfer cycle of the plurality of charge pump stages, wherein the charge transfer cycle includes: a first phase, in which the first charge storage is coupled to the second charge pump stage by means of the second transistor, a second phase, in which the first transistor and the second transistor are simultaneously in a switching process; and a third phase, in which the second charge storage is coupled to the first charge pump stage by means of the first transistor.

In accordance with various embodiments, the switch structure may include: a first switch, which is connected between the first charge storage and the second charge pump stage; a second switch, which is connected between the second charge storage and the first charge pump stage; a first control circuit configured to close the first switch in the first phase and to open it in the second and third phases; and to open the second switch in the first and second phases and to close it in the third phase.

In accordance with various embodiments, the control circuit can be connected to the first switch by means of a first capacitive coupling and/or to the second switch by means of a second capacitive coupling.

In accordance with various embodiments, the switch structure may furthermore include: a leveling circuit configured to couple the first capacitive coupling to the second charge storage in the second phase and/or in the third phase; and/or to couple the second capacitive coupling to the second charge pump stage in the second phase and/or in the first phase.

In accordance with various embodiments, the leveling circuit may include: a third switch, which is connected between the first control circuit and the second charge storage, and a second control circuit configured to open the third switch at least in the first phase and/or the second phase, and to close it at least once in the third phase.

In accordance with various embodiments, the leveling circuit may include: a fourth switch, which is connected between the second control circuit and the second charge storage, wherein the first control circuit is configured to switch the fourth switch synchronously with the first switch.

In accordance with various embodiments, the leveling circuit may include: a fifth switch, which is configured to electrically connect the first control circuit to the second charge storage in the second phase and/or third phase, e.g. as long as an electrical voltage at the input of the second charge pump stage satisfies a predefined criterion.

In accordance with various embodiments, the leveling circuit may include: a sixth switch, which is configured to electrically connect the first control circuit to the output of the first charge pump stage in the second phase and/or first phase, e.g. as long as an electrical voltage provided by the first charge storage satisfies a predefined criterion.

In accordance with various embodiments, the switches of the switch structure can be formed using low-voltage technology.

In accordance with various embodiments, the switches of the switch structure can be formed in the same well and/or include the same channel conduction type.

In accordance with various embodiments, the first control circuit can drive the first charge storage and the second charge storage in push-pull fashion.

In accordance with various embodiments, the charge pump stage may furthermore include: a clock controller configured for providing a first clock signal and a second clock signal in accordance with the charge transfer cycle; wherein the clock controller is configured for coupling the first clock signal into the first charge storage and/or the switch structure; and/or wherein the clock controller is configured for coupling the second clock signal into the second charge storage and/or the switch structure.

The first clock signal and the second clock signal can be complementary to one another.

In accordance with various embodiments, the charge pump may furthermore include: a substrate, wherein the switch structure, the first charge storage and/or the second charge storage are formed in the substrate.

In accordance with various embodiments, the substrate can be doped with a dopant of a first type and include a well doped with a dopant of a second type, wherein each switch of the switch structure includes a channel provided by means of the well.

In accordance with various embodiments, a measuring arrangement may include a charge pump stage and/or charge pump of one or more embodiments.

In accordance with various embodiments, each switch of the switch structure may include or be formed from a field effect transistor.

In accordance with various embodiments, a chip may include a charge pump stage and/or charge pump in accordance with one or more embodiments, e.g. implemented in a substrate of the chip.

In accordance with various embodiments, a charge pump stage may include the following: a charge storage; a first transistor, which is connected between the charge storage and the input; and a second transistor, which is connected between the charge storage and the output of the charge pump stage; wherein the first transistor and the second transistor include the same channel conduction type; a control circuit configured to provide a first control signal for controlling the first transistor and a second control signal for controlling the second switch in push-pull fashion with respect to one another.

In accordance with various embodiments, a plurality of control circuits can be implemented by means of a common control circuit. By way of example, for providing two control signals, for each a separate control circuit can be used. Alternatively or additionally, at least two (e.g. complementary) control signals can be provided by means of a common control circuit.

In accordance with various embodiments, the second control signal can be delayed and/or inverted with respect to the first control signal, e.g. by means of a delay circuit and/or an inverting circuit.

In accordance with various embodiments, a read-out circuit may include the following: a capacitive bridge circuit including at least one terminal for coupling in a capacitance of a sensor; an amplifier coupled, on the input side, to an output of the bridge circuit; an electrical DC voltage source configured to provide an electrical DC voltage; a chopper including at least one charge storage and a switch structure; wherein the switch structure is configured to couple the charge storage alternately to the electrical DC voltage and the bridge circuit for the purpose of coupling an electrical mixed voltage into the bridge circuit. Illustratively, the measuring arrangement may include the read-out circuit and the sensor coupled therein.

In accordance with various embodiments, two circuit modules interconnected in series, e.g. two level shifters (e.g. the first level shifter and the second level shifter) and/or the measuring bridge and the amplifier, can form two members of a signal chain. Two circuit modules interconnected in parallel with one another can form two branches of a signal chain.

In accordance with various embodiments, an element connected between two elements can be understood such that the three elements are interconnected in series, i.e. along a series connection. The switching of a switch can be understood such that the latter is brought from an open state to a closed state, or vice versa.

In accordance with various embodiments, a method may include: providing at least one signal (e.g. a first level shifter signal and/or two push-pull signals) by means of a signal source (e.g. by means of a first level shifter and/or by means of a push-pull generator); capacitively coupling the signal into a level shifter (also referred to as second level shifter).

In accordance with various embodiments, a method for operating a micromechanical sensor may include: providing a DC voltage; charging a charge storage by means of an electrical DC voltage; and discharging the charge storage by means of a bridge circuit, wherein the bridge circuit includes a plurality of capacitors, at least one capacitor of which represents the micromechanical sensor.

In accordance with various embodiments, a method for operating a micromechanical sensor may include: coupling an electrical mixed voltage into a bridge circuit including a plurality of capacitors, at least one capacitor of which represents the micromechanical sensor; detecting a signal of the micromechanical sensor by means of an amplifier, wherein the amplifier is operated by means of an electrical voltage which is less than a peak-to-valley value of the electrical mixed voltage.

In accordance with various embodiments, a method for transferring charge may include the following: first transferring of charge from a first electrical potential to the charge storage; second transferring of charge from the charge storage to a second electrical potential having an absolute value greater than that of the first electrical potential; and decoupling the charge storage from the first electrical potential and from the second electrical potential between the first transferring and the second transferring.

The decoupling of the charge storage from the first electrical potential and from the second electrical potential can be simultaneous.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A level shifter circuit, comprising:
a signal source;
a level shifter;
wherein the signal source, on an output side, is capacitively coupled to an input of the level shifter; and
wherein the signal source and the level shifter are galvanically isolated from one another;
wherein the signal source comprises an additional level shifter, which is configured for providing a first level shifter signal, which is capacitively coupled into the level shifter.

2. The level shifter circuit of claim 1,
wherein the signal source comprises a push-pull generator configured to provide two push-pull signals, which are capacitively coupled into the level shifter.

3. The level shifter circuit of claim 2,
wherein the level shifter is configured to provide a second level shifter signal; and
wherein the first level shifter signal or the two push-pull signals and the second level shifter signal correspond in a frequency.

4. The level shifter circuit of claim 3,
wherein the level shifter comprises an inverter structure, which at least one of on an input side is connected to the input of a second level shifter or on the output side provides an output of the level shifter.

5. The level shifter circuit of claim 4,
wherein the level shifter comprises a first charge pump, which is configured to provide a voltage difference for switching the inverter structure.

6. The level shifter circuit of claim 5,
wherein the signal source, on the output side, is capacitively coupled to a clock input of the first charge pump.

7. The level shifter circuit of claim 6,
wherein the inverter structure, on the input side, is furthermore connected to the clock input of the first charge pump for switching the inverter structure in accordance with a clock of the first charge pump.

8. The level shifter circuit of claim 6,
wherein the level shifter comprises a second charge pump, which is connected between the inverter structure and the first charge pump, wherein the inverter structure, on the input side, is furthermore connected to a clock input of a second charge pump stage for switching the inverter structure in accordance with a clock of the second charge pump.

9. The level shifter circuit of claim 8, further comprising:
an additional signal source, which, on the output side, is capacitively coupled to the clock input of the second charge pump.

10. The level shifter circuit of claim 9,
wherein the additional signal source comprises another additional level shifter, which is configured for providing a third level shifter signal, which is capacitively coupled into the level shifter.

11. The level shifter circuit of claim 10,
wherein the additional signal source comprises an additional push-pull generator, which is configured to provide two additional push-pull signals, which are capacitively coupled into the level shifter.

12. The level shifter circuit of claim 11,
wherein the level shifter is configured for providing a second level shifter signal; and
wherein the third level shifter signal or the two additional push-pull signals and the second level shifter signal correspond in a frequency.

13. The level shifter circuit of claim 1, further comprising:
a charge storage, which capacitively couples the signal source on the output side to an input of the level shifter.

14. A measuring arrangement, comprising:
a level shifter circuit, comprising:
  a signal source;
  a level shifter;
  wherein the signal source, on an output side, is capacitively coupled to an input of the level shifter; and
  wherein the signal source and the level shifter are galvanically isolated from one another;
wherein the signal source comprises an additional level shifter, which is configured for providing a first level shifter signal, which is capacitively coupled into the level shifter.

15. A chip, comprising:
a level shifter circuit, comprising:
  a signal source;
  a level shifter;
  wherein the signal source, on an output side, is capacitively coupled to an input of the level shifter; and
  wherein the signal source and the level shifter are galvanically isolated from one another;
wherein the signal source comprises an additional level shifter, which is configured for providing a first level shifter signal, which is capacitively coupled into the level shifter.

16. A level shifter circuit, comprising:
a signal source;
an inverter structure;
a charge pump comprising a charge storage;
wherein the signal source, on an output side, is capacitively coupled to an input of the inverter structure by the charge storage; and
wherein the inverter structure and the signal source are galvanically isolated from one another.

17. The level shifter circuit of claim 16,
wherein the signal source comprises a level shifter configured to provide a first level shifter signal, which is capacitively coupled into the inverter structure.

18. The level shifter circuit of claim 17,
wherein the signal source comprises a push-pull generator configured to provide two push-pull signals, which are capacitively coupled into the inverter structure.

19. The level shifter circuit of claim 18,
wherein the inverter structure is configured to provide a second level shifter signal; and
wherein the first level shifter signal or the two push-pull signals and the second level shifter signal correspond in a frequency.

20. The level shifter circuit of claim 16,
wherein the charge pump is configured to switch the inverter structure in accordance with a charge transfer cycle of the charge storage.

21. The level shifter circuit of claim 16,
wherein the charge pump is configured to provide a voltage difference for switching the inverter structure.

22. A measuring arrangement, comprising:
a level shifter circuit, comprising:
  a signal source;
  an inverter structure;
  a charge pump comprising a charge storage;
  wherein the signal source, on an output side, is capacitively coupled to an input of the inverter structure by the charge storage; and
  wherein the inverter structure and the signal source are galvanically isolated from one another.

23. A chip, comprising:
a level shifter circuit, comprising:
  a signal source;
  an inverter structure;
  a charge pump comprising a charge storage;
  wherein the signal source, on an output side, is capacitively coupled to an input of the inverter structure by the charge storage; and
  wherein the inverter structure and the signal source are galvanically isolated from one another.

24. A method, comprising:
providing at least one signal by a level shifter; and
capacitively coupling the signal into another level shifter, the another level shifter being galvanically isolated from the level shifter.

* * * * *